US007307692B2

(12) United States Patent
Korenaga et al.

(10) Patent No.: US 7,307,692 B2
(45) Date of Patent: Dec. 11, 2007

(54) EXPOSURE APPARATUS AND DEVICE MANUFACTURING METHOD

(75) Inventors: Nobushige Korenaga, Utsunomiya (JP); Naosuke Nishimura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 270 days.

(21) Appl. No.: 11/091,590

(22) Filed: Mar. 29, 2005

(65) Prior Publication Data

US 2005/0219486 A1    Oct. 6, 2005

(30) Foreign Application Priority Data

Mar. 30, 2004   (JP)   ............................. 2004-100397
Jan. 27, 2005   (JP)   ............................. 2005-019834

(51) Int. Cl.
G03B 27/52    (2006.01)
G03B 27/42    (2006.01)
G03B 27/58    (2006.01)

(52) U.S. Cl. .............................. 355/55; 355/53; 355/72
(58) Field of Classification Search ................. 355/53, 355/55, 72; 356/399, 400, 401
See application file for complete search history.

(56) References Cited

U.S. PATENT DOCUMENTS

| 5,281,996 | A | 1/1994 | Bruning et al. ............... 355/77 |
| 6,128,069 | A | 10/2000 | Korenaga ..................... 355/53 |
| 6,172,738 | B1 | 1/2001 | Korenaga et al. ............. 355/53 |
| 6,177,978 | B1 | 1/2001 | Korenaga ..................... 355/53 |
| 6,414,742 | B1 | 7/2002 | Korenaga et al. ............. 355/53 |
| 6,426,788 | B1 | 7/2002 | Korenaga ..................... 355/53 |
| 6,479,991 | B1 | 11/2002 | Korenaga .................... 324/226 |
| 6,819,433 | B2 | 11/2004 | Takai et al. .................. 356/500 |
| 6,873,404 | B2 | 3/2005 | Korenaga ..................... 355/72 |
| 6,903,468 | B2 | 6/2005 | Korenaga ..................... 310/12 |
| 7,030,964 | B2 | 4/2006 | Akutsu et al. ................ 355/53 |
| 2001/0001577 | A1 | 5/2001 | Ukaji ........................ 356/500 |
| 2002/0132409 | A1 | 9/2002 | Akutsu et al. .............. 438/200 |
| 2003/0063289 | A1 | 4/2003 | Inoue ........................ 356/500 |
| 2006/0082755 | A1 | 4/2006 | Akutsu et al. ................ 355/72 |

FOREIGN PATENT DOCUMENTS

| EP | 0 687 957 | 12/1995 |
| EP | 1 231 513 | 8/2002 |
| JP | 2002-280283 | 9/2002 |
| WO | WO 99/28790 | 6/1999 |

OTHER PUBLICATIONS

May 24, 2007 European Search Report in European Patent Application No. 05 25 1986.

*Primary Examiner*—Peter B. Kim
(74) *Attorney, Agent, or Firm*—Fitzpatrick, Cella, Harper & Scinto

(57) ABSTRACT

The start of exposure or a process delays because reference alignment such as abutment must be executed along the optical axis after a substrate stage is moved between the exposure position and the processing position. To solve this problem, an exposure apparatus according to this invention includes an exposure optical system which exposes a substrate to a pattern, a substrate processing system which performs a predetermined process for the substrate at a position apart from the exposure optical system, a substrate stage which moves along a plane perpendicular to the optical axis of the exposure optical system, and a measurement device which continuously measures the position of the substrate stage along the optical axis in the moving range of the substrate stage while the substrate stage moves from below the substrate processing system to below the exposure optical system.

8 Claims, 39 Drawing Sheets

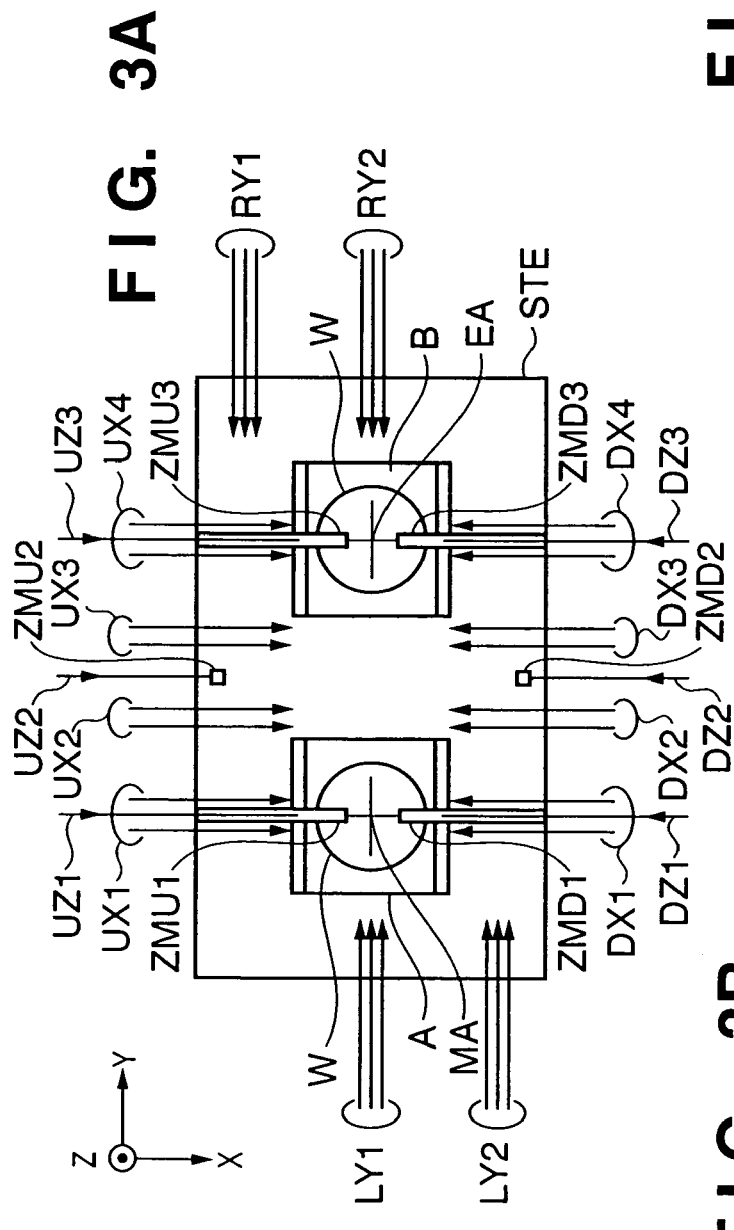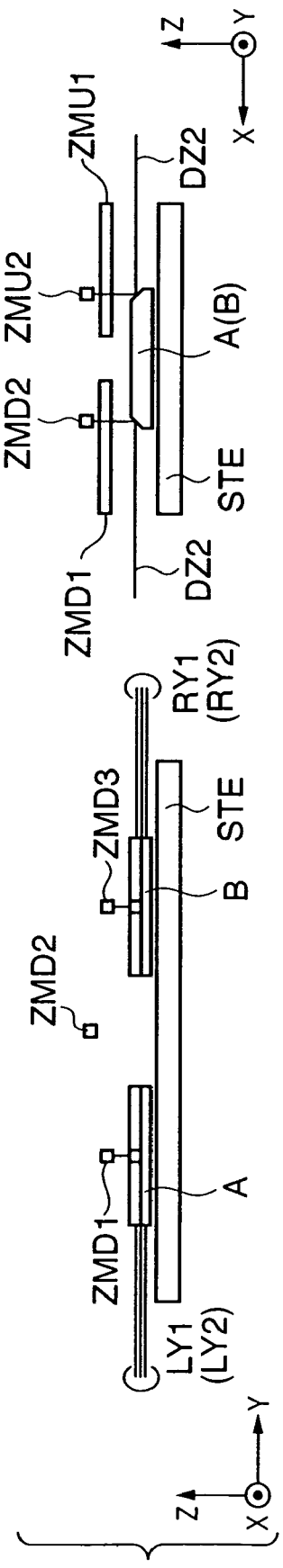

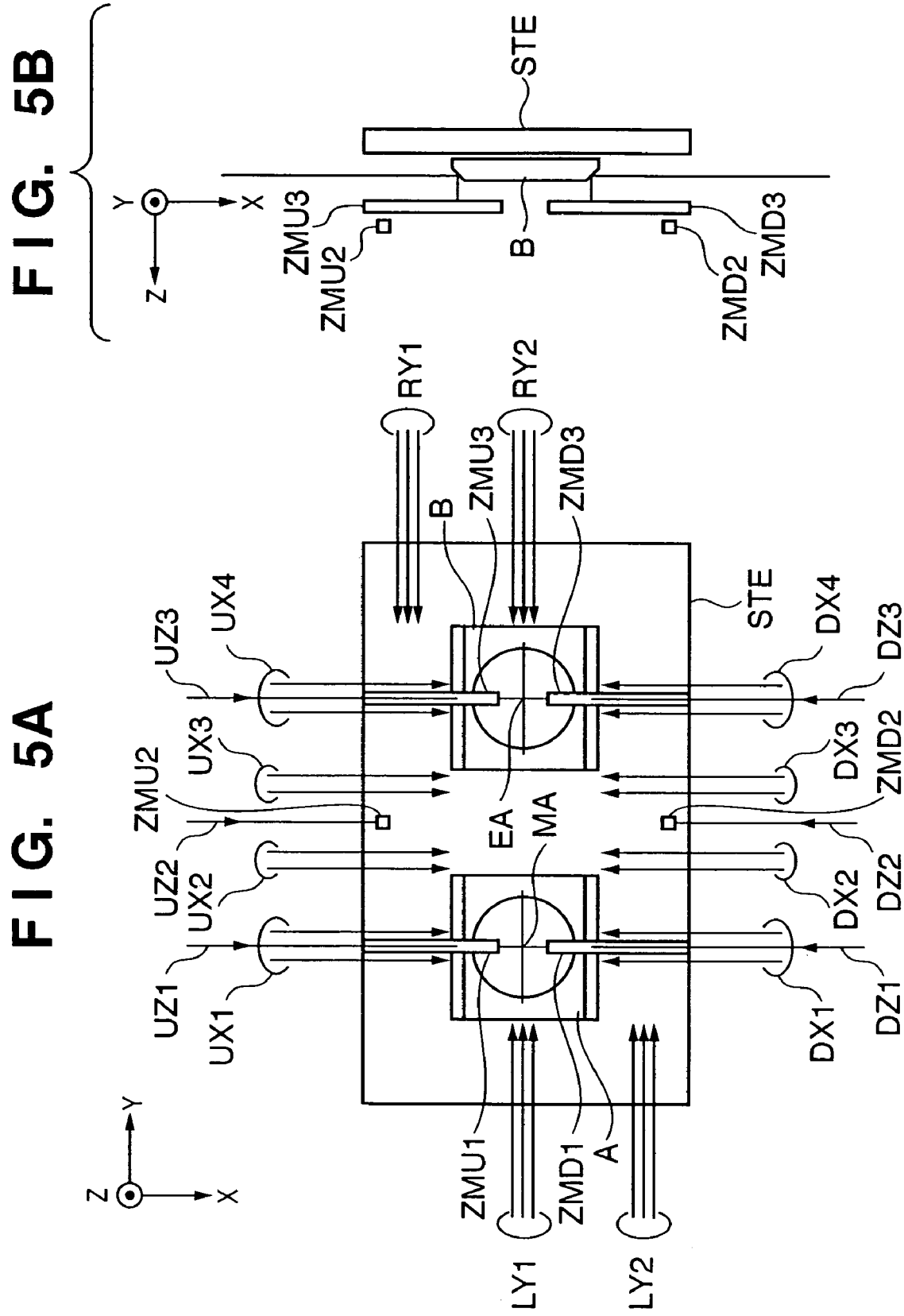

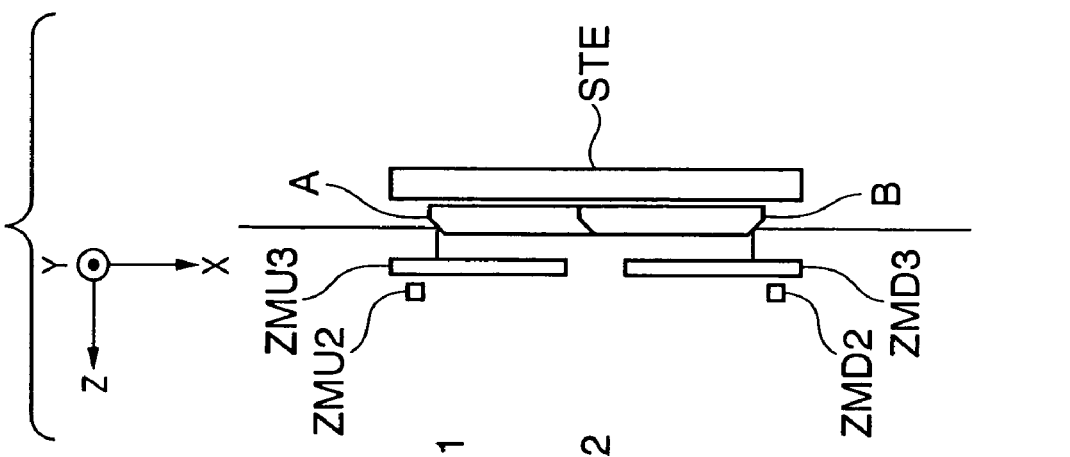
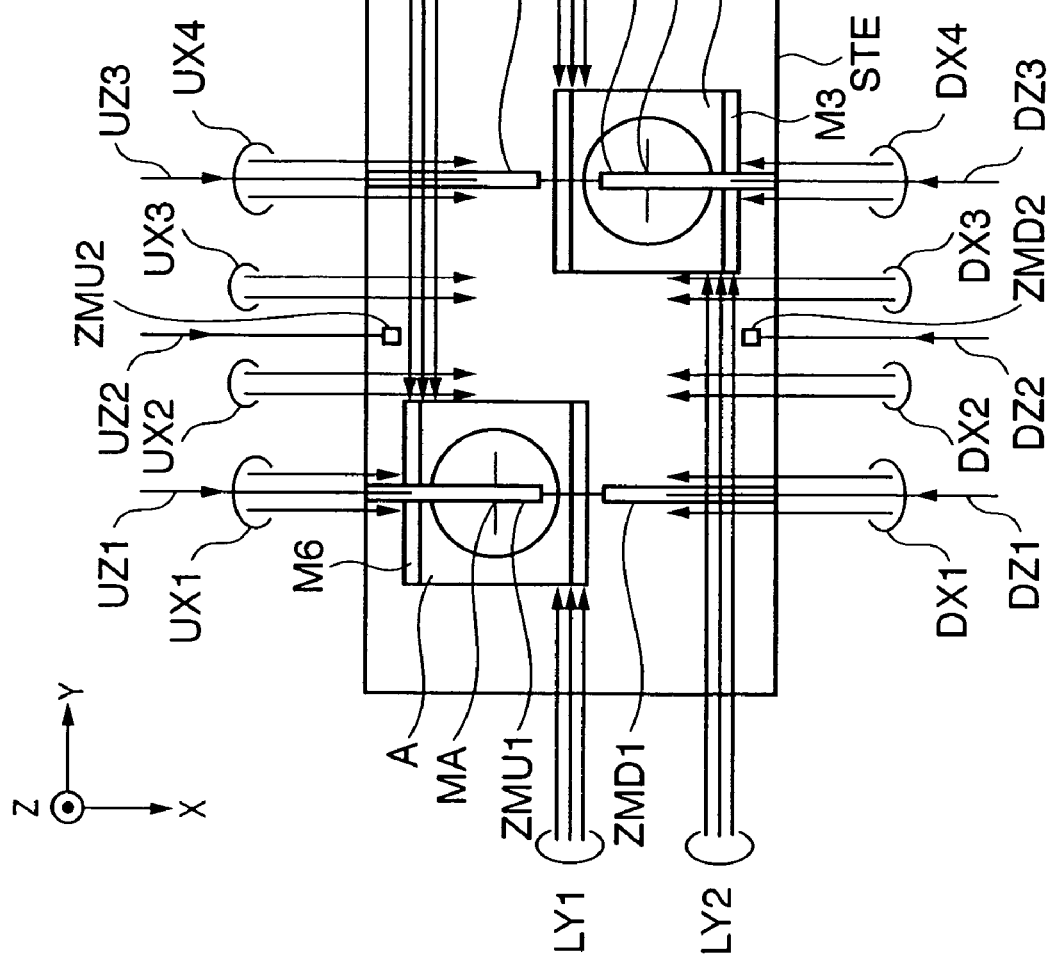

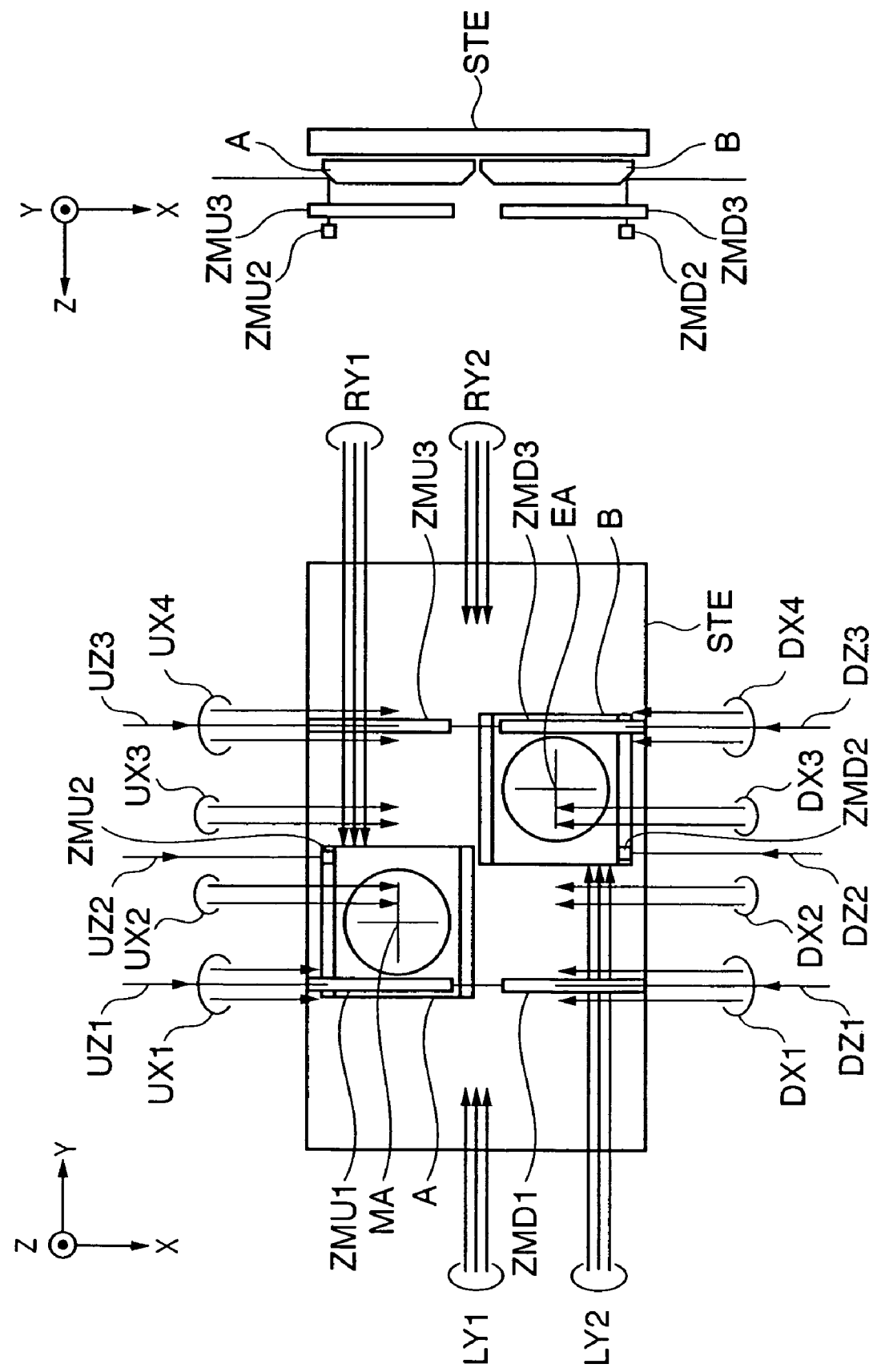

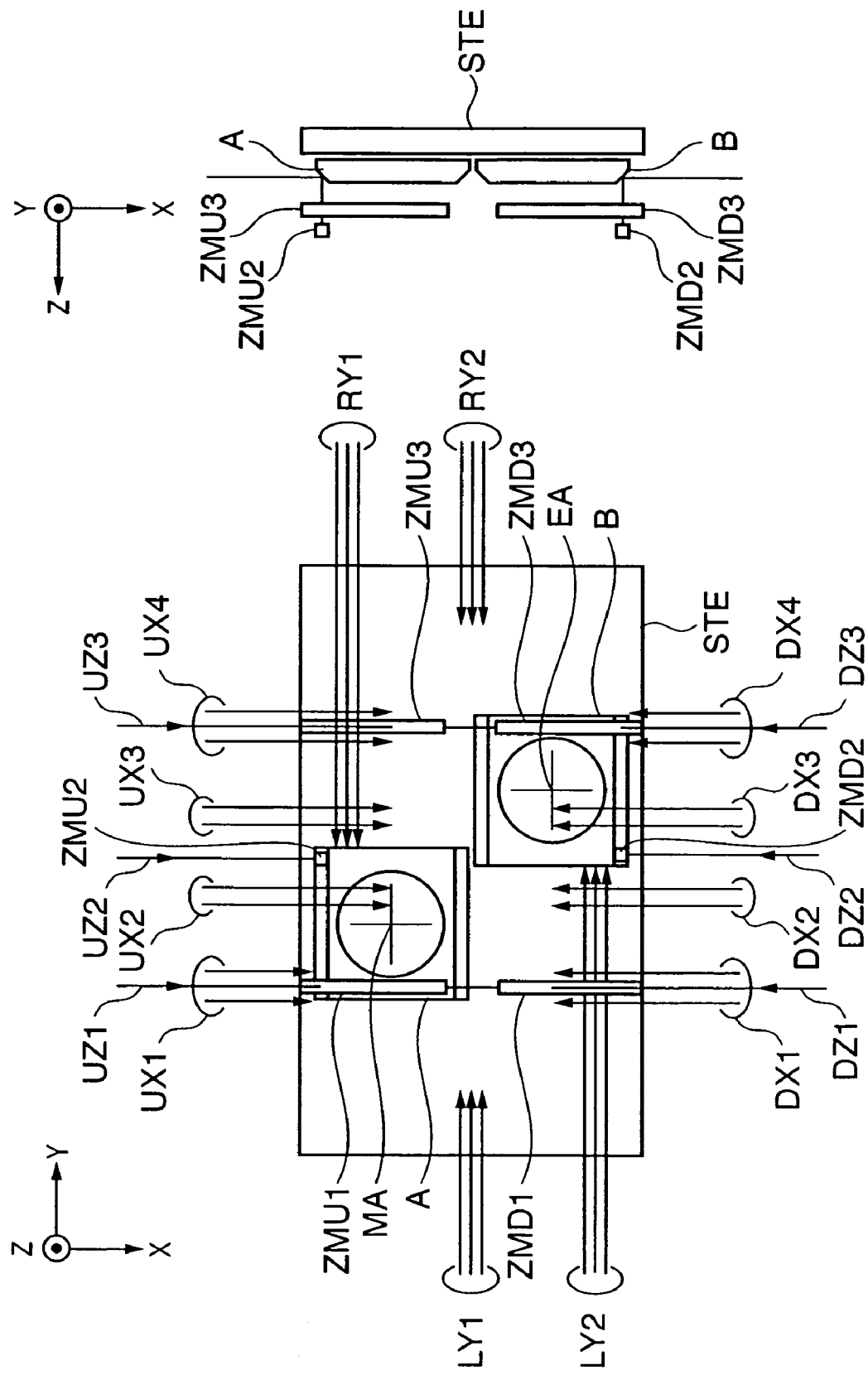

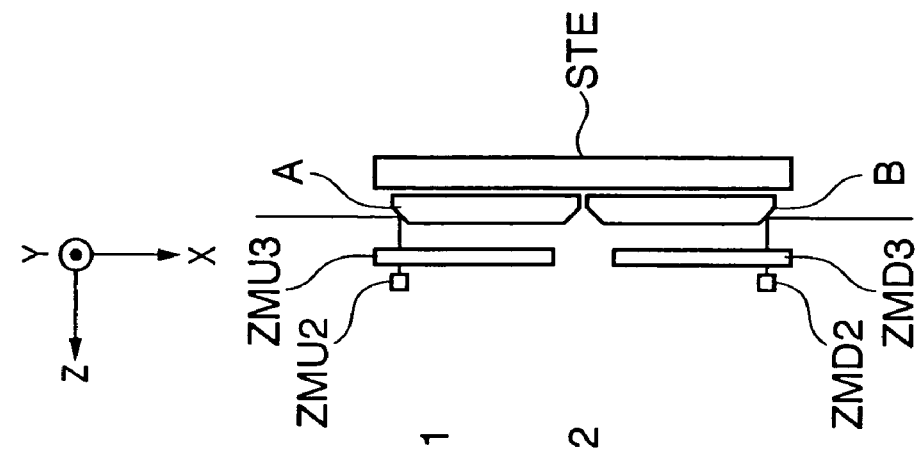
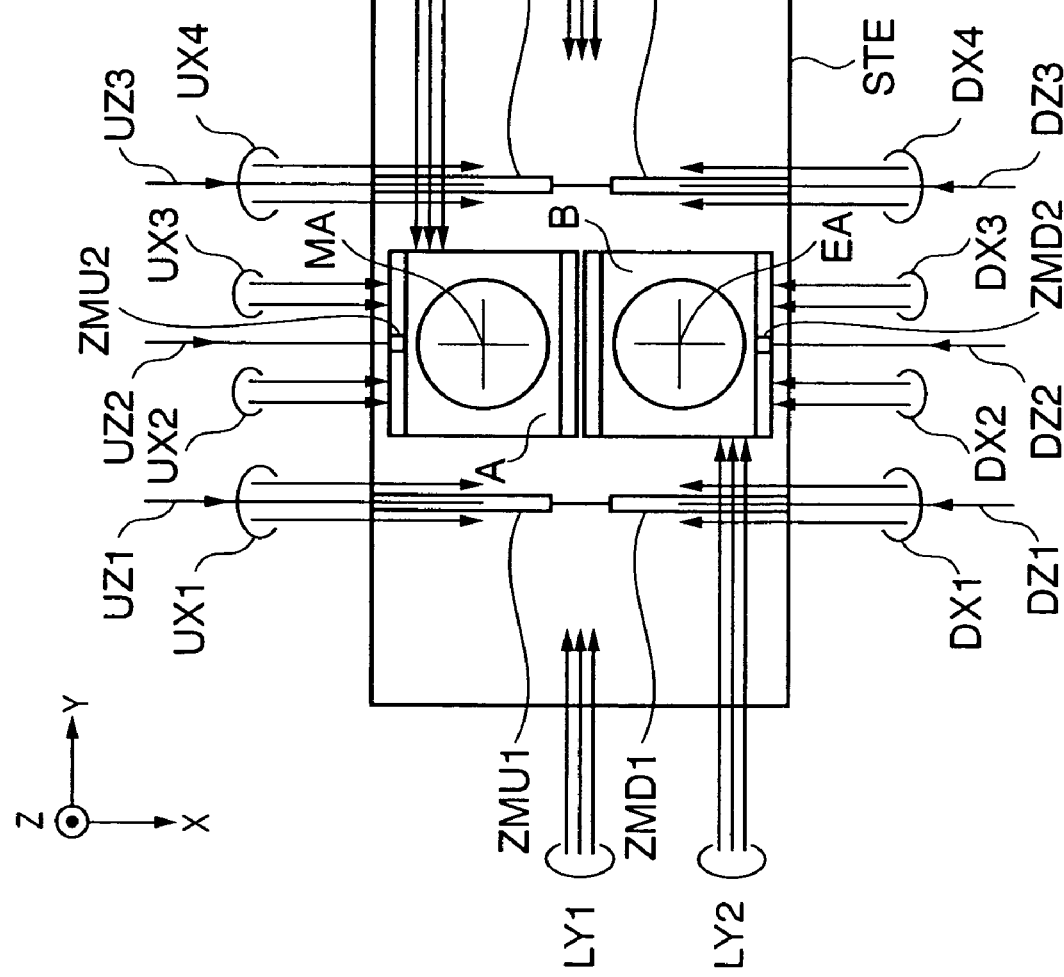

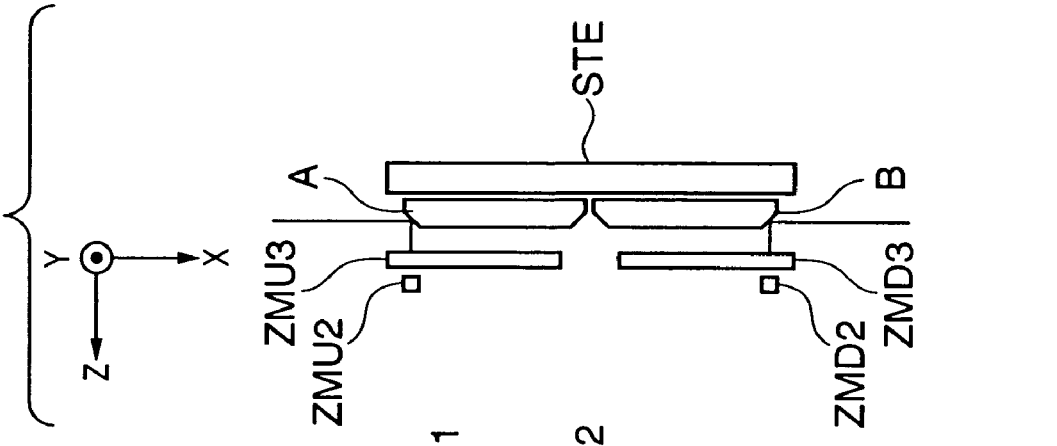
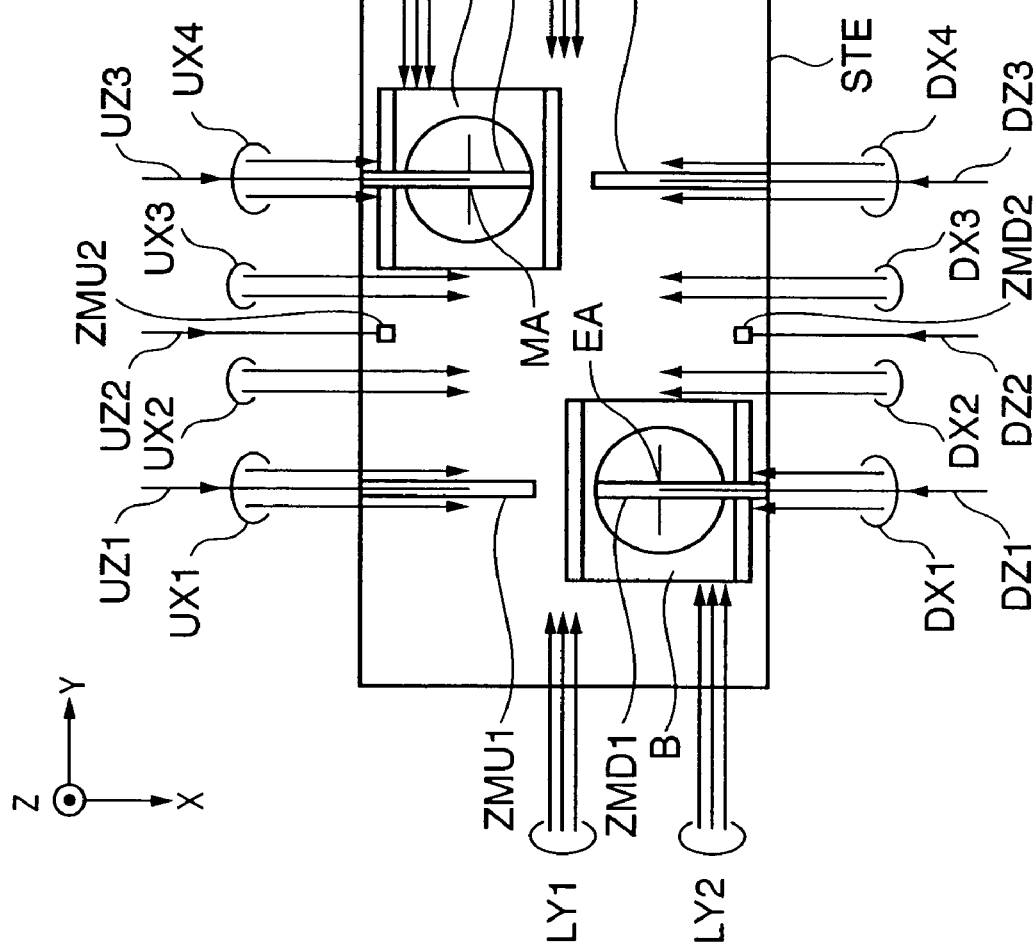

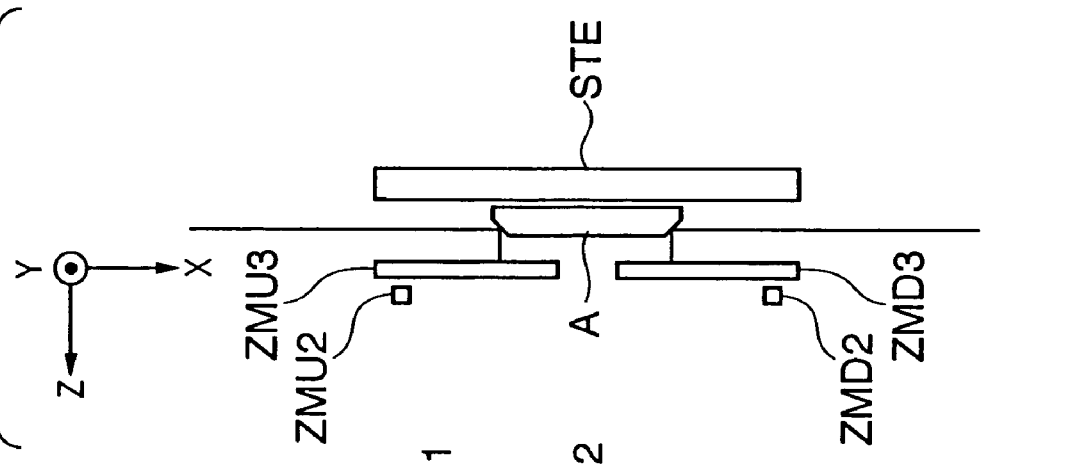
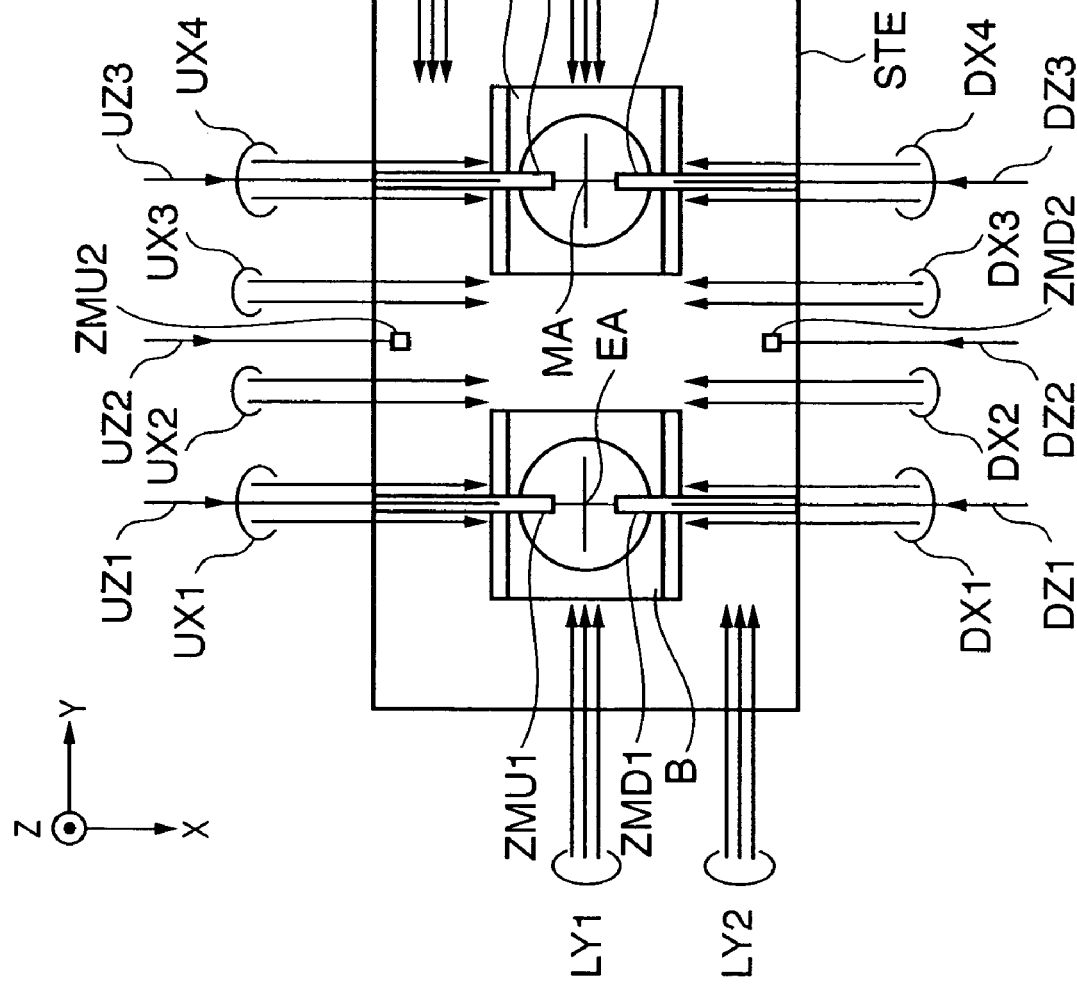

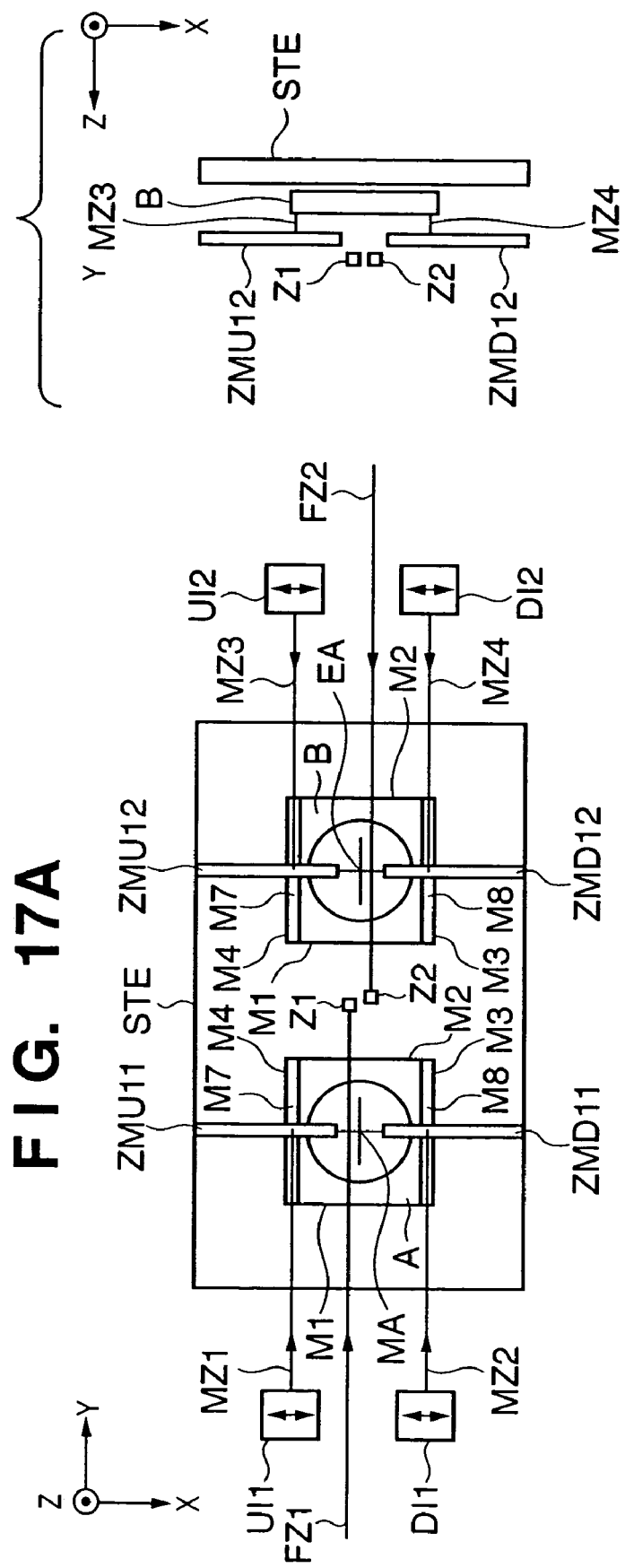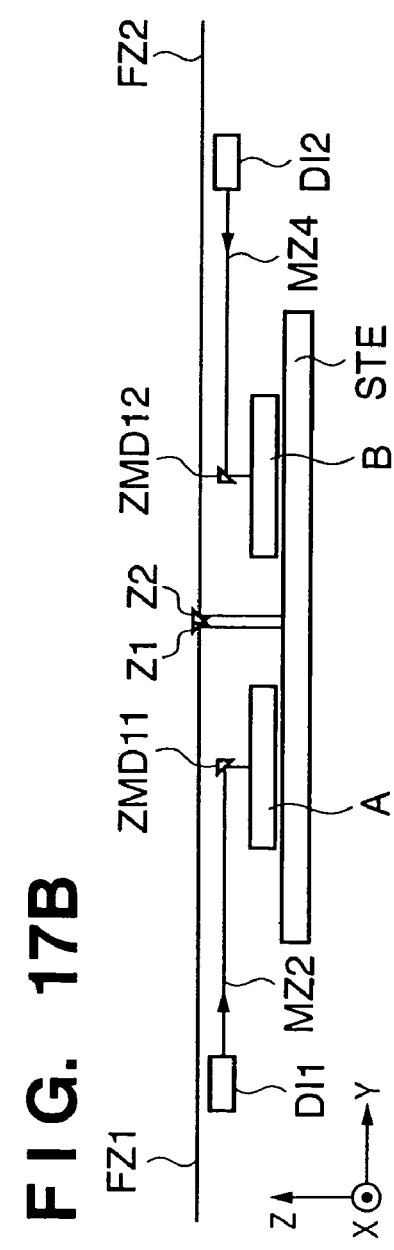

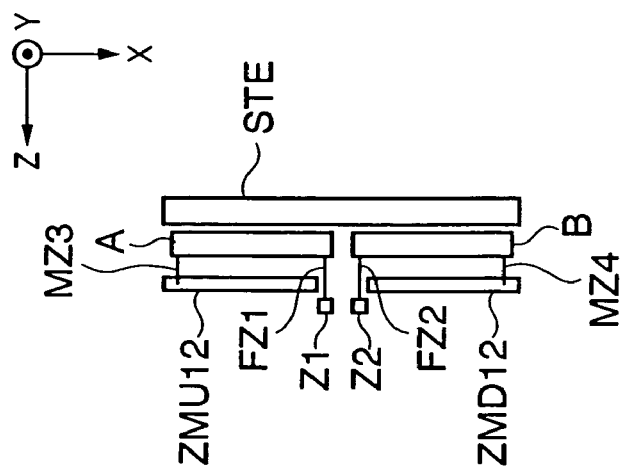
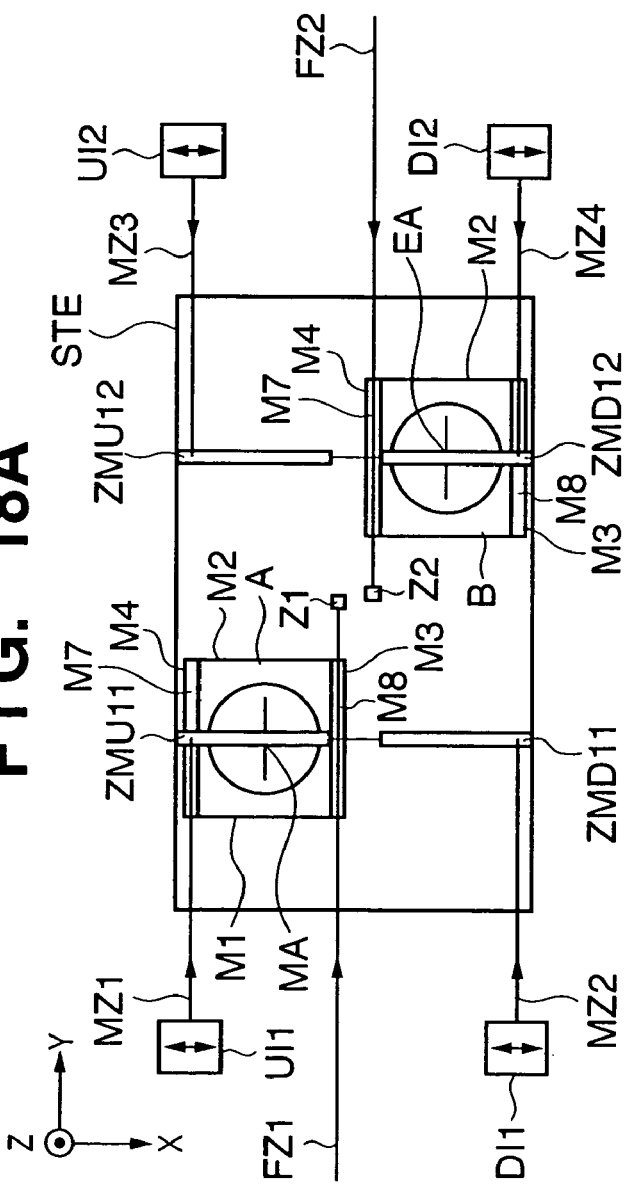
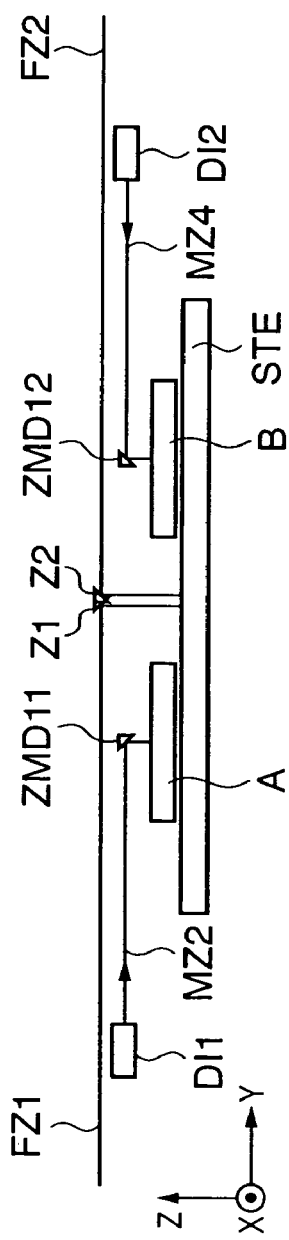

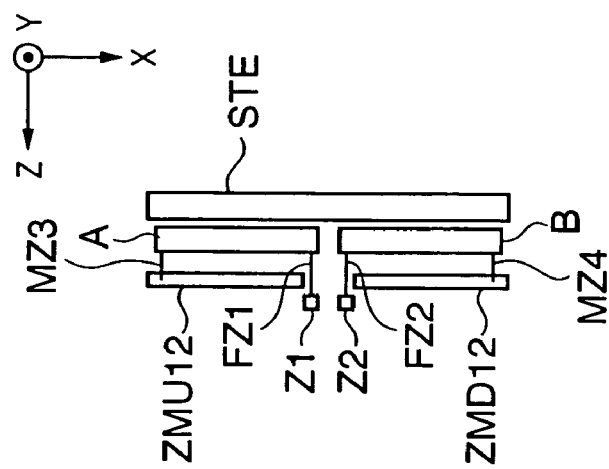
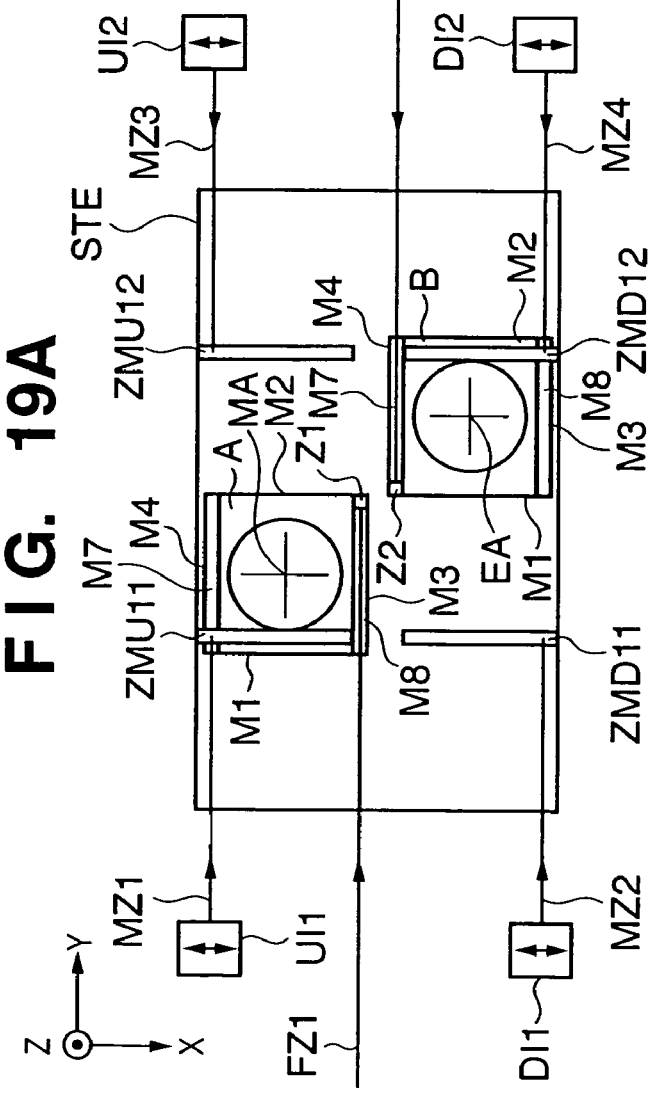
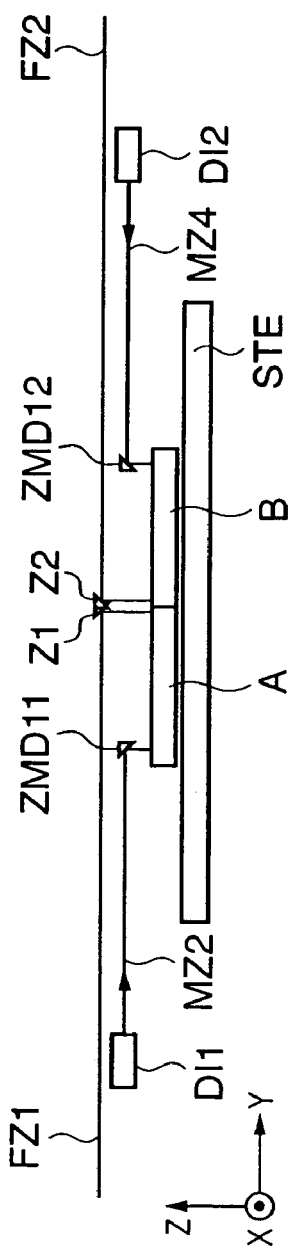

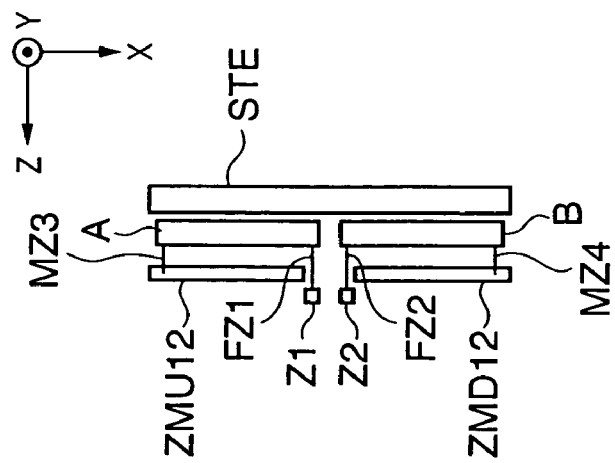
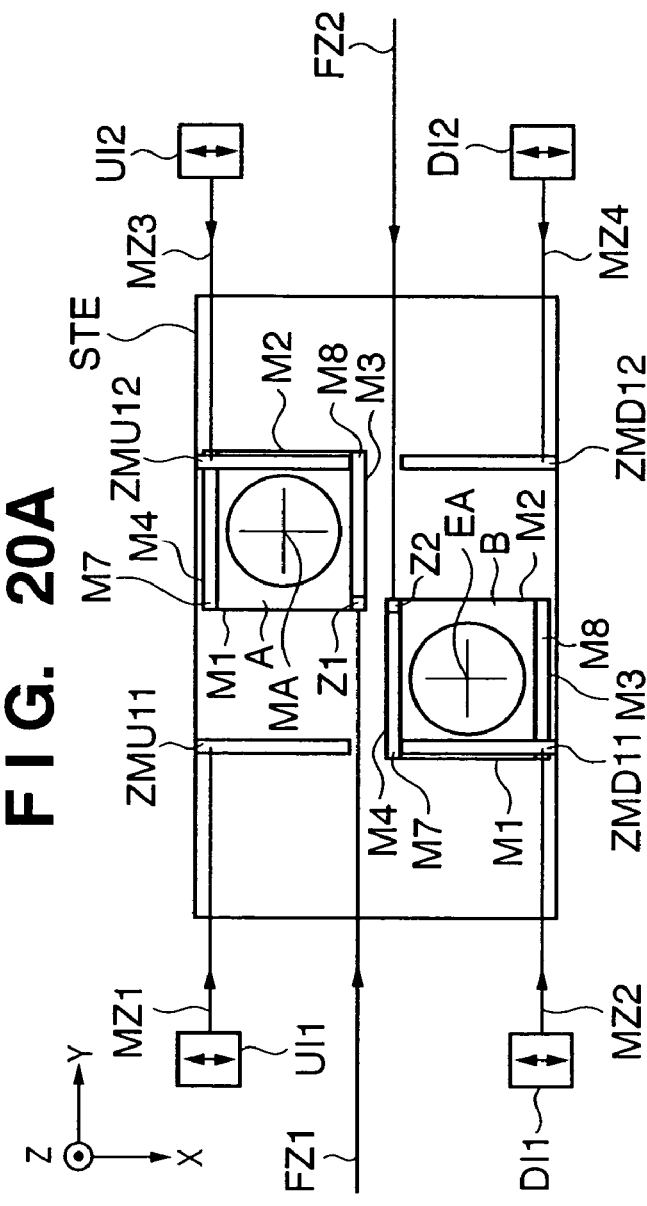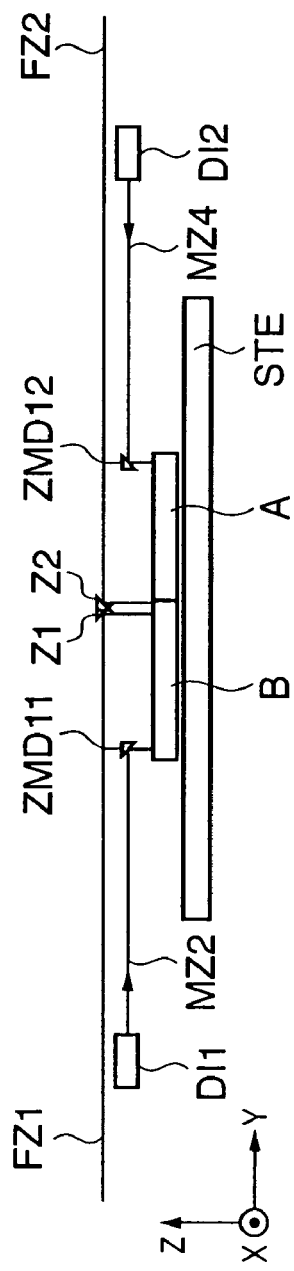

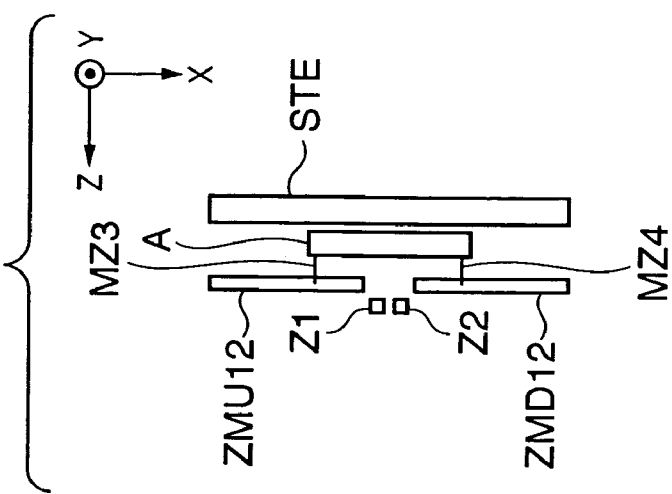
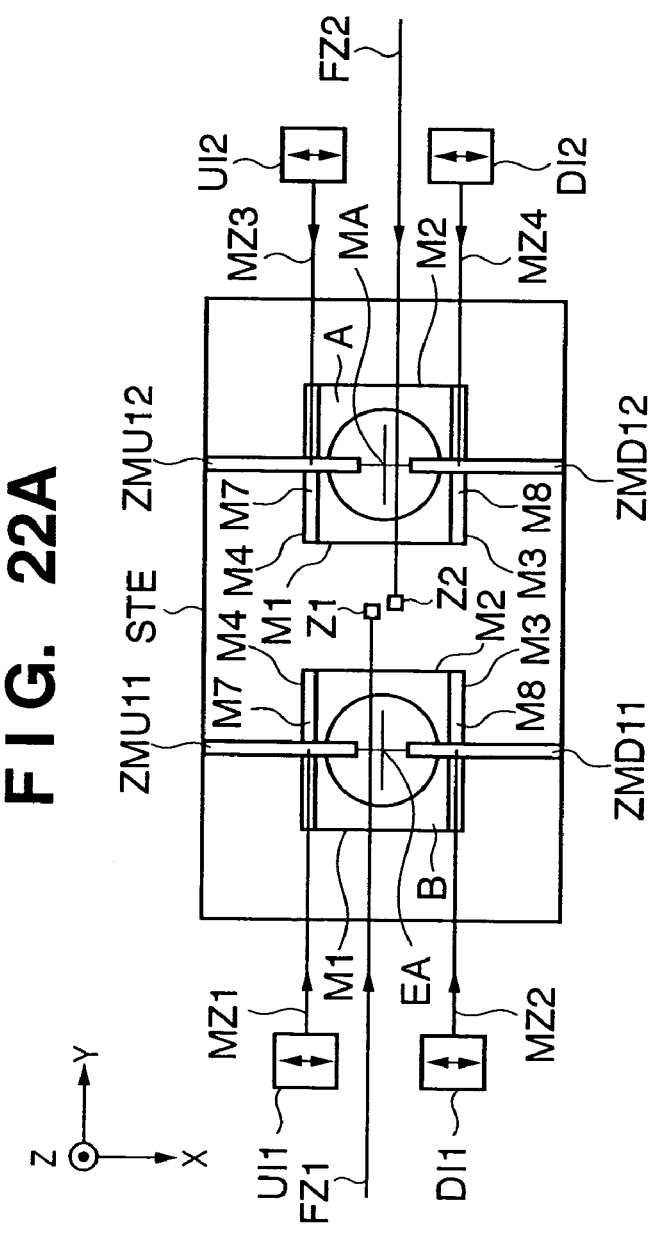
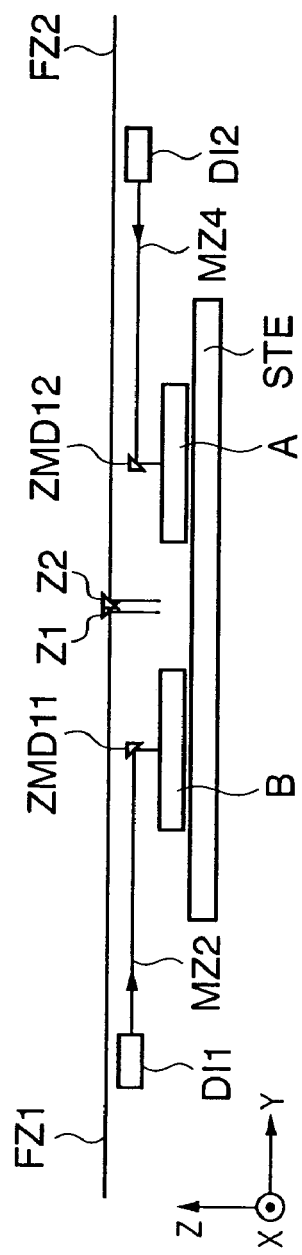

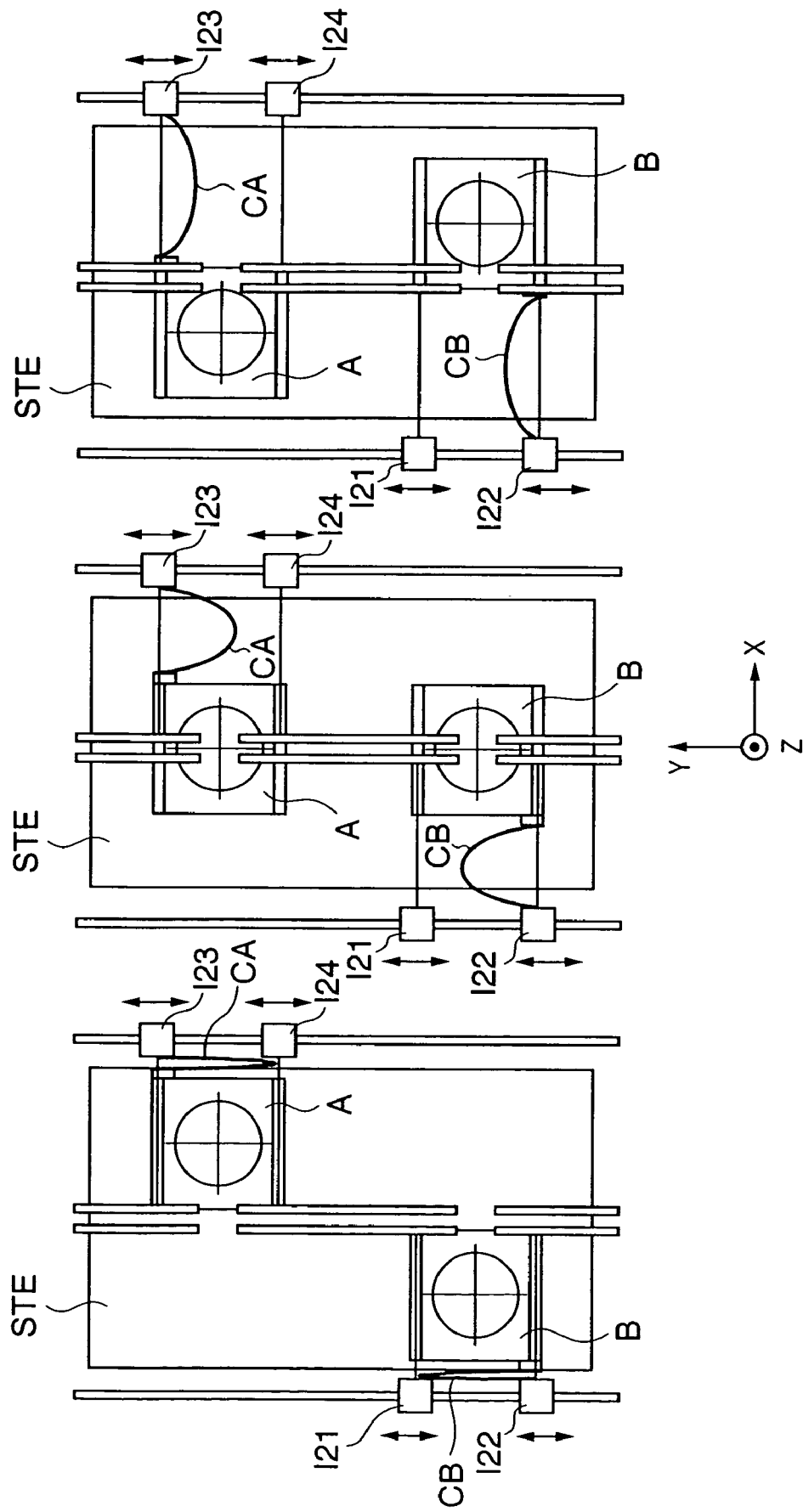

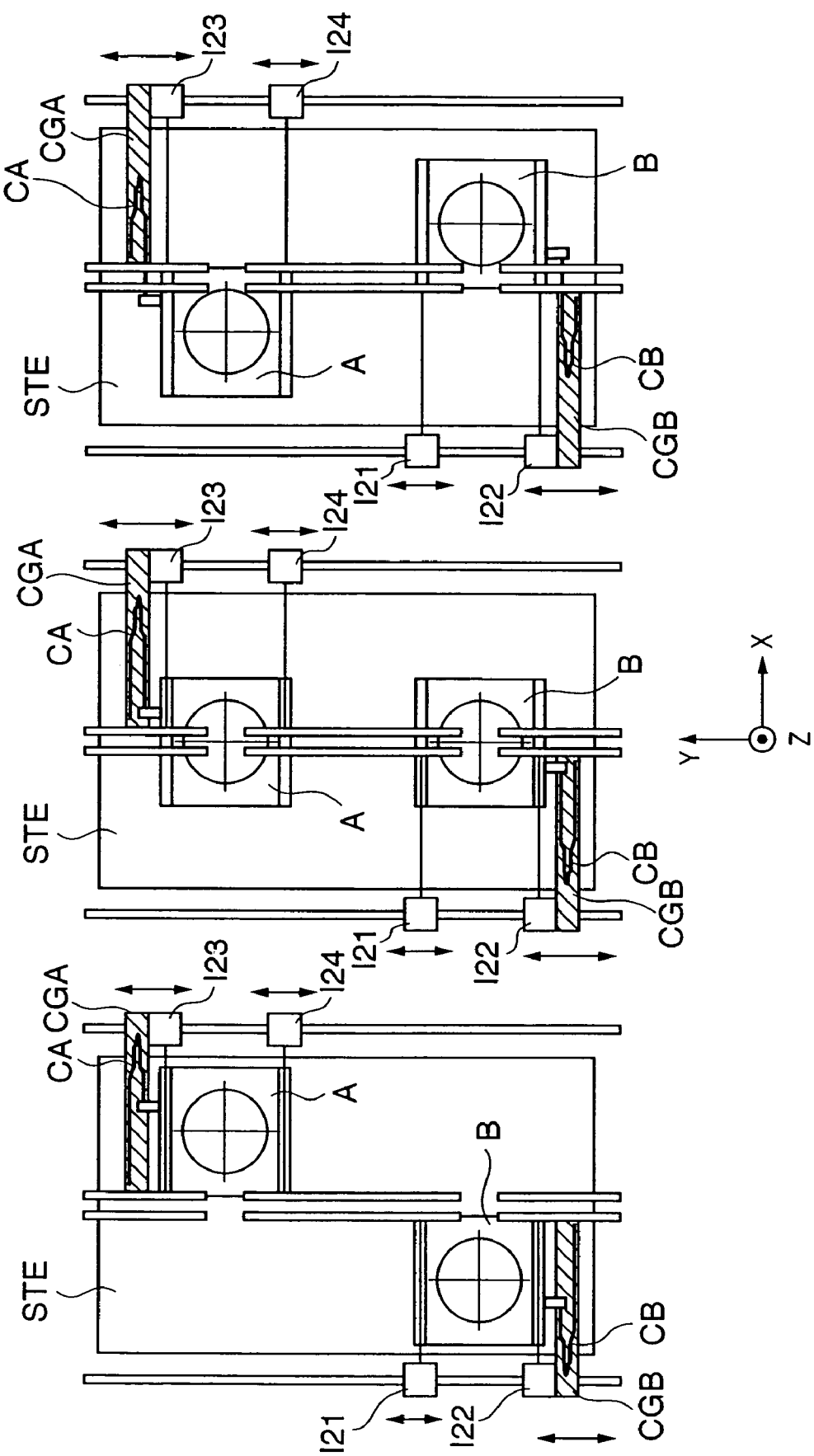

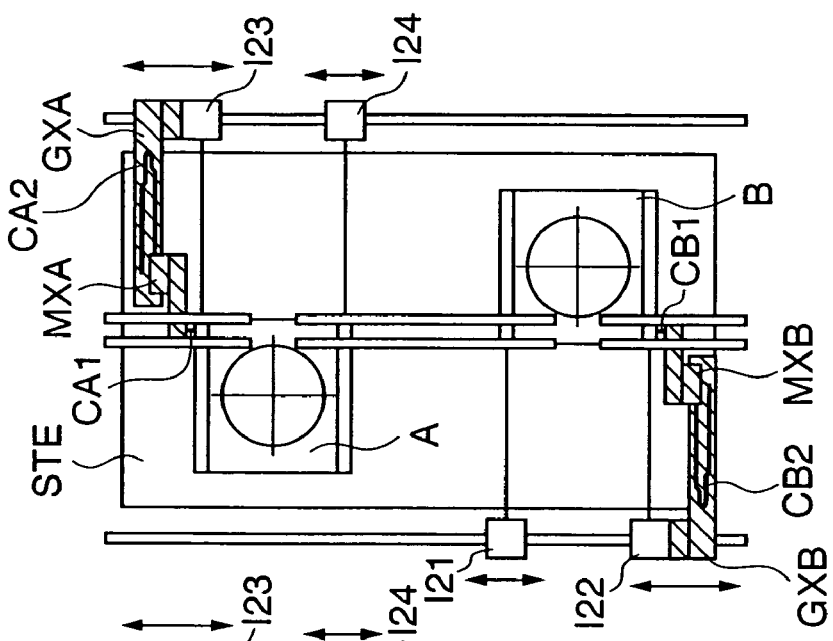
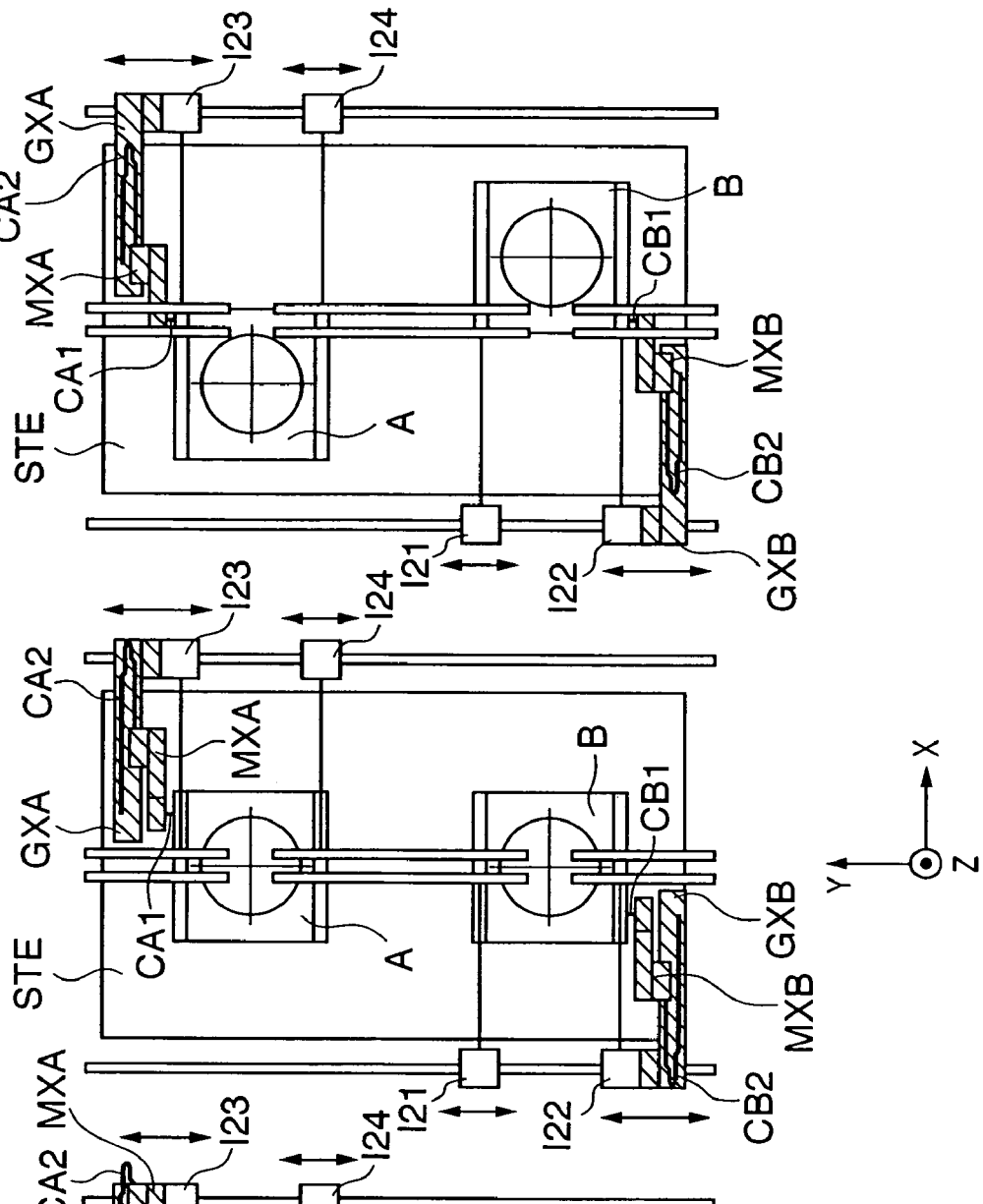
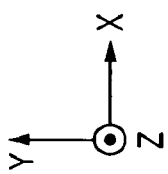
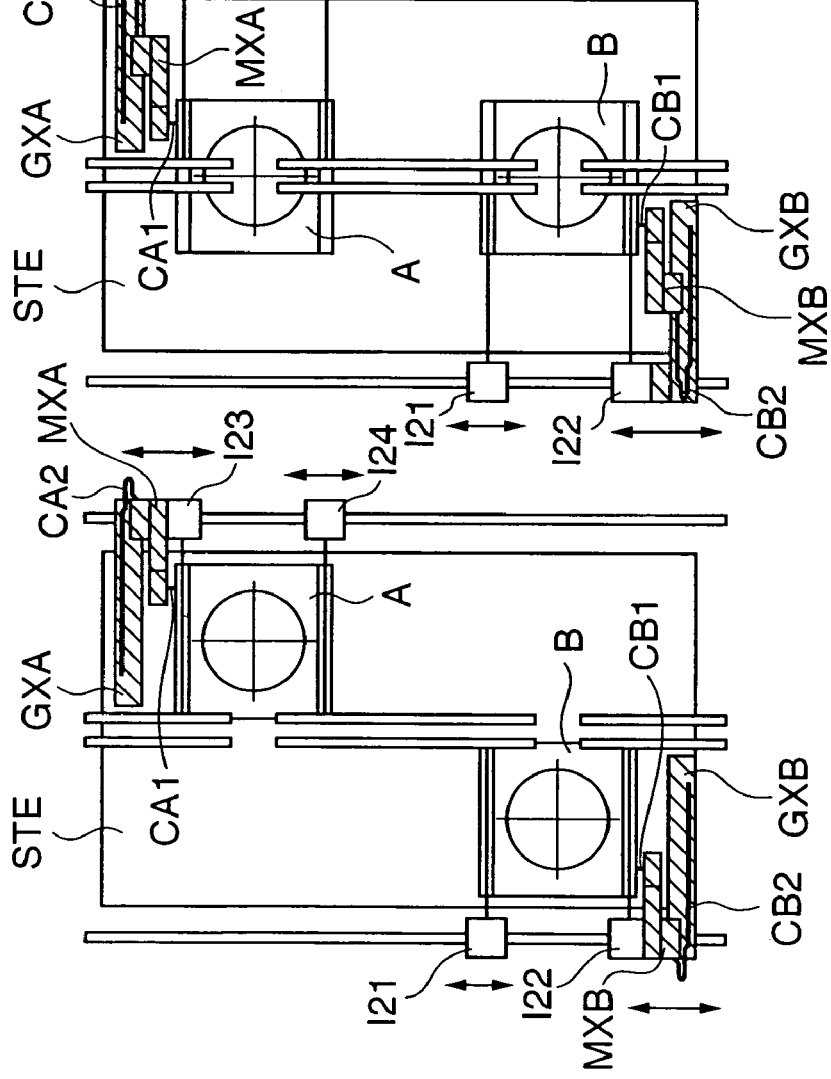
FIG. 29A  FIG. 29B  FIG. 29C

EXPOSURE APPARATUS AND DEVICE MANUFACTURING METHOD

FIELD OF THE INVENTION

The present invention relates to an exposure apparatus and a device manufacturing method using the exposure apparatus.

BACKGROUND OF THE INVENTION

Exposure apparatuses which manufacture devices such as a semiconductor device have tackled an increase in productivity. In order to increase the productivity, there has recently been developed an exposure apparatus in which a plurality of substrate stages for supporting a substrate are arranged and exposure and other processes are simultaneously performed.

An example of a process other than exposure is a measurement process for focusing or alignment (positioning). In this case, a measurement optical system for focusing or alignment is arranged at a position apart from an exposure optical system.

Japanese Patent Laid-Open No. 2002-280283 discloses a technique of increasing the productivity by arranging two substrate stages for supporting a substrate and executing exposure and alignment information detection in parallel to each other for two substrates. In an exposure apparatus disclosed in patent reference 1, a projection optical system for exposing a substrate and an alignment optical system for detecting alignment information are arranged apart from each other, and two substrate stages can be swapped with each other under the projection optical system and alignment optical system. This reference discloses a method of measuring the positions of the substrate stages in the translation direction (direction perpendicular to the optical axis of the projection optical system) between the projection optical system and the alignment optical system.

In order to align the wafer surface to the focus position of a pattern at high precision in the above exposure apparatus, measurement of the position of the substrate stage along the optical axis must also be considered. The exposure position and processing position must be set apart from each other in the translation direction in order to avoid contact between the substrate stages. In this case, a position measurement means for the substrate stage along the optical axis must be separately adopted.

When, however, the position measurement means is separately arranged, measurement is interrupted while the substrate stage moves from the processing position to the exposure position, and the reference position must be set again after movement. As a method of setting the reference position, the substrate stage is abutted against the reference position in the Z direction, or the reference portion is detected by a detection optical system, but these methods delay the start of exposure. Detection of the reference portion by the detection optical system premises that the stage enters the detection range of the detection optical system along the optical axis, but the reference portion may fall outside the detection range depending on the precision of a guide which guides the stage. This poses a problem particularly when a displacement sensor such as an interferometer is used as the position measurement means.

SUMMARY OF THE INVENTION

The present invention has been made to overcome the conventional drawbacks, and has as its illustrative object to shorten the time until exposure or a process starts, and increase the productivity upon movement between below a substrate processing system and below an exposure optical system.

In order to achieve the above object, an exposure apparatus comprises an exposure optical system which exposes a substrate to a pattern, a substrate processing system which performs a predetermined process for the substrate at a position apart from the exposure optical system, a substrate stage which moves along a plane perpendicular to an optical axis of the exposure optical system, and a measurement device which continuously measures a position of the substrate stage along the optical axis in a moving range of the substrate stage while the substrate stage moves from below the substrate processing system to below the exposure optical system.

The present invention can shorten the time until exposure or a process starts, and increase the productivity upon movement between below the substrate processing system and below the exposure optical system.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 3A to 3C are views schematically showing the arrangement of a measurement system according to the first embodiment of the present invention;

FIGS. 5A and 5B are views for explaining the operation of a measurement system according to the first embodiment;

FIGS. 6A and 6B are views for explaining the operation of the measurement system according to the first embodiment;

FIGS. 8A and 8B are views for explaining the operation of the measurement system according to the first embodiment;

FIGS. 9A and 9B are views for explaining the operation of the measurement system according to the first embodiment;

FIGS. 10A and 10B are views for explaining the operation of the measurement system according to the first embodiment;

FIGS. 11A and 11B are views for explaining the operation of the measurement system according to the first embodiment;

FIGS. 12A and 12B are views for explaining the operation of the measurement system according to the first embodiment;

FIGS. 17A to 17C are views showing the arrangement of a measurement system according to the second embodiment of the present invention;

FIGS. 18A to 18C are views for explaining the operation of the measurement system according to the second embodiment;

FIGS. 19A to 19C are views for explaining the operation of the measurement system according to the second embodiment;

FIGS. 20A to 20C are views for explaining the operation of the measurement system according to the second embodiment;

FIGS. 22A to 22C are views for explaining the operation of the measurement system according to the second embodiment;

FIGS. 24A to 24C are views for explaining operation according to the third embodiment;

FIGS. 27A to 27C are views showing the operation of modification 1 to the third embodiment;

FIGS. 29A to 29C are views showing the operation of modification 2 to the third embodiment;

DETAILED DESCRIPTION OF THE PREFERRED EMBODIMENTS

First Embodiment

An exposure apparatus as a preferred embodiment of the present invention will be illustratively explained.

Figure 1:
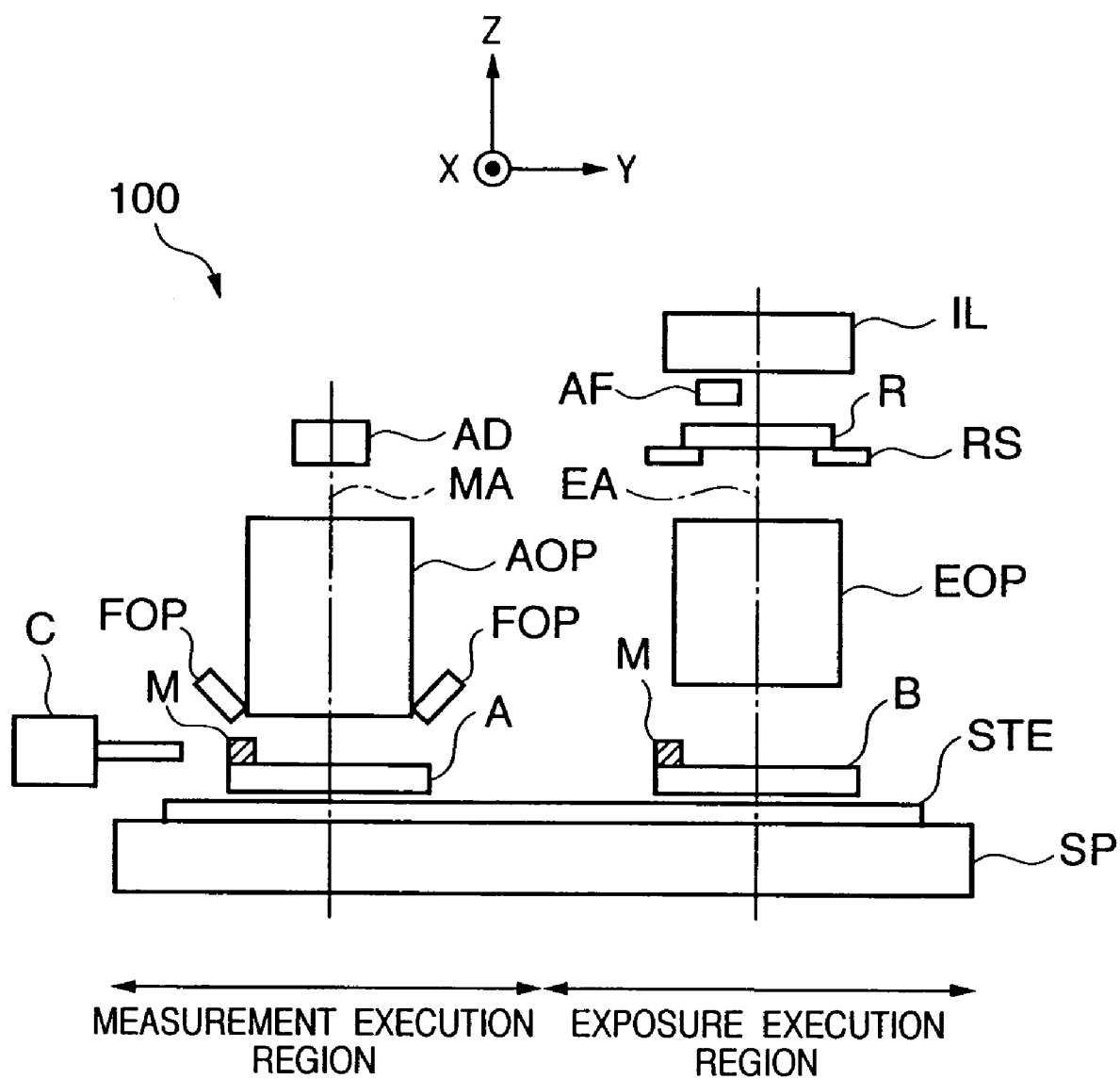
FIG. 1 is a front view schematically showing the arrangement of an exposure apparatus according to a preferred embodiment of the present invention.
Figure 2:
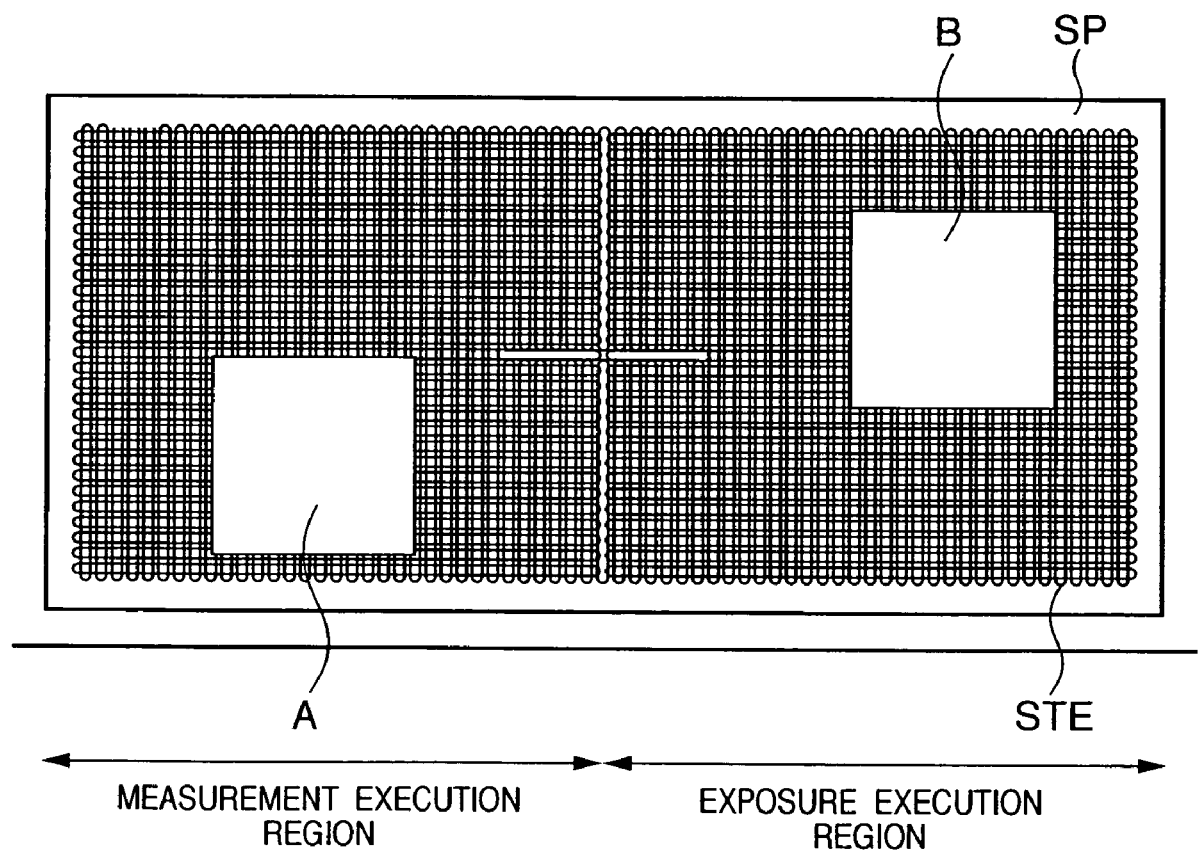
FIG. 2 is a plan view schematically showing the arrangement of the stage of the exposure apparatus shown in FIG. 1.

FIG. 1 is a front view schematically showing the arrangement of the exposure apparatus according to the preferred embodiment of the present invention. FIG. 2 is a plan view schematically showing the arrangement of a stage device mounted on the exposure apparatus shown in FIG. 1. An exposure apparatus 100 shown in FIGS. 1 and 2 is constituted as an apparatus for manufacturing a device such as a semiconductor device.

The exposure apparatus 100 comprises a stage device having two stages which respectively operate, drive, or position two substrates. The stage device is constituted including a stage surface plate, two stages, driving units (actuators) for driving the two stages, and the like. In the embodiment shown in FIGS. 1 and 2, a stator STE formed from a coil array is arranged on a stage surface plate SP, and two stages A and B are arranged on the stator STE. The stages A and B have movable members formed from magnet strings, and the stator STE and movable members constitute a plane motor. The stages A and B are movable on the stator STE by the plane motor in the X and Y directions. The stages A and B support fine moving stages capable of finely driving wafer chucks (not shown) mounted on the stages A and B in the Z direction, in the tilt direction (around the X- and Y-axes), and around the Z-axes. Each fine moving stage may be so constituted as to finely move the wafer chuck in the X and Y directions. The wafer chuck supports a substrate such as a wafer to be exposed. Note that the stages A and B need not be separately equipped with coarse and fine moving stages, and the coarse and fine moving stages may be integrated and driven in directions with six degrees of freedom.

Mirrors are arranged on the side and upper surfaces of the stages A and B, and the positions of the stages A and B in directions with six degrees of freedom are measured by interferometers. The mirrors may be integrated with the stages A and B, or may be separately fabricated and then attached to the stages A and B.

The exposure apparatus 100 includes an exposure execution region (work region) where a pattern is transferred or drawn onto a wafer, and a measurement execution region (work region) where measurement for alignment is performed. An exposure optical system (typically a projection optical system) EOP is arranged in the exposure execution region, whereas a measurement optical system AOP is arranged in the measurement execution region. Reference symbol EA denotes an optical axis of the exposure optical system EOP; and MA, an optical axis of the measurement optical system AOP. In the following description, the directions of the optical axes EA and MA are defined as the Z direction, and a plane perpendicular to these optical axes is defined as an X-Y plane.

A reticle holder RS which holds a reticle (oringinal) R, and an illumination optical system IL which illuminates the reticle R and projects the pattern of the reticle R onto wafers on the stages A and B (stage B in the state shown in FIG. 1) via the exposure optical system EOP are arranged above the exposure optical system EOP. Instead of this arrangement, an arrangement which draws a pattern onto a wafer by a charged particle beam such as an electron beam can be employed. A detector AD for detecting the positions of alignment marks (not shown) formed on wafers on the stages A and B (stage A in the state shown in FIG. 1) is arranged above the measurement optical system AOP. This arrangement can measure the positions of alignment reference marks M1 formed on the stages A and B and those of alignment marks on wafers.

The measurement execution region includes an oblique incidence optical system FOP for measuring the surface position of a wafer. The oblique incidence optical system has an irradiation means such as an LED which irradiates the wafer surface with light, and a light-receiving means such as a CCD which receives light reflected by the wafer surface. This arrangement can measure the surface positions of focus reference marks M2 formed on the stages A and B and those of wafers. The reference marks M1 and M2 are simply represented as M in FIG. 1, and the alignment reference mark M1 and focus reference mark M2 may be set at different positions.

The exposure execution region includes a detection optical system AF for aligning the focus reference mark M2 to the focus position of a pattern. As the detection method, an image of light having passed through or reflected by the reference mark upon irradiation with light may be detected using a CCD or the like. Alternatively, the quantity of light, contrast, or phase may be detected using another sensor. Such a detection optical system has a given detectable range along the optical axis. Although not shown, the exposure execution region also includes an optical system for detecting the position of the alignment reference mark M1 in order to align a pattern to be formed next and a previously formed pattern.

Supply of wafers to the stages A and B and recovery of the wafers from them are performed by, e.g., a transport mechanism C.

The stages A and B are movable to both the exposure execution region and measurement execution region. For example, in the state shown in FIGS. 1 and 2, the stage A is positioned within the measurement execution region, and the stage B is positioned within the exposure execution region. By driving the plane motor, the stages A and B can be moved into the exposure execution region and measurement execution region, respectively.

For example, in the state shown in FIGS. 1 and 2, while a wafer (assumed to have already undergone measurement for alignment and focusing in the measurement execution region) on the stage B is positioned in accordance with the results of measurement for alignment and focusing, the pattern of the reticle R is projected and transferred onto the wafer via the exposure optical system EOP. At the same time, the position of an alignment mark formed on a wafer on the stage A can be detected by the detector AD, and the surface position of the wafer can be detected by the oblique incidence optical system FOP.

After an exposure process to the wafer on the stage B and a measurement process (process of detecting the position of the alignment mark and process of detecting the surface position of the wafer) to the wafer on the stage A end, the stage A can be moved into the exposure execution region, and the stage B can be moved into the measurement execution region.

In this state, while the wafer on the stage A is positioned in accordance with the results of measurement for alignment and focusing, the pattern of the reticle R is projected and transferred onto the wafer via the exposure optical system EOP. During this process, the wafer on the stage B can be recovered by the transport mechanism C, and a new wafer can be supplied onto the stage B by the transport mechanism C. Further, the position of an alignment mark formed on the wafer can be detected by the detector AD, and the surface position of the wafer can be detected by the oblique incidence optical system FOP.

The throughput can be increased by parallel-executing these processes, i.e., the measurement and exposure processes. The positions of the stages A and B can preferably be continuously measured in moving the stages A and B in order to swap the positions of the stages A and B (swap two wafers). Continuous position measurement makes continuous feedback control of the stages A and B possible. If the position cannot be continuously measured, the position control systems of the stages A and B must be initialized every time position measurement restarts. In the use of interferometers in continuous position measurement, it is required that measurement results by the interferometers are not interrupted by movement of the stages A and B. "Continuous" means that a measurement result can be sampled at a predetermined time interval in a sampling control system, and it does not matter whether no measurement result is obtained at an interval between a timing of sampling and the next timing. In particular, by continuously measuring the interferometer for measuring the position of the stage along the optical axis, the stage can be adjusted within the detection range of the detection optical system while moving under the exposure optical system. This eliminates the step of adjusting the stage within the detection range after moving the stage under the exposure optical system. As a result, the time taken for focusing of the substrate can be shortened, increasing the productivity.

An apparatus arrangement and a method for implementing continuous position measurement of the stages A and B will be explained.

Figure 4A:
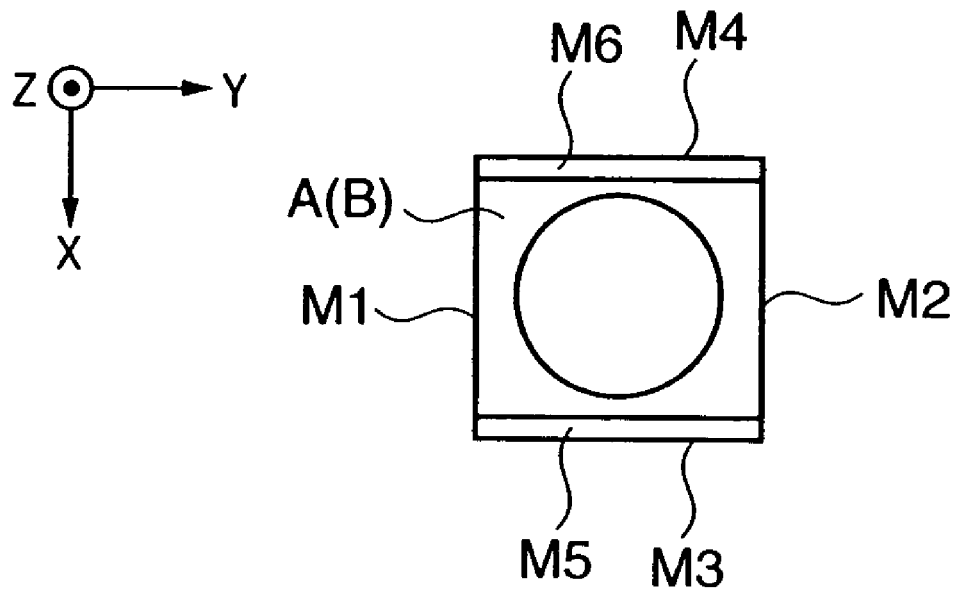
FIGS. 4A and 4B are views showing an arrangement example of a stage having a mirror.
Figure 4B:
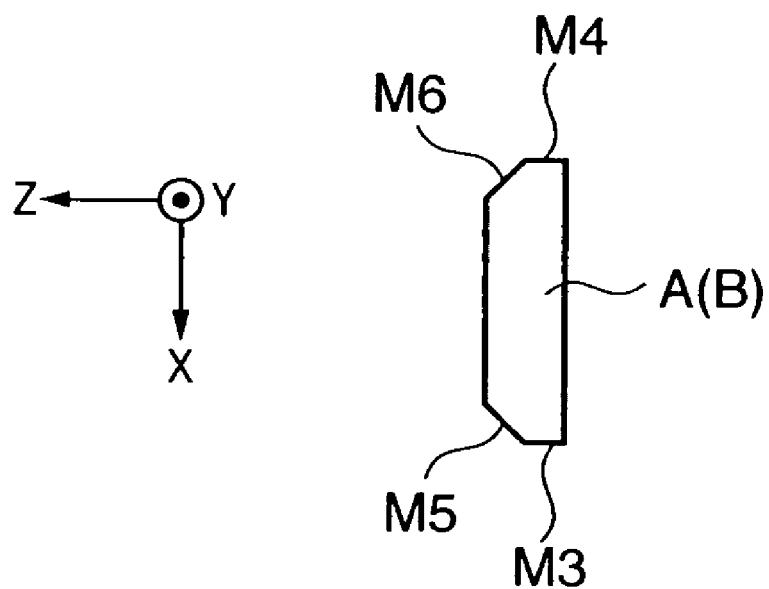

FIGS. 3A to 3C are views schematically showing the arrangement of a measurement system according to the first embodiment of the present invention. FIG. 3A is a plan view, FIG. 3B is a front view, and FIG. 3C is a side view. As shown in FIGS. 4A and 4B, each of the stages A and B has plane mirrors M1 to M4 on four side surfaces. The X and Y positions, tilts (rotations around the X- and Y-axes), and rotation around the Z-axis can be measured by irradiating the plane mirrors M1 to M4 with an interferometer beam. The stages A and B are controlled in accordance with the measurement results. The interferometer measures displacement by causing reference light and measurement light to interfere with each other, and the beam which irradiates the mirror is measurement light. Reference light suffices to be guided by only a predetermined distance, and may be guided by, e.g., irradiation/reflection to/by a mirror which is fixed as a reference position to a support member supporting the exposure optical system. With this structure, the stage position can be measured with respect to the reference position.

On two side surfaces (two side surfaces on opposite sides) out of the four side surfaces, each of the stages A and B has plane mirrors M5 and M6 which form 45° with respect to the horizontal plane. The plane mirrors M5 and M6 extend in the Y direction. Z direction stationary mirrors ZMU1, ZMU3, ZMD1, and ZMD3 for measuring the Z positions of the stages A and B in cooperation with the plane mirrors M5 and M6 are so arranged as to extend in the X direction. Z direction stationary mirrors ZMU2 and ZMD2 are respectively arranged between the mirrors ZMU1 and ZMU3 and between the mirrors ZMD1 and ZMD3.

The Z positions of the stationary mirrors ZMU1, ZMU3, ZMD1, and ZMD3 are the same. The stationary mirrors ZMU1 and ZMD1 and the stationary mirrors ZMU3 and ZMD3 are the same in Y position and different in X position, respectively. The stationary mirrors ZMU1 and ZMU3 and the stationary mirrors ZMD1 and ZMD3 are the same in X position and different in Y position, respectively.

When the stationary mirrors M5 and M6 of the stages A and B are irradiated with Z measurement interferometer beams parallel in the X direction, the Z positions of the stages A and B can be measured using as a reference the stationary mirrors ZMU1, ZMU2, ZMU3, ZMD1, ZMD2, and ZMD3 which are supported parallel to the X-Y plane by a measurement surface plate (not shown). The measurement value contains X and Z displacements, and the X displacement must be measured separately in order to obtain the Z displacement (measurement of the X displacement will be described later).

Three Z measurement interferometer beams are emitted in each of the +X and −X directions, i.e., a total of six beams are emitted. Of these beams, four beams UZ1, UZ3, DZ1, and DZ3 can measure the Z displacement by using as a reference the stationary mirrors ZMU1, ZMU3, ZMD1, and ZMD3 extending in the X direction. Since the stationary mirrors ZMU1, ZMU3, ZMD1, and ZMD3 extend in the X direction, the Z positions of the stages A and B can be measured even while the stages A and B move in the X direction. The beams UZ1 and DZ1 are used to measure the Z displacement of a stage positioned below the measurement optical system out of the stages A and B. The beams UZ3 and DZ3 are used to measure the Z displacements of a stage positioned below the exposure optical system.

Two remaining beams UZ2 and DZ2 are used to measure the Z positions of the stages A and B in cooperation with the stationary mirrors ZMU2 and ZMD2 which are supported parallel to the X-Y plane by the measurement surface plate (not shown). The beams UZ2 and DZ2 are used while the stages A and B move between below the exposure optical system and below the measurement optical system. When the Z positions of the stages A and B are measured using the two beams UZ2 and DZ2, the X positions of the stages A and B are fixed (i.e., move along the Y-axis), and thus the stationary mirrors ZMU2 and ZMD2 need not extend in the X direction.

Each of interferometer beam groups UX1, UX2, UX3, UX4, DX1, DX2, DX3, and DX4 for measuring an X displacement includes two beams, and these beam groups are so arranged as to be able to measure the X displacements of the stages A and B and their rotations around the Y-axis. The interferometer beam groups UX1, UX2, UX3, and UX4 are emitted by interferometers from the −X direction toward the stages A and B, while the interferometer beam groups DX1, DX2, DX3, and DX4 are emitted by interferometers from the +X direction toward the stages A and B.

Each of interferometer beam groups LY1, LY2, RY1, and RY2 for measuring a Y displacement includes three beams, and these beam groups are so arranged as to be able to measure the Y displacements of the stages A and B and their rotations around the Z- and X-axes. The interferometer beam groups LY1 and LY2 are emitted by interferometers from the −Y direction toward the stages A and B, while the interferometer beam groups RY1 and RY2 are emitted by interferometers from the +Y direction toward the stages A and B.

That is, the displacements of the stages A and B around six axes can be measured by one beam group for measuring an X displacement, one beam group for measuring a Y displacement, and one beam for measuring a Z displacement.

The intervals between the X beam groups UX1, UX2, UX3, and UX4 and those between the remaining X interferometer beam groups DX1, DX2, DX3, and DX4 are set shorter than the effective lengths of the X displacement measurement mirrors M3 and M4. The interval between the Y beam groups LY1 and LY2 and that between the remaining Y beam groups RY1 and RY2 are set shorter than the effective lengths of the Y displacement measurement mirrors M1 and M2.

The operation of the measurement system shown in FIGS. 3A to 3C will be explained. FIGS. 5A and 5B show a state immediately before swap (position replacement) of the stages A and B. The center of the stage A is positioned at the center of the measurement optical axis MA, and that of the stage B is positioned at the center of the exposure optical axis EA. As for the six-axis positions of the stage A, Y (Y position), ωz (rotation around the Z-axis), and ωx (rotation around the X-axis) are measured by the beam group LY1, X (X position) and ωz (rotation around the Z-axis) are measured by the beam group UX1, and Z (Z direction) is measured by the beam UZ1.

The beam group DX1 and beam DZ1 are also emitted in the X direction, and can also provide position information of the stage A. In this example, however, the stage A is moved in the −X direction in swap operation, and the stage B is moved in the +X direction. The position of the stage A is measured on the basis of a value obtained using beams/beam groups on the upper side (−X direction) in FIG. 5A. The position of the stage B is measured on the basis of a value obtained using beams/beam groups on the lower side (+X direction) in FIG. 5A.

Similarly, as for the six-axis position of the stage B, Y, ωz, and ωx are measured by the beam group RY2, X and ωz are measured by the beam group DX4, and Z is measured by the beam DZ3.

Then, the stage A is driven in the −X direction, and the stage B is driven in the +X direction, changing to the state shown in FIGS. 6A and 6B. In this state, the stage A is irradiated with the beam groups LY1 and RY1 from two directions, and the stage B is irradiated with the beam groups LY2 and RY2 from two directions. At this time, the beam group to be used is so switched as to measure Y, ωz, and ωx of the stage A by using the beam group RY1. For Y, ωz, and ωx of the stage B, the beam group to be used for measurement is switched from the beam group RY2 to LY2.

In the state of FIGS. 5A and 5B, the stage A is irradiated with only the beam group LY1 in the Y direction because the beam group RY2 is cut off by the stage B. Similarly, the stage B is irradiated with only the beam group RY2 in the Y direction because the beam group LY1 is cut off by the stage A. That is, of beam groups in the Y direction, only the beam group LY1 irradiates a stage positioned in the −Y direction, and only the beam group RY2 irradiates a stage positioned in the +Y direction. After the end of a swap, the positions of the stages A and B are swapped with each other. The stage A is arranged on the +Y side, and the stage B is arranged on the −Y side. In this state, the stage A is irradiated with the beam group RY2, and the stage B is irradiated with the beam group LY1.

Hence, the beam group for measuring Y, ωx, and ωz must be switched from LY1 to RY2 for the stage A. When a swap is performed again, the beam group for measuring Y, ωx, and ωz must be switched from RY2 to LY2 during a swap.

The beam group for measuring Y, ωx, and ωz must be switched from RY2 to LY2 for the stage B in the state shown in FIGS. 6A and 6B.

In order to implement this switching, Y beams must be emitted from the two sides of each of the stages A and B in switching (i.e., both a beam group before switching and a beam group after switching irradiate the stage). If this is not implemented, a swap cannot be completed without interrupting measurement by interferometers.

The beam groups RY1 and LY2 are used to prevent interruption of measurement during a swap.

Figure 7B:
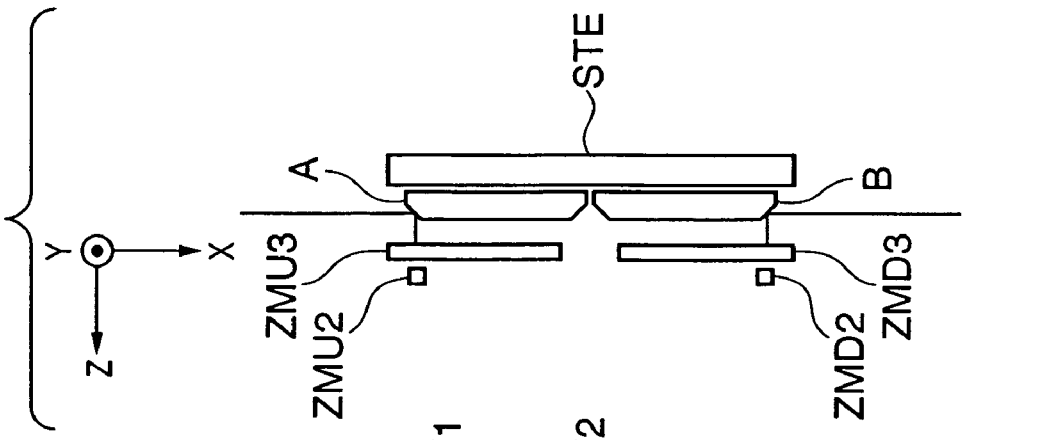
FIGS. 7A and 7B are views for explaining the operation of the measurement system according to the first embodiment.
Figure 7A:
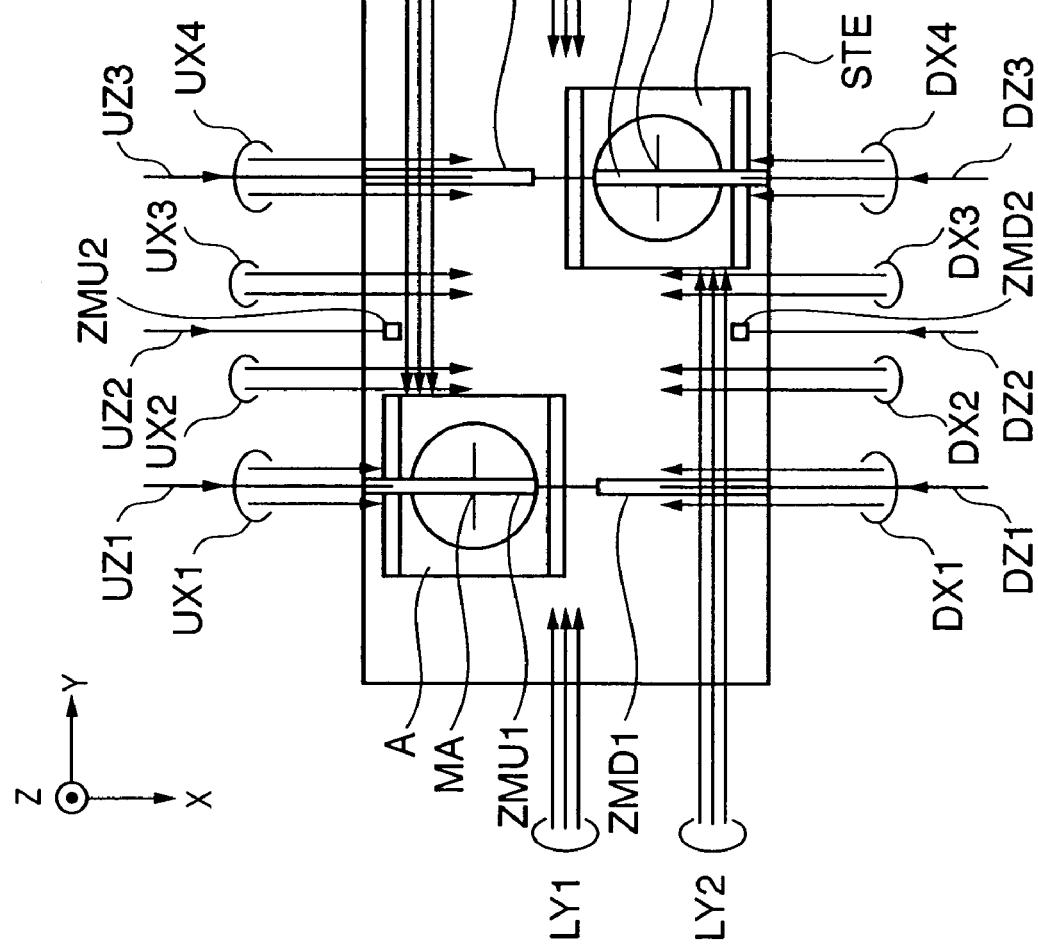

Further, the stage A is driven in the −X direction, and the stage B is driven in the +X direction, changing to the state shown in FIGS. 7A and 7B. In this state, the X position of the 45° mirror M6 of the stage A coincides with that of the Z stationary mirror ZMU2, and the X position of the 45° mirror M3 of the stage B coincides with that of the Z stationary mirror ZMD2. By way of this state, the Z measurement interferometer beam can be switched from UZ1 to UZ2 for the stage A and from DZ3 to DZ2 for the stage B.

The beam UZ2 is a relay beam for further shifting to measurement of the Z position with the beam UZ3. The beam DZ2 is a relay beam for further shifting to measurement of the Z position with the beam DZ1. The use of the beams UZ2 and DZ2 contributes to suppression of the Y sizes of the stages A and B (mirrors M5 and M6).

An arrangement which directly switches from the beam UZ1 to the beam UZ3 and an arrangement which directly switches from the beam DZ3 to the beam DZ1 must increase the Y sizes of the stages A and B. However, in order to independently execute exposure and alignment measurement on the stages A and B, the stages A and B must be prevented from interfering with each other when they come closest to each other. For example, let the position shown in FIGS. 5A and 5B be the center of the Y stroke in alignment measurement and exposure operation for the stages A and B. The stage A may move by at least ½ of the Y stroke in the +Y direction, and the stage B may move by at least ½ of the Y stroke in the −Y direction. In order to prevent the stages A and B from colliding against each other even in this situation, the interval between the beams UZ1 and UZ3 and that between the beams DZ1 and DZ3 must be designed to be equal to or larger than {(the Y width of the stage A)/2+(the stroke of the stage A)/2+(the Y width of the stage B)/2+(the stroke of the stage B)/2+margin}. In order to enable independent operations of the stages A and B, the interval between the beams UZ1 and UZ3 and that between the beams DZ1 and DZ3 must be larger than the Y widths of the stages A and B. For this reason, the relay beams UZ2 and DZ2 are desirably set, as described above. The interval between the beams UZ1 and UZ2, that between the beams UZ2 and UZ3, that between the beams DZ1 and DZ2, and that between the beams DZ2 and DZ3 are smaller than the Y width of the mirror.

For the stage A, the Z beam is switched from UZ1→UZ2→UZ3, and the X beam group is switched from UX1→UX2→UX3→UX4. For the stage B, the Z beam is switched from DZ3→DZ2→DZ1, and the X beam group is switched from DX4→DX3→DX2→DX1. The state is changed from FIGS. 8A and 8B→FIGS. 9A and 9B→FIGS. 10A and 10B→FIGS. 11A and 11B→FIGS. 12A and 12B, completing one swap.

The stage A is irradiated with the Y beam group LY1 from the left in the drawings before a swap, and with the Y beam group RY2 from the right in the drawings after a swap. The stage B is irradiated with the Y beam group RY2 from the right in the drawings before a swap, and with the Y beam group LY1 from the left in the drawings after a swap. In other words, the irradiation direction of the beam for Y (swap direction) measurement is switched during a swap.

FIGS. 10A and 10B show a state in which the Y positions of the stages A and B coincide with each other during a swap. In this state, to prevent interruption of irradiation of the stages A and B with X measurement interferometer beams, X interferometer beams must be emitted by both interferometers in the +X and −X directions at the position at which the Y positions of the stages A and B coincide with each other. That is, even when one stage interrupts an interferometer beam to the other stage, the other stage must be irradiated with another beam.

This also applies to Y measurement interferometer beams, but the X positions of the stages A and B typically substantially coincide with each other at the central positions of alignment measurement and exposure in the Y direction. For this reason, an arrangement in which interferometer beams are emitted by both interferometers in the +Y and −Y directions can be adopted without considering a swap.

The present invention employs the exposure optical system, the substrate processing system which performs a predetermined process for the substrate at a position apart from the exposure optical system, and the substrate stage which moves along the X-Y plane. While the substrate stage moves between below the exposure optical system and below the substrate processing system, an interferometer which measures the Z position of the substrate stage is (successively) switched to measure the position. This eliminates the need for abutment and detection of a reference mark under the respective systems, and exposure or a predetermined process can be rapidly performed after movement.

As the measurement means for measuring a Z position, an encoder or the like may be arranged on the stage instead of the interferometer. When the encoder is arranged on the stage, the encoder measures the Z position of the stage with respect to a surface plate which guides and supports the stage, due to the characteristics of the measurement means. However, the surface plate deforms by the weight of the stage, and this influence becomes more serial when the stage moves. It is not preferable in terms of the precision to measure the stage position with respect to the surface plate. In the first embodiment, the measurement means has an interferometer, and measures the Z position of the substrate stage by reflecting in the Z direction a beam emitted by the interferometer by a mirror arranged on the substrate stage. A position with respect to a reference free from the influence of deformation of the surface plate can be measured.

In the use of the interferometer, stationary mirrors may be arranged in the entire movable regions of the stage in the X and Y directions. However, as the reflection area is larger, the stationary mirror is more constrained by the precision of processing a reflecting surface, increasing causes of errors. In terms of the cost, the stationary mirror is preferably designed to be as cost efficient as possible. In the first embodiment, mirrors are arranged along the X direction, stationary mirrors are arranged along the Y direction, and constraints on the profile irregularity of the mirrors can be reduced. Particularly in a system in which two substrate stages are swapped between below the exposure optical system and below the measurement optical system, an X position when the two substrate stages pass each other is determined by the design, and a transfer stationary mirror suffices to be arranged above the X position.

An arrangement example has been described in which the six-axis positions of the stage are continuously measured without interrupting measurement by the interferometer. Basically, the arrangement for measurement in the Z direction and the arrangements for measurements in the X direction, Y direction, $\omega x$, $\omega y$, and $\omega z$ can be independently designed. In the following description, the arrangement for measurement in the Z direction and the arrangements for measurements in the X direction, Y direction, $\omega x$, $\omega y$, and ωz will be separately explained. Note that an arrangement for measurement in the Z direction and arrangements for measurements in the X direction, Y direction, ωx, ωy, and ωz can be arbitrarily combined.

Modification to First Embodiment

Figure 13:
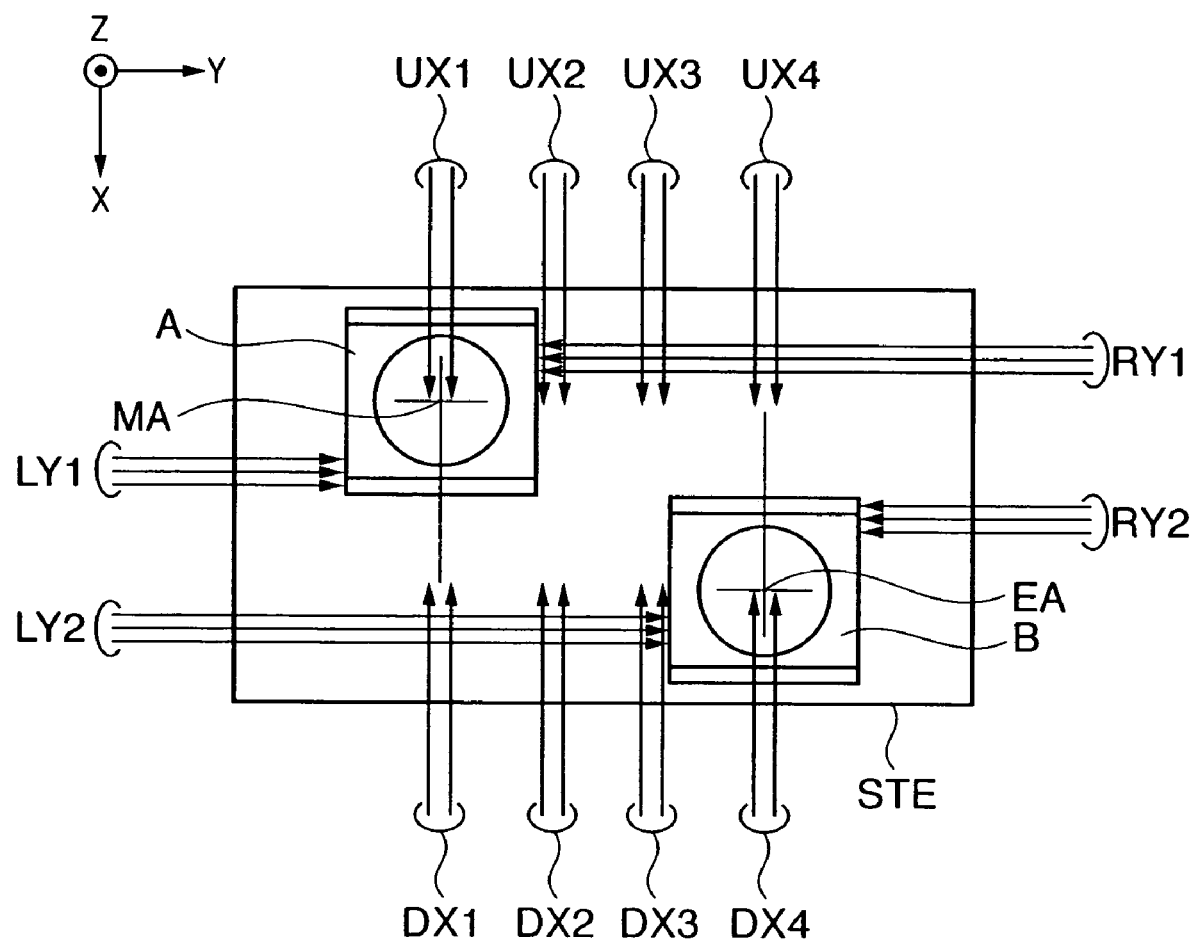
FIG. 13 is a view showing a modification to the first embodiment.
Figure 14:
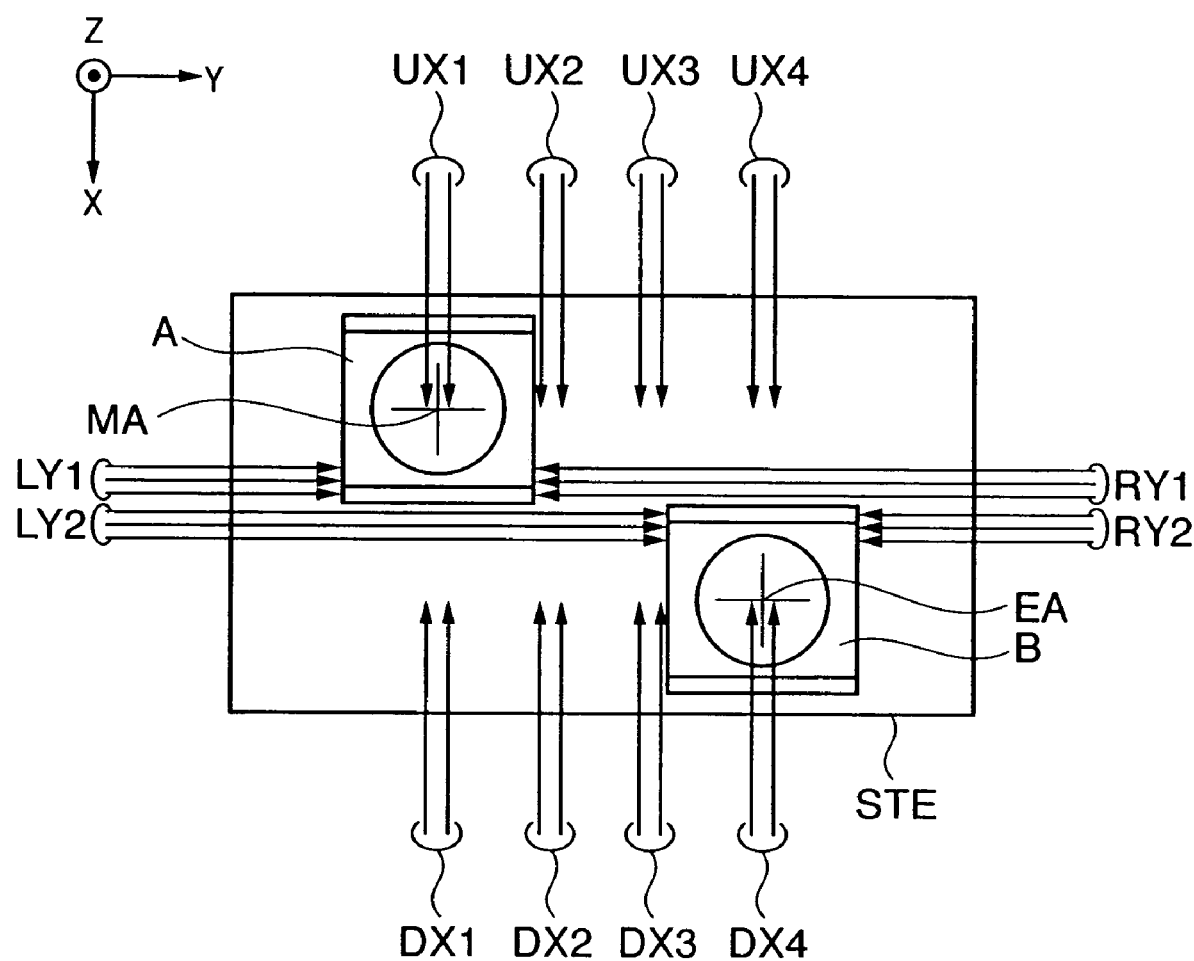
FIG. 14 is a view showing another modification to the first embodiment.

FIGS. 13 and 14 are views showing modifications to measurement in the Y direction, ωx, and ωy. In these modifications, similar to the above-described embodiment, both the stages A and B have X positions at which they are irradiated with Y measurement interferometer beams from two directions.

In the arrangement example shown in FIGS. 3A to 3C, the interferometer beam groups LY1 and RY2 are arranged along substantially the same axis, and the interferometer beam groups LY2 and RY1 offset from this axis in opposite directions. In a modification shown in FIG. 13, an offset is set in the X direction between the interferometer beam groups LY1 and RY2. Also, in this modification, both the stages A and B have X positions at which they are irradiated with Y measurement interferometer beams from two directions. In another modification shown in FIG. 14, the X positions of the interferometer beam groups LY1 and RY1 are the same, and the X positions of the interferometer beam groups LY2 and RY2 are the same. Also, in this modification, both the stages A and B have X positions at which they are irradiated with Y measurement interferometer beams from two directions.

Also, in a modification in which the interferometer beam group LY2 or RY1 is removed from the arrangement example shown in FIGS. 3A to 3C to reduce interferometer beam groups to three, both the stages A and B have X positions at which they are irradiated with Y measurement interferometer beams from two directions.

Figure 15:
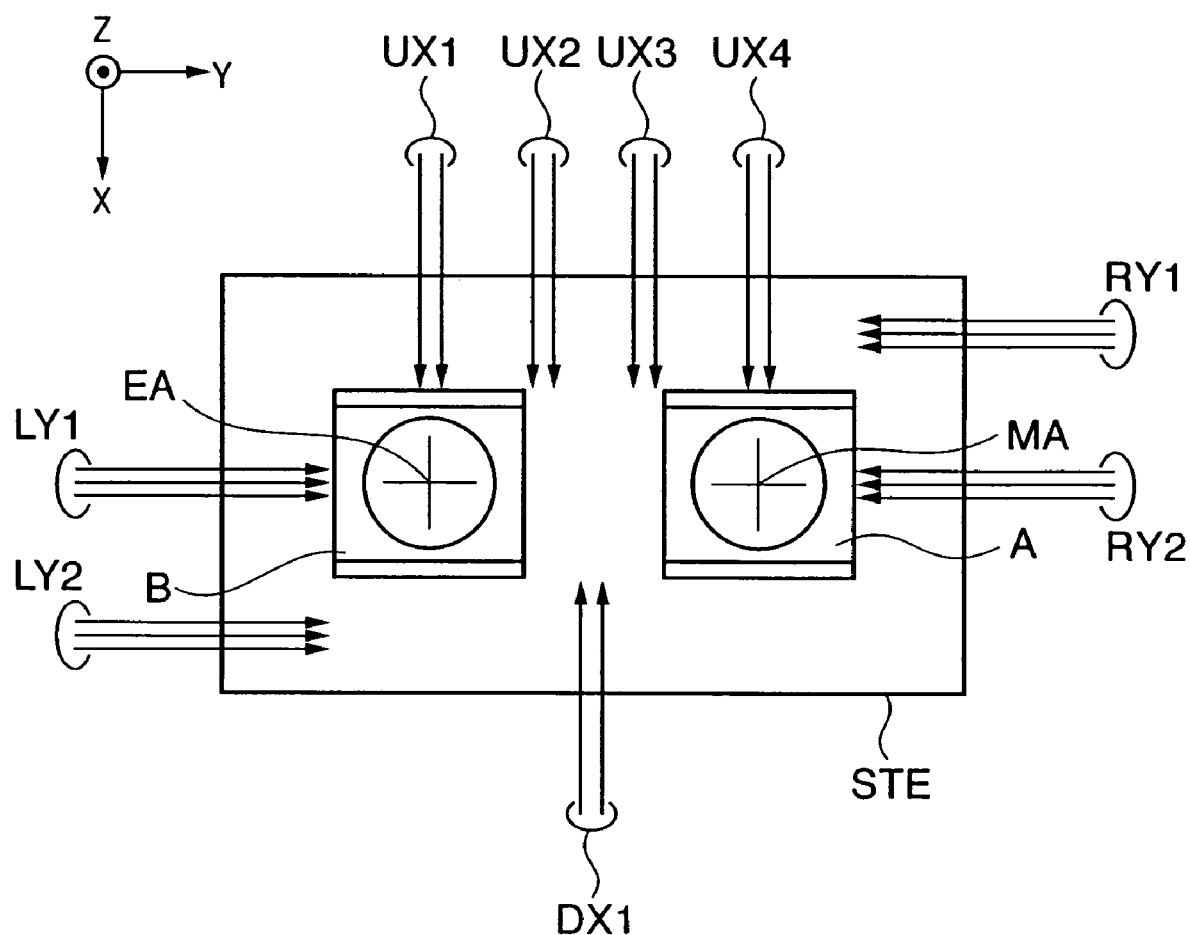
FIG. 15 is a view showing still another modification to the first embodiment.
Figure 16:
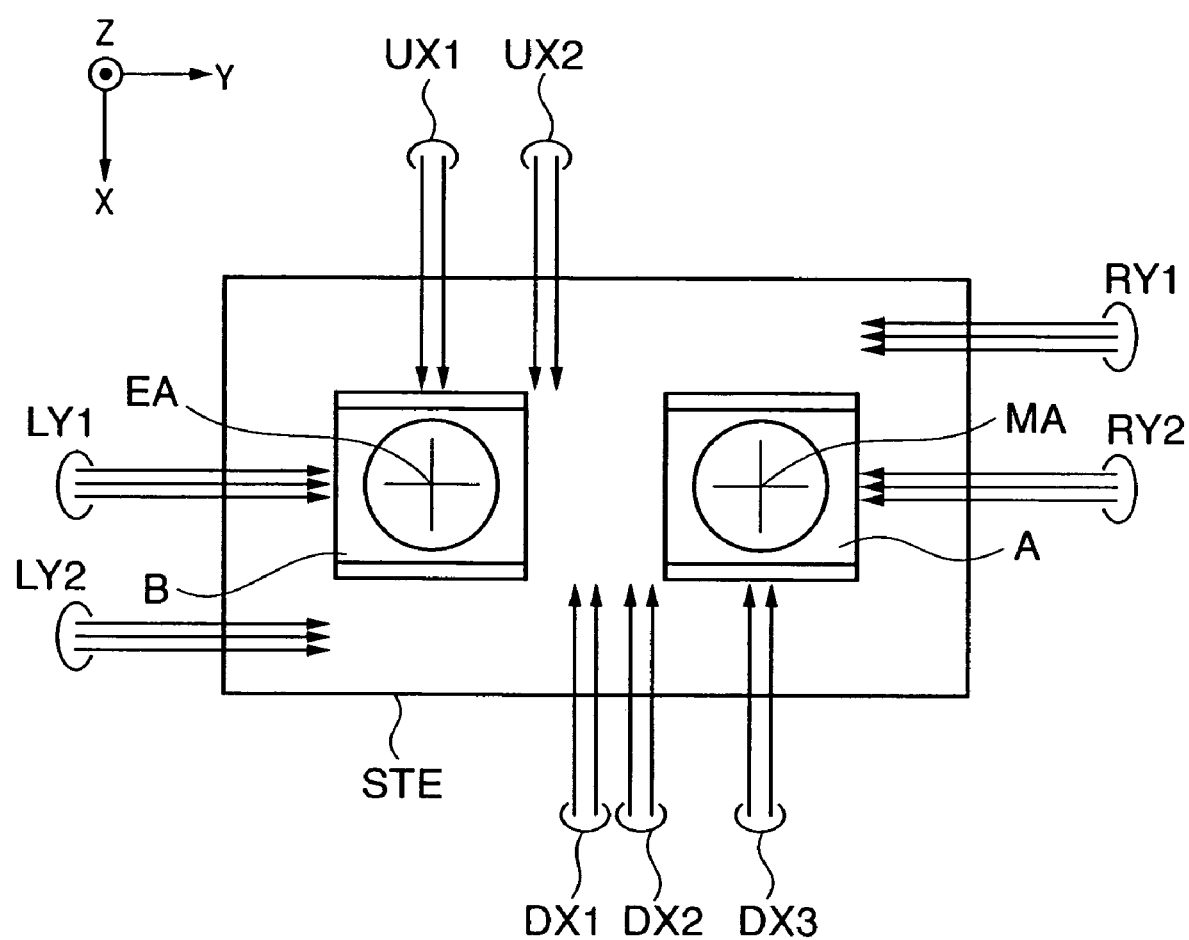
FIG. 16 is a view showing still another modification to the first embodiment.

FIGS. 15 and 16 are views showing modifications to measurement in the X direction and ωy. In either modification, X measurement interferometer beams are emitted from the +X and −X directions at a position at which the Y positions of the stages A and B coincide with each other. Swap can be performed while interferometers are switched.

Second Embodiment

FIGS. 17A to 17C are views schematically showing the arrangement of a measurement system according to the second embodiment of the present invention. FIG. 17A is a plan view, FIG. 17B is a front view, and FIG. 17C is a side view. The second embodiment of the present invention is the same as the first embodiment except for the Z measurement method.

In the first embodiment, the Z measurement mirrors of the stages A and B are the mirrors M5 and M6 which form 45° with respect to the horizontal plane, and Z measurement mirrors fixed to the measurement surface plate are the mirrors ZMU1, ZMU3, ZMD1, and ZMD3 parallel to the X-Y plane. In the second embodiment, the Z measurement mirrors of stages A and B are plane mirrors M7 and M8 parallel to the X-Y plane, and Z measurement mirrors fixed to the measurement surface plate are triangular mirrors ZMU11, ZMU12, ZMD11, and ZMD12 which form 45° with respect to the horizontal plane. Relay mirrors Z1 and Z2 are also triangular mirrors having an angle of 45° with respect to the horizontal plane.

The Z measurement mirrors M7 and M8 of the stages A and B extend in the Y direction, and the stationary Z measurement mirrors ZMU11, ZMU12, ZMD11, and ZMD12 extend in the X direction.

The Z position of the stage A is measured as follows. Moving Z beams MZ1 and MZ2 which are emitted by moving interferometers UI1 and DI1 in the +Y direction are deflected at 90° by the triangular mirrors ZMU11 and ZMD11, and travel vertically downward. The moving Z beams MZ1 and MZ2 are reflected by the plane mirrors M7 and M8 of the stage A, enter the triangular mirrors ZMU11 and ZMD11 again, and are deflected at 90°. The moving Z beams MZ1 and MZ2 return to the moving interferometers UI1 and DI1, and interfere with reference light to measure the Z displacement of the stage A.

In the state shown in FIGS. 17A to 17C, the Z position of the stage A is measured by both the moving Z beams MZ1 and MZ2. In general exposure and alignment measurement except swap, ωy can be measured at high precision by using both the beams MZ1 and MZ2, and the region in which Z measurement is possible upon moving the stage in the X direction can be widened by switching them.

This also applies to the Z displacement of the stage B. Moving Z beams MZ3 and MZ4 which are emitted by moving interferometers UI2 and DI2 in the −Y direction are deflected at 90° by the triangular mirrors ZMU12 and ZMD12, and travel vertically downward. The moving Z beams MZ3 and MZ4 deflected vertically downward are reflected by the plane mirrors M7 and M8 of the stage B, enter the triangular mirrors ZMU12 and ZMD12 again, and are deflected at 90°. The moving Z beams MZ3 and MZ4 return to the moving interferometers UI2 and DI2, and interfere with reference light to measure the Z displacement of the stage B.

The moving interferometers UI1, DI1, UI2, and DI2 are mounted on an interferometer stage (not shown), and moved by a control means (not shown) following the stage A or B in synchronism with movement of the stage A or B in the X direction. The plane mirrors M7 and M8 attached to each of the stages A and B extend in the Y direction, but do not extend in the X direction. Hence, when the stages A and B move in the X direction, the mirrors M7 and M8 cannot reflect any beam. To avoid this, the interferometer stage moves in the X direction in synchronism with movement of the stages A and B in the X direction to move the moving interferometers UI1, DI1, UI2, and DI2 in the X direction.

The relay mirrors Z1 and Z2 are arranged at, e.g., almost the intermediate positions between mirrors ZMU1 and ZMD1 and between mirrors ZMU2 and ZMD2. In exposure and alignment measurement except swap, no mirror exists vertically below the relay mirrors Z1 and Z2. Beams incident on the relay mirrors Z1 and Z2 are deflected downward to enter a stator STE, and do not return to the relay mirrors Z1 and Z2.

Z measurement using the relay triangular mirrors Z1 and Z2 is performed only when the X positions of the stages A and B do not change during swap. Interferometer beams entering the relay triangular mirrors Z1 and Z2 need not move and are stationary. The relay triangular mirrors Z1 and Z2 need not extend in the X direction, and suffice to have a size enough to reflect interferometer beams FZ1 and FZ2 having a constant path.

The operation of the measurement system shown in FIGS. 17A to 17C will be explained. In order to swap the stages A and B, the stage A is driven in the −X direction, and the stage B is driven in the +X direction from the state shown in FIGS. 17A to 17C to the state shown in FIGS. 18A to 18C. At this time, the moving interferometers UI1 and UI2 which emit the moving Z beams MZ1 and MZ3 are driven in the X direction in synchronism with the stage A so that the X positions of the moving interferometers UI1 and UI2 substantially coincide with the X position of the mirror M7 of the stage A. The moving interferometers DI1 and DI2 which emit the moving Z beams MZ2 and MZ4 are driven in the X direction in synchronism with the stage B so that the X positions of the moving interferometers DI1 and DI2 substantially coincide with the X position of the mirror M8 of the stage B. In FIGS. 18A to 18C, the X position of the other mirror M8 of the stage A and that of the stationary Z beam FZ1 substantially coincide with each other, and the X position of the other plane mirror M7 of the stage B and that of the stationary Z beam FZ2 substantially coincide with each other.

Figure 21A:
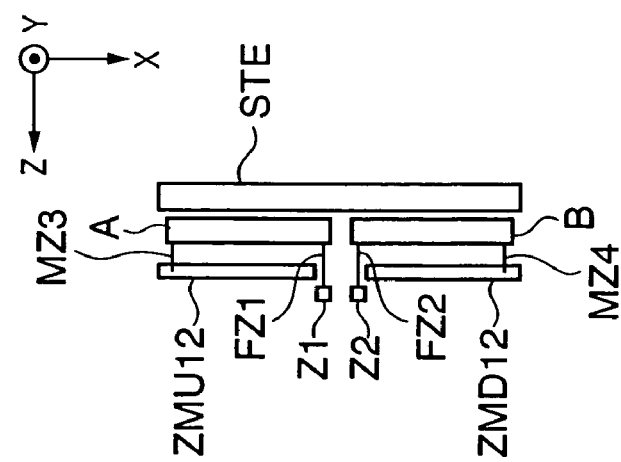
FIGS. 21A to 21C are views for explaining the operation of the measurement system according to the second embodiment.
Figure 21B:
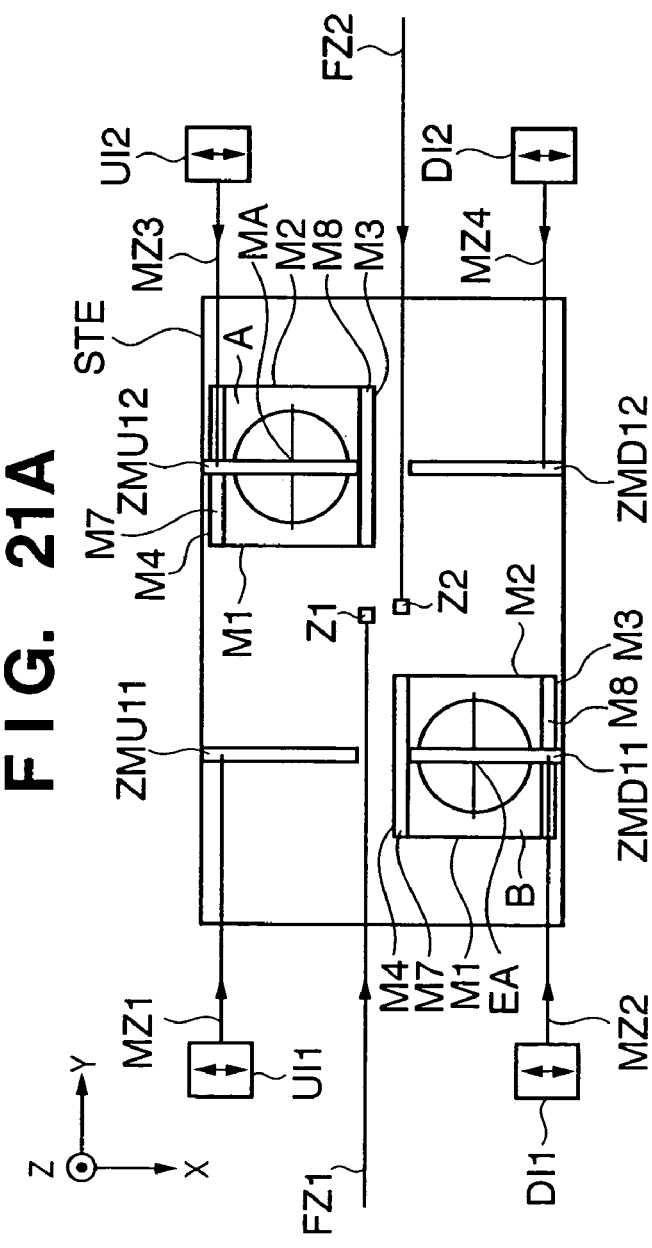
Figure 21C:
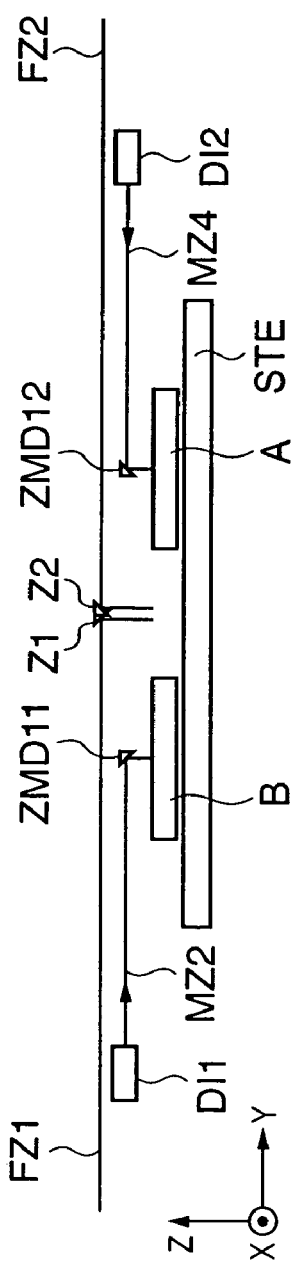

The following operation is the same between the stages A and B, and the stage A will be representatively explained. In the state shown in FIGS. 18A to 18C, the Z position of the stage A is measured by the moving Z beam MZ1. The stage A moves in the Y direction from this state to the state shown in FIGS. 19A to 19C. In this state, the Z position of the stage A can be measured by both the moving Z beam MZ1 and stationary Z beam FZ1. After that, the beam is so switched as to measure the Z position by the stationary Z beam FZ1. The stage A further moves in the +Y direction and reaches the state shown in FIGS. 20A to 20C. In this state, the Z position of the stage A can be measured by both the stationary Z beam FZ1 and moving Z beam MZ3. Then, the beam is so switched as to measure the Z position by the moving Z beam MZ3. The stage A further moves in the +Y direction and reaches the state shown in FIGS. 21A to 21C.

The stage B moves in the −Y direction opposite to the direction of the stage A. That is, while the stage B moves from FIGS. 18A, 18B, and 18C→FIGS. 19A, 19B, and 19C→FIGS. 20A, 20B, and 20C, the Z measurement beam is switched from the moving Z beam MZ4→the stationary Z beam FZ2→the moving Z beam MZ2, changing to the state shown in FIGS. 21A to 21C.

The stages A and B respectively move in the +X and −X directions from this state, and their X positions return to the center. Also, at this time, the moving interferometers UI1 and UI2, which emit the moving Z beams MZ1 and MZ3 move in the +X direction in synchronism with movement of the stage A. The moving interferometers DI1 and DI2, which emit the moving Z beams MZ2 and MZ4 move in the −X direction in synchronism with movement of the stage B, changing to the state shown in FIGS. 22A to 22C.

To execute exposure and alignment measurement in this state, the moving Z beams MZ1 and MZ2 move in the X direction in synchronism with movement of the stage B in the X direction, and the moving Z beams MZ3 and MZ4, move in the X direction in synchronism with movement of the stage A in the X direction. In exposure and alignment measurement, the stationary Z beams FZ1 and FZ2 do not act. In the above manner, the stages A and B can be swapped without interrupting position measurement by the interferometers.

The interferometer beam is switched twice along with movement of the stages A and B as shown in FIGS. 18A, 18B, and 18C→FIGS. 19A, 19B, and 19C→FIGS. 20A, 20B, and 20C. In this case, the stationary Z beam FZ1 (FZ2) is arranged as a relay beam because a general stroke design cannot directly switch beams irradiating the mirrors ZMU11 and ZMU12 (ZMD11 and ZMD12) extending in the X direction.

Also, in the second embodiment, a beam for switching a Z measurement beam must be arranged at an intermediate position when the Z measurement stationary mirror is arranged so as to extend in the X direction and the Z measurement movable mirror is set so as to extend in the Y direction.

Since the stage need not be abutted against the reference position in the Z direction upon moving below the exposure optical system, an exposure process can quickly start. Also, when a focus reference mark M2 is detected using a detection optical system without abutment, the stage can be adjusted within the detection range while moving below the exposure optical system.

In the second embodiment, the moving interferometer emits an interferometer beam, but may be an interferometer beam guide means such as a triangular mirror mounted on a moving member as far as the means can irradiate plane mirrors attached to the stages A and B with interferometer beams. In this case, measurement light guided by the interferometer beam guide means is deflected at 90° by stationary mirrors, and irradiates plane mirrors M9 and M10 of the stages A and B vertically below the mirrors, measuring the Z positions of the stages A and B.

Third Embodiment

Figure 23B:
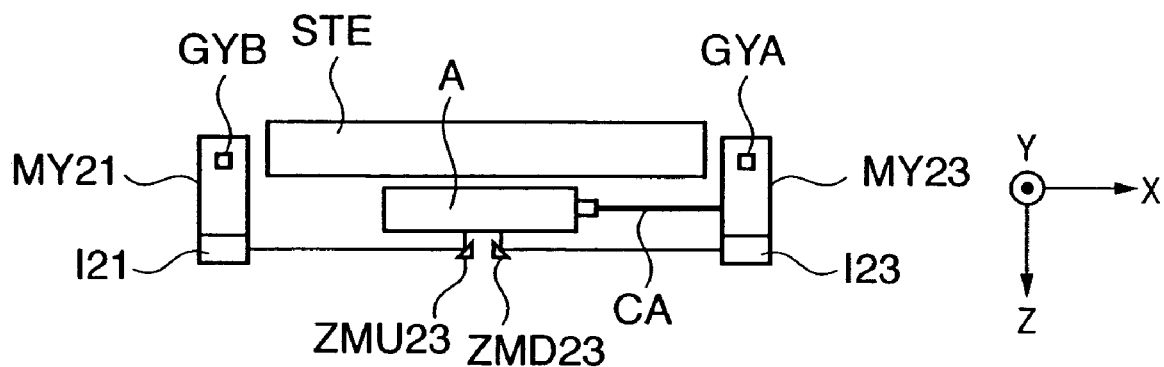
FIGS. 23A and 23B are views showing an arrangement according to the third embodiment of the present invention.
Figure 23A:
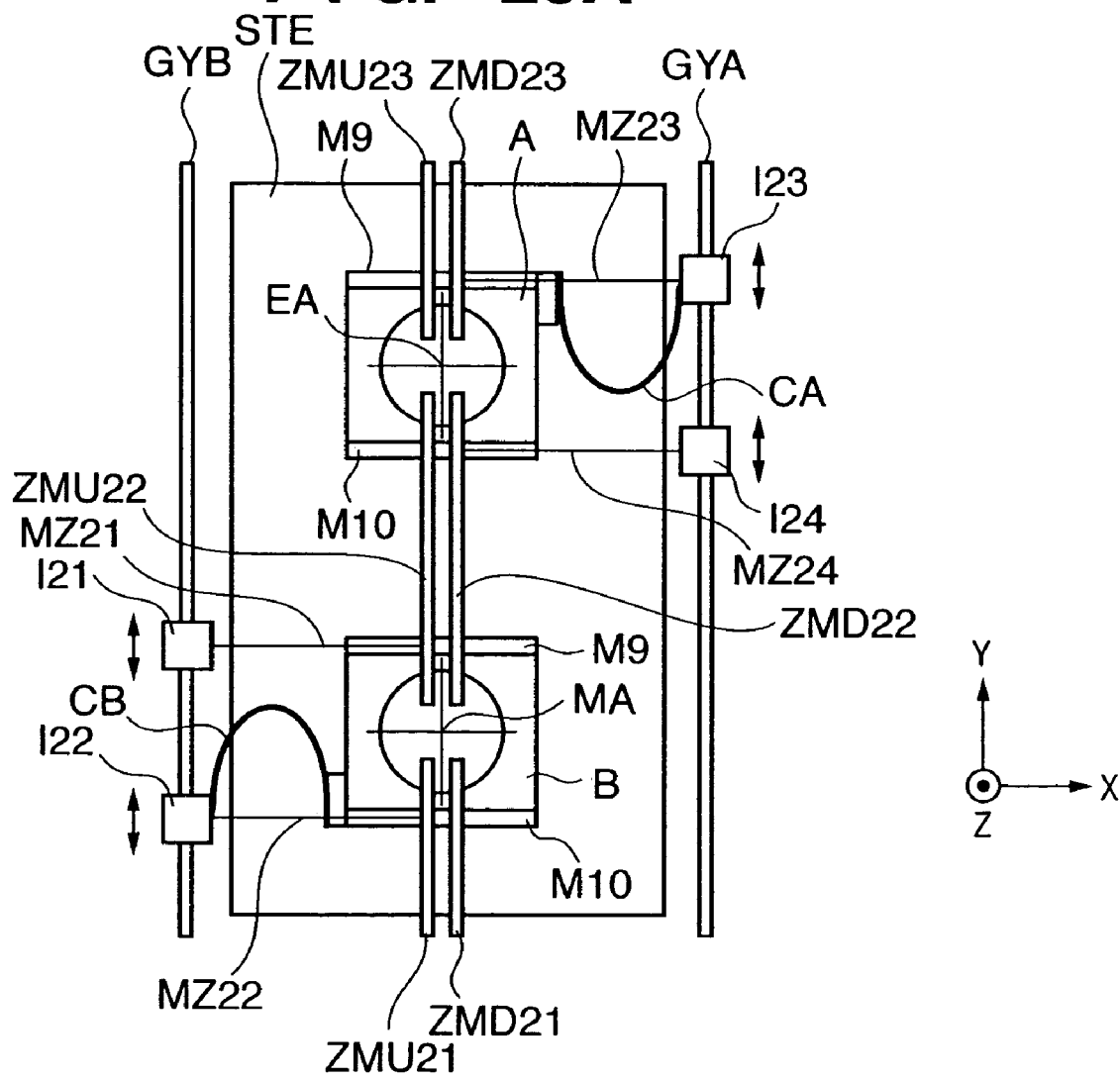

FIGS. 23A and 23B are views schematically showing the arrangement of a measurement system according to the third embodiment of the present invention. FIG. 23A is a plan view, and FIG. 23B is a side view. The third embodiment is the same as the second embodiment in that moving interferometers are adopted, but is different in an arrangement in which cables externally connected to the stage are laid out. The Z measurement stationary mirror extends in the X direction in the second embodiment, but in the Y direction in the third embodiment.

In FIGS. 23A and 23B, cables are mounted on a stage which supports a Z measurement interferometer. The cables include cables, and the like, for supplying signals and power to stages A and B, air pressure pipes, and the like, for pressure air of gas bearings used for the stages A and B and vacuum for applying a preload, and coolant pipes, and the like, for adjusting the stage temperature. If stress is applied to the cables upon moving the stages A and B, the stress acts as disturbance on the stages A and B, and the cables may be broken and cut off.

Z position measurement stationary mirrors ZMU21 to ZMU23 and ZMD21 to ZMD23 are triangular mirrors which form 45° with respect to the horizontal plane. Z position measurement mirrors M9 and M10 attached to each of the stages A and B are plane mirrors parallel to the X-Y plane, and extend in the X direction. The Z position measurement stationary mirrors ZMU21 to ZMU23 and ZMD21 to ZMD23 extending in the Y direction are laid out in two lines at an offset in the X direction.

As for the stage B, parallel moving Z beams MZ21 and MZ22 emitted by moving interferometers I21 and I22 arranged in the −X direction irradiate the Z position measurement stationary mirrors ZMU21 to ZMU23. The stationary mirrors ZMU21 to ZMU23 are so arranged as to deflect at 90° the moving Z beams MZ21 and MZ22 emitted by the moving interferometers I21 and I22, irradiate the plane mirrors M9 and M10 of the stage B vertically below the mirrors ZMU21 to ZMU23, and measure the Z position of the stage B.

Similarly, as for the stage A, parallel moving Z beams MZ23 and MZ24 emitted by moving interferometers I23 and I24 arranged in the +X direction irradiate the Z position measurement stationary mirrors ZMD21 to ZMD23. The stationary mirrors ZMD21 to ZMD23 are so arranged as to deflect at 90° the moving Z beams MZ23 and MZ24 emitted by the moving interferometers I23 and I24, irradiate the plane mirrors M9 and M10 of the stage A vertically below the mirrors ZMD21 to ZMD23, and measure the Z position of the stage A.

The plane mirrors M9 and M10 of the stages A and B extend in the X direction, and when the stages A and B move in the Y direction, cannot be irradiated with beams. To avoid this, the moving interferometers I21 and I22 which emit the moving Z beams MZ21 and MZ22 move in the Y direction in synchronism with movement of the stage B in the Y direction, and the moving interferometers I23 and I24 which emit the moving beams MZ23 and MZ24 move in the Y direction in synchronism with movement of the stage A in the Y direction.

The moving interferometer I21 is held on a moving member MY21, and the moving interferometer I22 is held on a moving member MY22. The moving members MY21 and MY22 are independently driven on a common guide GYB. The moving interferometer I23 is held on a moving member MY23, and the moving interferometer I24 is held on a moving member MY24. The moving members MY23 and MY24 are independently driven on a common guide GYA.

As shown in FIG. 23B, a cable CA is formed into a U shape on the X-Y plane, one end of the U-shaped cable CA is connected to the stage A, and the other end is connected to the moving member MY23 which holds the interferometer I23 on the upper surface. Similarly, a cable CB is formed into a U shape on the X-Y plane, one end of the U-shaped cable CB is connected to the stage B, and the other end is connected to the moving member MY22 which holds the interferometer I22 on the upper surface.

Since the cables CA and CB are formed into a U shape, application of a large stress to the cables CA and CB can be prevented by changing the curvature of the U shape upon moving the stages A and B in the X direction.

FIGS. 24A to 24C are views showing the state of the cables CA and CB when the stages A and B move in the X direction. FIG. 24A illustrates a state in which the stage A moves to the end in the +X direction and the stage B moves to the end in the −X direction. FIG. 24B illustrates a state in which both the stages A and B move to the central position in the X direction. FIG. 24C illustrates a state in which the stage A moves to the end in the −X direction and the stage B moves to the end in the +X direction.

The curvatures of the U shapes of the cables CA and CB are small in FIG. 24A, are set larger in FIG. 24B than in FIG. 24A, and much larger in FIG. 24C.

The moving members MY23 and MY22 respectively connected to the cables CA and CB move in the Y direction in synchronism with movement of the stages A and B in the Y direction. This can prevent application of a large stress to the cables CA and CB upon moving the stages A and B.

As described above, the cables CA and CB can follow movement of the stages A and B in the X and Y directions so as not to apply a large stress to the cables CA and CB, reducing disturbance to the stages A and B.

A continuous measurement system for the Z positions of the stages A and B and mounting operation of the stages A and B will be described with reference to FIGS. 25A to 25D. In order to swap the stages A and B from the state of FIG. 25A, the stage B is driven in the −X direction, and the stage A is driven in the +X direction, changing to the state shown in FIG. 25B.

In order to swap the stages A and B, it is necessary that the periphery of the stage B in the +X direction is located in the −X direction with respect to that of the stage A in the −X direction, and that the Z positions of the stages A and B can be measured. For this purpose, the Z position measurement stationary triangular mirrors ZMU21 to ZMU23 and ZMD21 to ZMD23 extending in the Y direction are laid out in two lines at an offset in the X direction. In the use of only one line of Z measurement stationary triangular mirrors, the stages A and B may collide against each other in swapping them while measuring their Z positions.

The stage B then moves in the +Y direction, and the moving interferometers I21 and I22 which emit the moving Z beams MZ21 and MZ22 move in the +Y direction following movement of the stage B. At the same time, the stage A moves in the −Y direction, and the moving interferometers I23 and I24 which emit the moving Z beams MZ23 and MZ24 move in the −Y direction following movement of the stage A, changing to the state shown in FIG. 25C. When the moving interferometer moves in the +Y direction, the moving interferometer I22 is interrupted between the stationary mirrors ZMU21 and ZMU22, and the moving interferometer I21 is interrupted between the stationary mirrors ZMU23 and ZMD23. However, the interferometers I22 and I21 simultaneously measure mirrors on the stage B before interruption. Thus, information measured by interferometers used before switching can be inherited to interferometers used after switching when interferometers to be used are switched by an interferometer switching means (not shown). This also applies to the case in which moving interferometers move in the −Y direction.

Figure 25A:
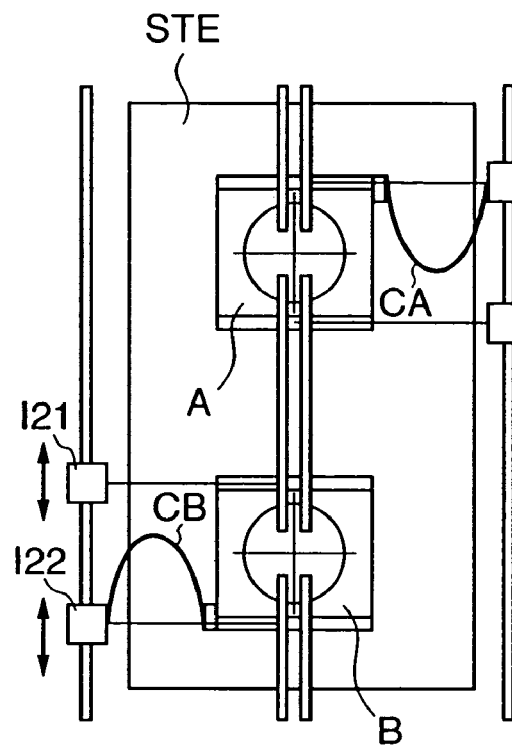
FIGS. 25A to 25D are views for explaining the operation according to the third embodiment.
Figure 25B:
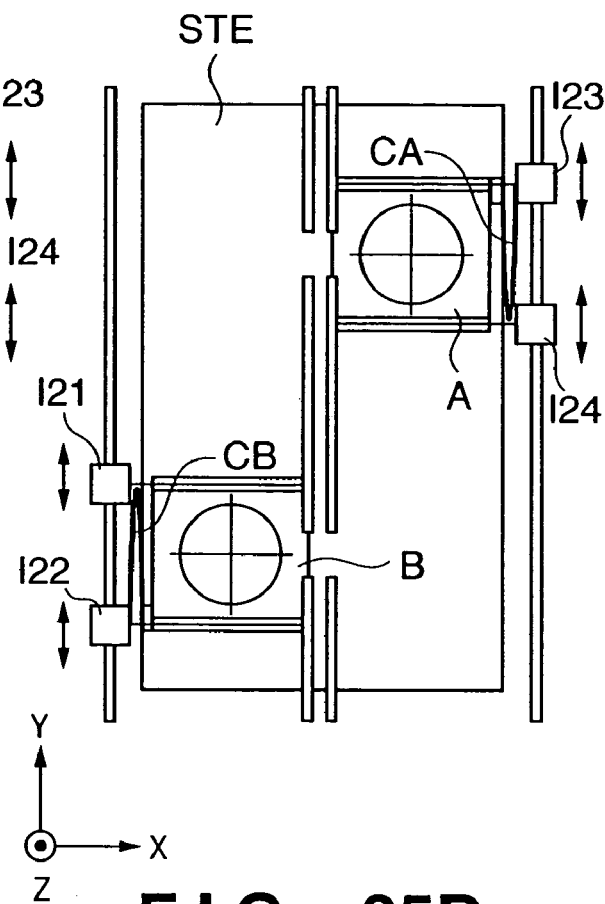
Figure 25C:
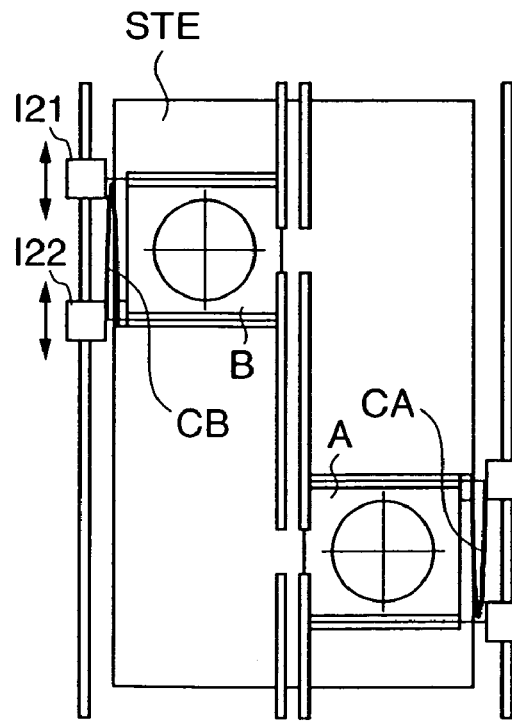
Figure 25D:
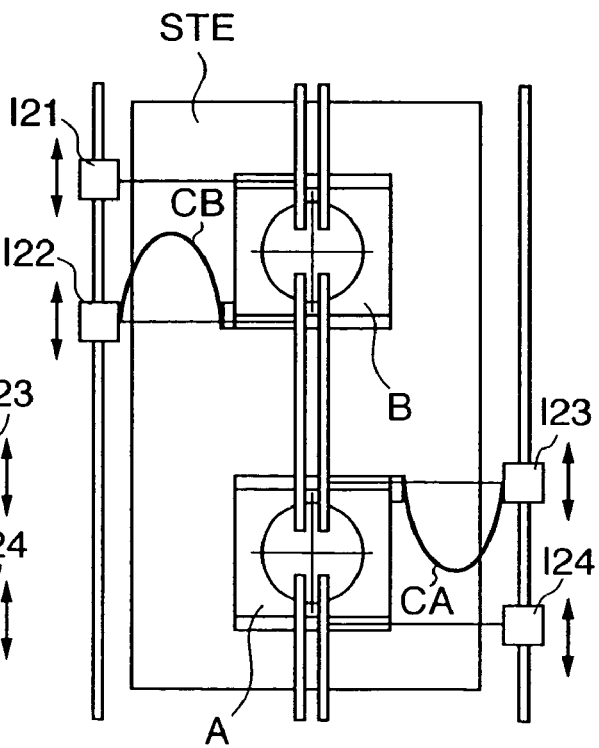

As shown in FIG. 25C, the stage A moves in the −X direction, and the stage B moves in the +X direction, completing a swap.

With the above arrangement, the Z positions of the stages A and B can be continuously measured even in swapping the stages A and B, and cables can be connected to the stages A and B without applying any stress to the cables to the stages A and B. The arrangement in which an interferometer is mounted on a moving stage and the moving stage holds a stage cable is effective for not only a twin stage but also for a single stage.

Modification 1 to Third Embodiment

Figure 26B:
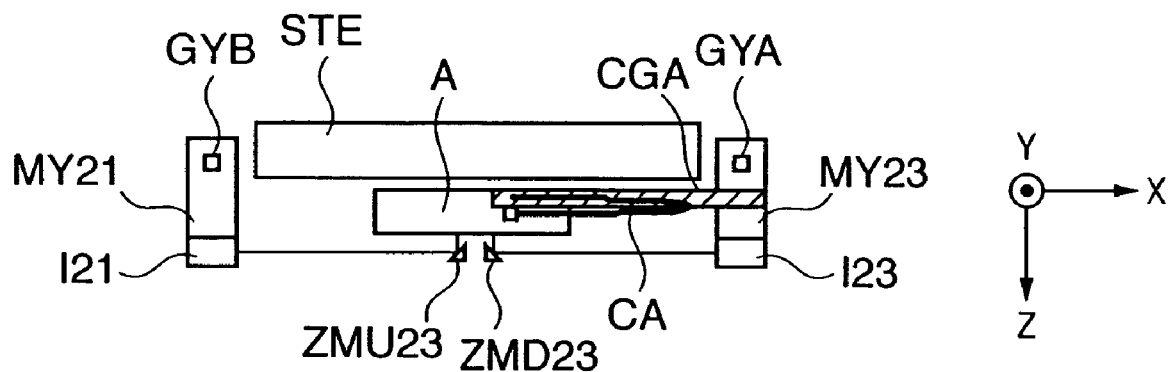
FIGS. 26A and 26B are views showing modification 1 to the third embodiment.
Figure 26A:
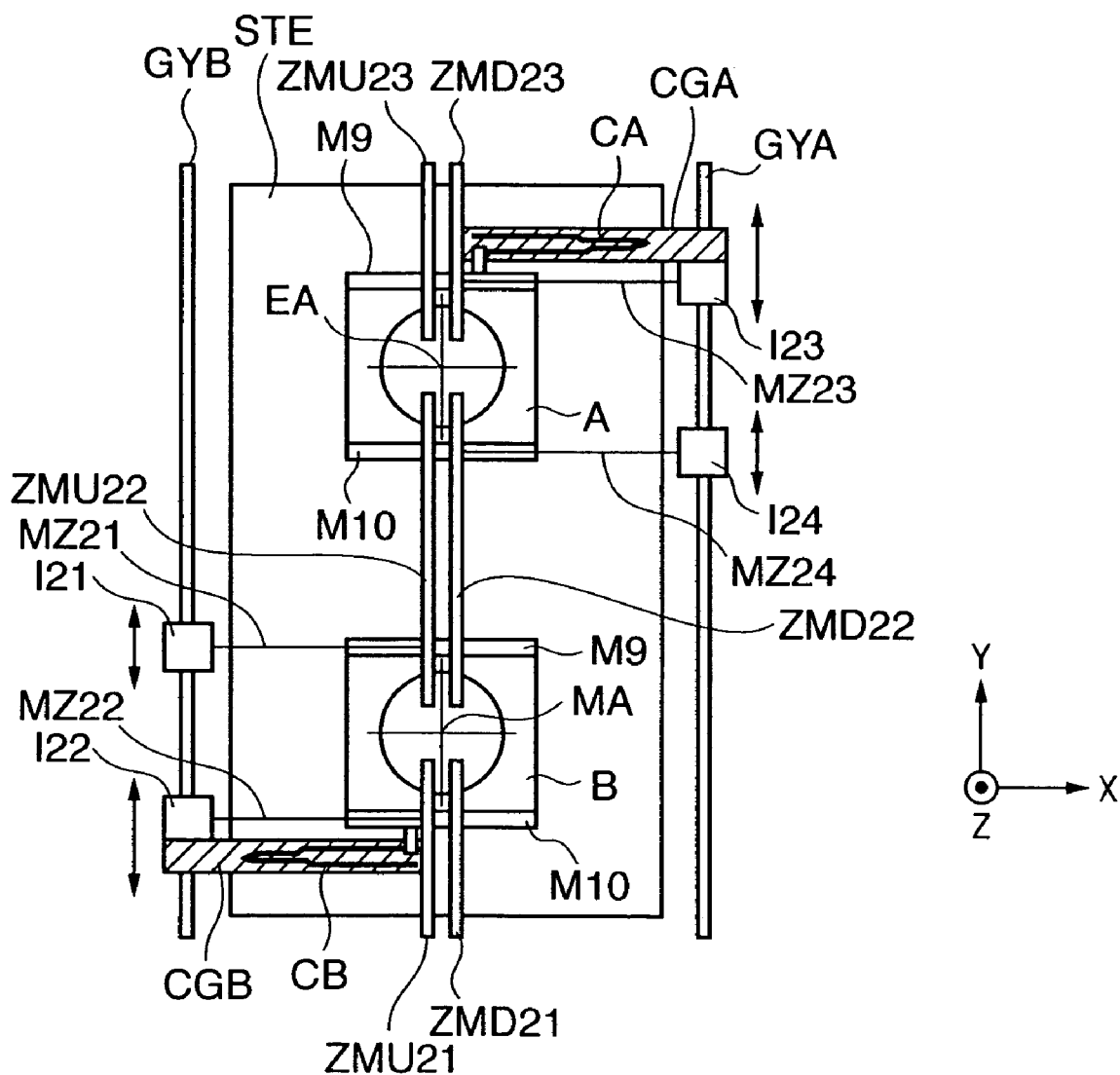

FIGS. 26A and 26B are schematic views showing modification 1 to the third embodiment. FIG. 26A is a plan view, and FIG. 26B is a side view. This modification is different from the third embodiment in the cable, but the remaining portions are the same, and a detailed description thereof will be omitted.

In FIGS. 26A and 26B, a package guide CGA which holds a cable is arranged on the moving member MY23 which holds the moving interferometer I23 on the upper surface. The cable CA is connected from the moving member MY23 to the stage A via the package guide CGA. As shown in FIG. 26, the cable CA is formed into a U shape on the X-Z plane, one end of the U-shaped cable CA is connected to the stage A, and the other end is connected to the package guide CGA.

Also, a package guide CGB which holds a cable is arranged on the moving member MY22 which holds the moving interferometer I22 on the upper surface. The cable CB is connected from the moving member MY22 to the stage B via the package guide CGB. Similar to the cable CA, the cable CB is formed into a U shape on the X-Z plane, one end of the U-shaped cable CB is connected to the stage B, and the other end is connected to the package guide CGB.

Since the cables CA and CB are formed into a U shape on the X-Z plane, application of a large stress to the cables CA and CB can be prevented by moving the U-shaped bent portions along with movement of the stages A and B in the X direction.

FIGS. 27A to 27C are views showing the state of the cables CA and CB when the stages A and B move in the X direction. FIG. 27A illustrates a state in which the stage A moves to the end in the +X direction and the stage B moves to the end in the −X direction. FIG. 27B illustrates a state in which both the stages A and B move to the central position in the X direction. FIG. 27C illustrates a state in which the stage A moves to the end in the −X direction and the stage B moves to the end in the +X direction.

In FIG. 27A, the cable CA moves the U-shaped bent portion in the +X direction, and the cable CB moves the U-shaped bent portion in the −X direction. In FIG. 27B, the cables CA and CB move the U-shaped bent portions to the initial position (state before movement in FIG. 27A). In FIG. 27C, the cable CA moves the U-shaped bent portion in the −X direction, and the cable CB moves the U-shaped bent portion in the +X direction.

In this fashion, when the stages A and B move in the X direction, the cables CA and CB follow the movement by moving the U-shaped bent portions in the X direction. This can prevent application of a large stress to the cables CA and CB upon moving the stages A and B in the X direction.

The moving members MY23 and MY22 having the package guides CGA and CGB and the cables CA and CB move in the Y direction in synchronism with movement of the stages A and B in the Y direction. This can also prevent application of a large stress to the cables CA and CB upon moving the stages A and B in the Y direction.

The periphery of the package guide CGA in the −X direction is located in the +X direction with respect to the center of the stator STE in the X direction, and that of the package guide CGB in the +X direction is located in the −X direction with respect to the center of the stator STE in the X direction. This arrangement can prevent the package guides from contacting each other in swapping the stages A and B.

Modification 2 to Third Embodiment

Figure 28B:
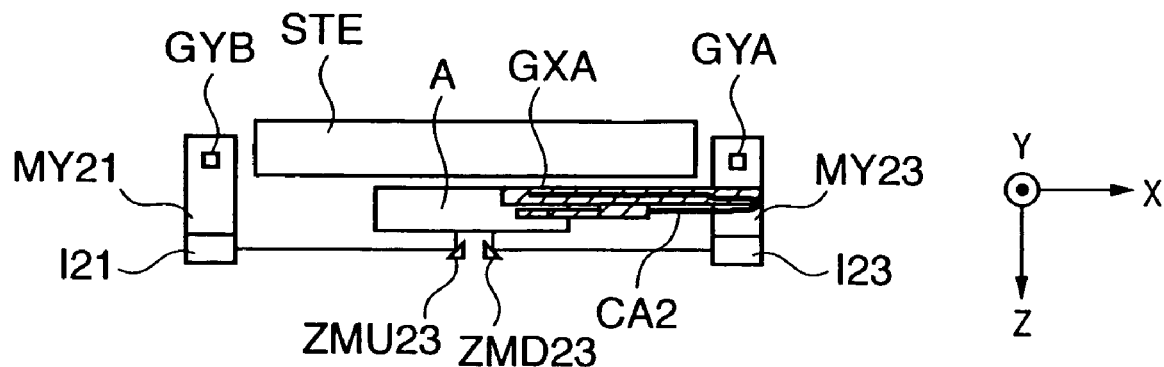
FIGS. 28A and 28B are views showing modification 2 to the third embodiment.
Figure 28A:
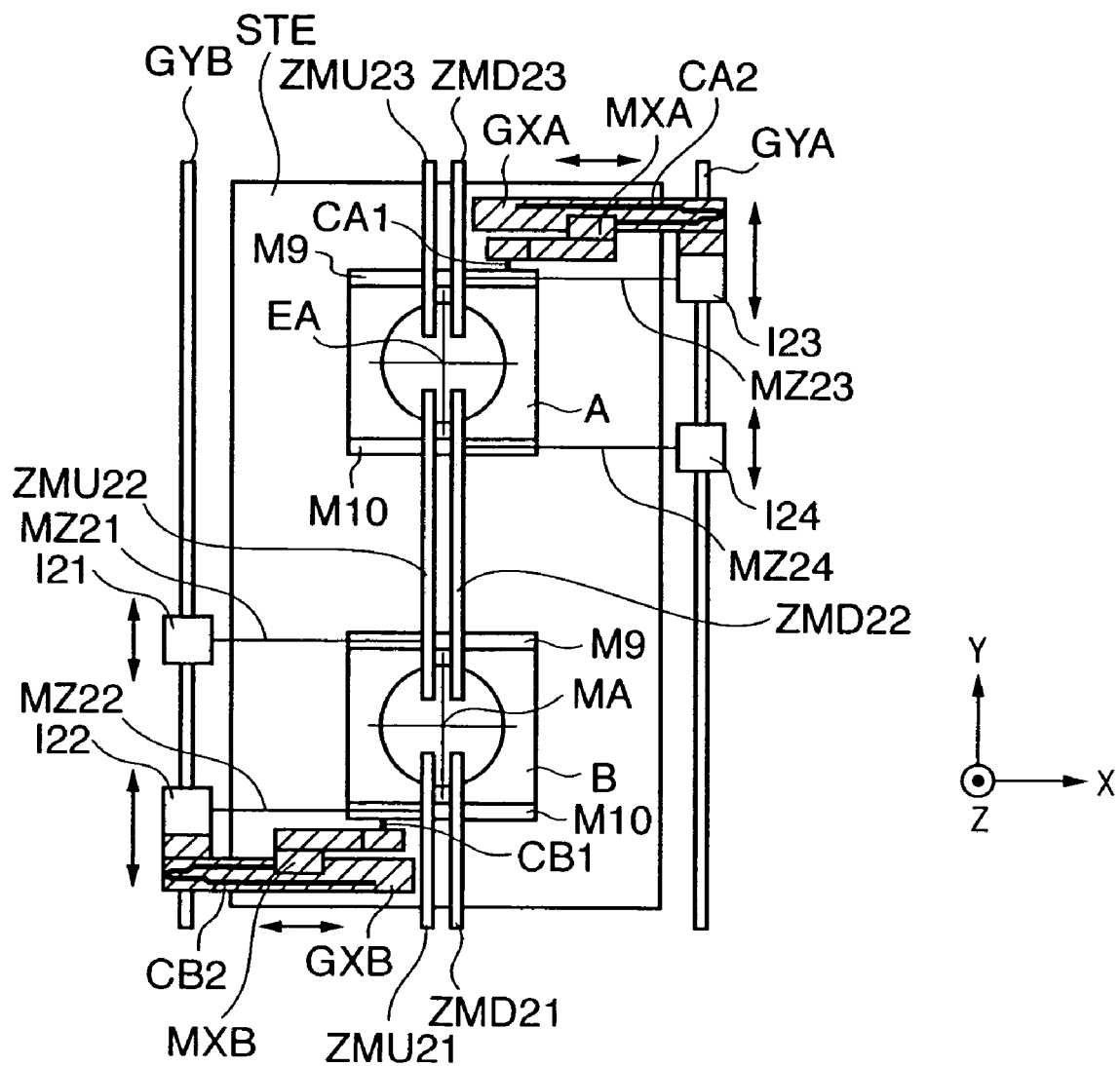

FIGS. 28A and 28B are schematic views showing modification 2 to the third embodiment. FIG. 28A is a plan view, and FIG. 28B is a side view. This modification is different from the third embodiment in the layout of the cable, but the remaining portions are the same, and a detailed description thereof will be omitted.

In modification 2, package stages MXA and MXB which move in the X direction are arranged for the package guides CGA and CGB in modification 1 described above. The package stages MXA and MXB can be driven in the X direction by, e.g., ball screws or linear motors. Since the package guides CGA and CGB are movable in the Y direction, the package stages MXA and MXB can follow the stages A and B in the X and Y directions by controlling driving on the basis of position information of the stages A and B. The cable of the stage A will be described below, and the following description also applies to the stage B.

The cable CA connected to the stage A is temporarily held by the package stage MXA, and externally laid out via the package guide CGA and a moving member XY23. The cable CA can absorb disturbances even upon a change in the relative positions of the stage A and package stage MXA by setting a flexure (CA1) between the stage A and the package stage MXA.

The cable CA is formed into a U shape on the X-Z plane between (CA2) the package stage MXA and the package guide CGA, one end of the cable CA2 is connected to the package stage MXA, and the other end is connected to the package guide CGA. This structure can prevent application of a large stress to the cable CA2 upon moving the package stage MXA in the X direction.

The state in which the package stages MXA and MXB follow movement of the stages A and B will be explained with reference to FIGS. 29A to 29C.

FIG. 29A illustrates a state in which the stage A moves to the end in the +X direction and the stage B moves to the end in the −X direction. FIG. 29B illustrates a state in which the stages A and B move to the central position in the X direction. FIG. 29C illustrates a state in which the stage A moves to the end in the −X direction and the stage B moves to the end in the +X direction.

In FIG. 29A, the stage A moves to the end in the +X direction, and the stage B moves to the end in the −X direction. The package stage MXA moves to the end in the +X direction in synchronism with movement of the stage A, and the package stage MXB moves to the end in the −X direction in synchronism with movement of the stage B so as not to apply a large stress to the cables CA1 and CB1.

The cable CA2 moves the U-shaped bent portion in the +X direction along with movement of the package stage MXA in the X direction. A cable CB2 moves the U-shaped bent portion in the −X direction along with movement of the package stage MXB in the X direction.

In FIG. 29B, the stage A moves to the end in the −X direction, and the stage B moves to the end in the +X direction. The package stage MXA moves to the end in the −X direction in synchronism with movement of the stage A, and the package stage MXB moves to the end in the +X direction in synchronism with movement of the stage B so as not to apply a large stress to the cables CA1 and CB1.

In FIG. 29C, the stage A moves to the end in the −X direction, and the stage B moves to the end in the +X direction. The package stage MXA moves to the end in the −X direction in synchronism with movement of the stage A, and the package stage MXB moves to the end in the +X direction in synchronism with movement of the stage B so as not to apply a large stress to the cables CA1 and CB1.

The cable CA2 moves the U-shaped bent portion in the −X direction along with movement of the package stage MXA in the −X direction. The cable CB2 moves the U-shaped bent portion in the +X direction along with movement of the package stage MXB in the +X direction.

As described above, the moving stage, which supports an interferometer is synchronized with the stage in the Y direction, and the package stage, which moves together with the moving stage, is synchronized with the stage in the X direction. As a result, even if the stage moves two-dimensionally, no large stress is applied to the cable.

Modification 3 to Third Embodiment

Figure 30B:
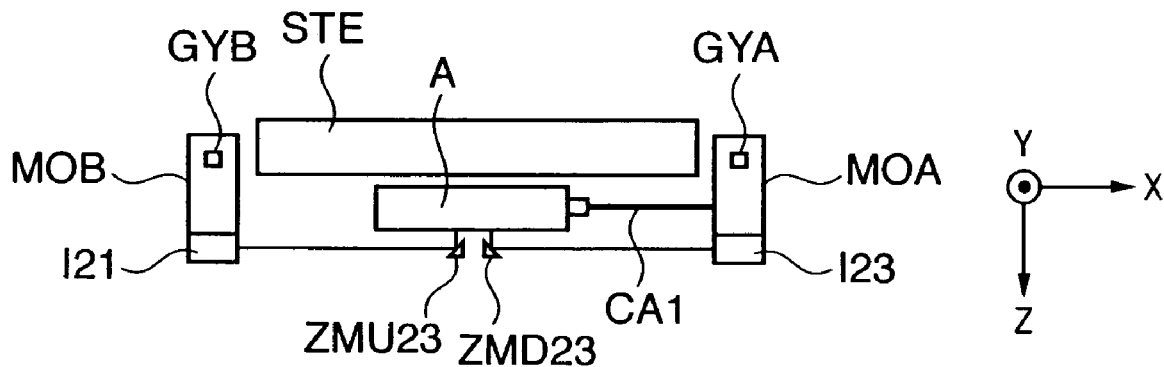
FIGS. 30A and 30B are views showing modification 3 to the third embodiment.
Figure 30A:
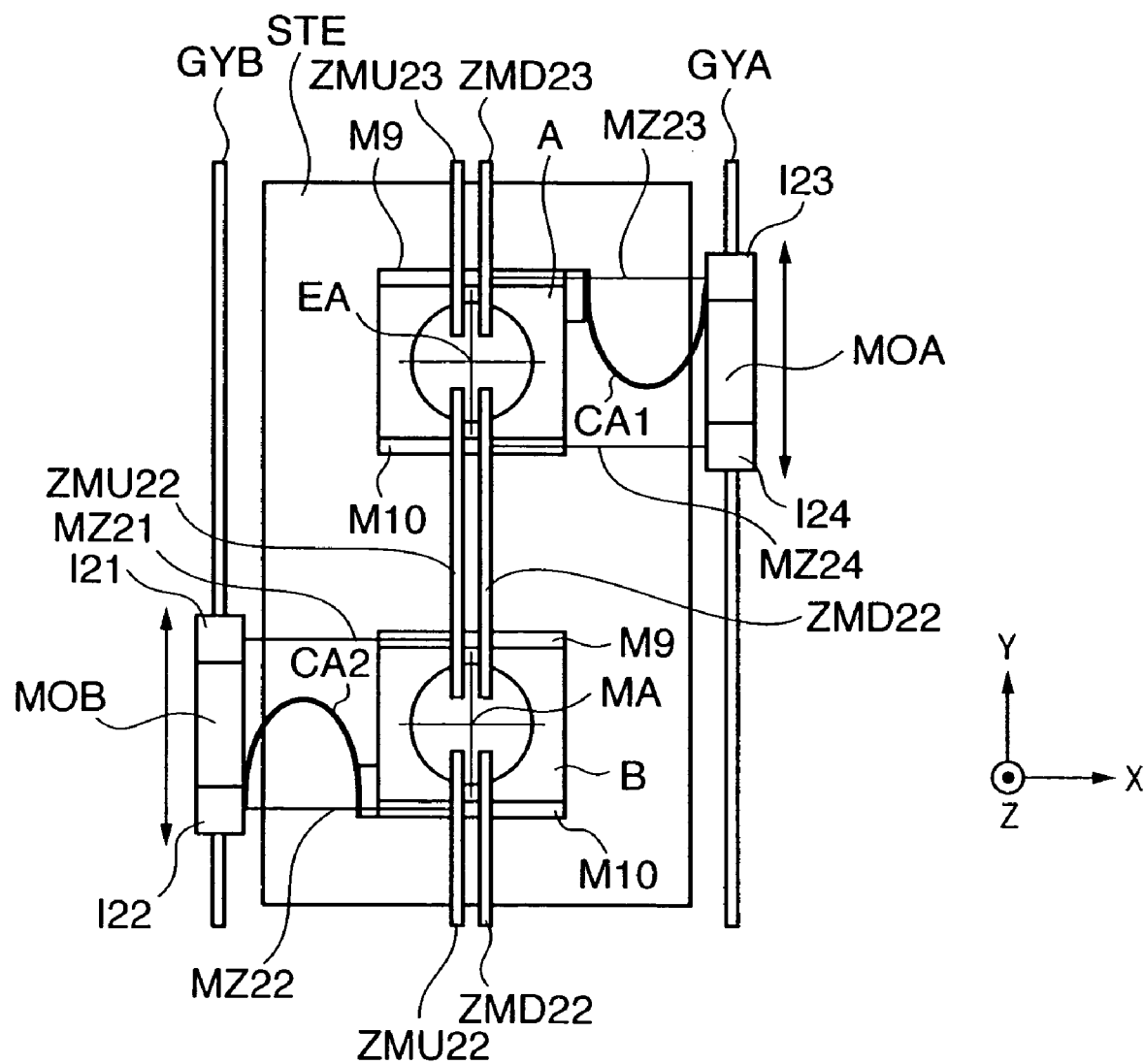

FIGS. 30A and 30B are views schematically showing modification 3 to the third embodiment. FIG. 30A is a plan view, and FIG. 30B is a side view. This modification is different from the third embodiment in the moving member which supports an interferometer, but the remaining portions are the same, and a detailed description thereof will be omitted.

In FIGS. 30A and 30B, both the moving interferometers I23 and I24 are held on a moving member MOA. When the moving member MOA moves on the guide GYA, the moving interferometers I23 and I24 move together. Also, the moving interferometers I21 and I22 are held on a moving member MOB. When the moving member MOB moves on the guide GYB, the moving interferometers I21 and I22 move together.

The moving interferometers I23 and I24 must follow the mirrors M9 and M10 on the stage A in the Y direction. However, the distance between the mirrors M9 and M10 in the Y direction does not change, and even this arrangement can measure the Z position of the stage A.

In the arrangement of modification 3, the number of moving members subjected to follow-up control is decreased, and the influence of an error generated in follow-up control can be reduced.

Modification 4 to Third Embodiment

Figure 31B:
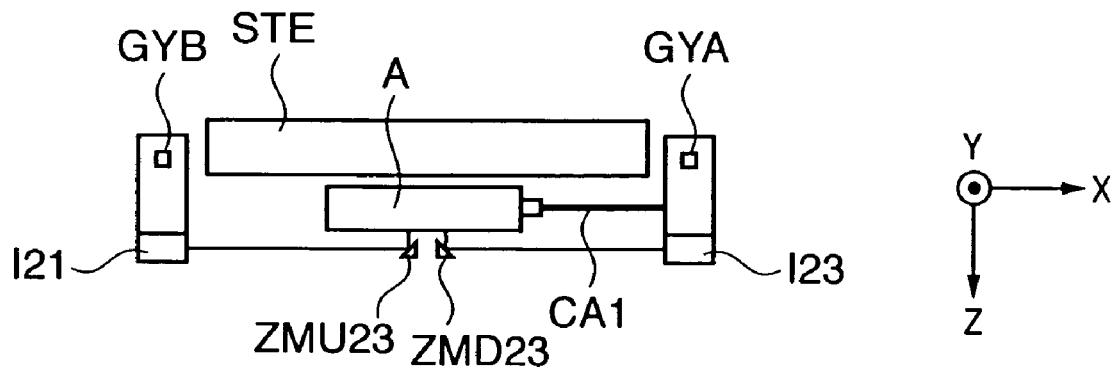
FIGS. 31A and 31B are views showing modification 4 to the third embodiment.
Figure 31A:
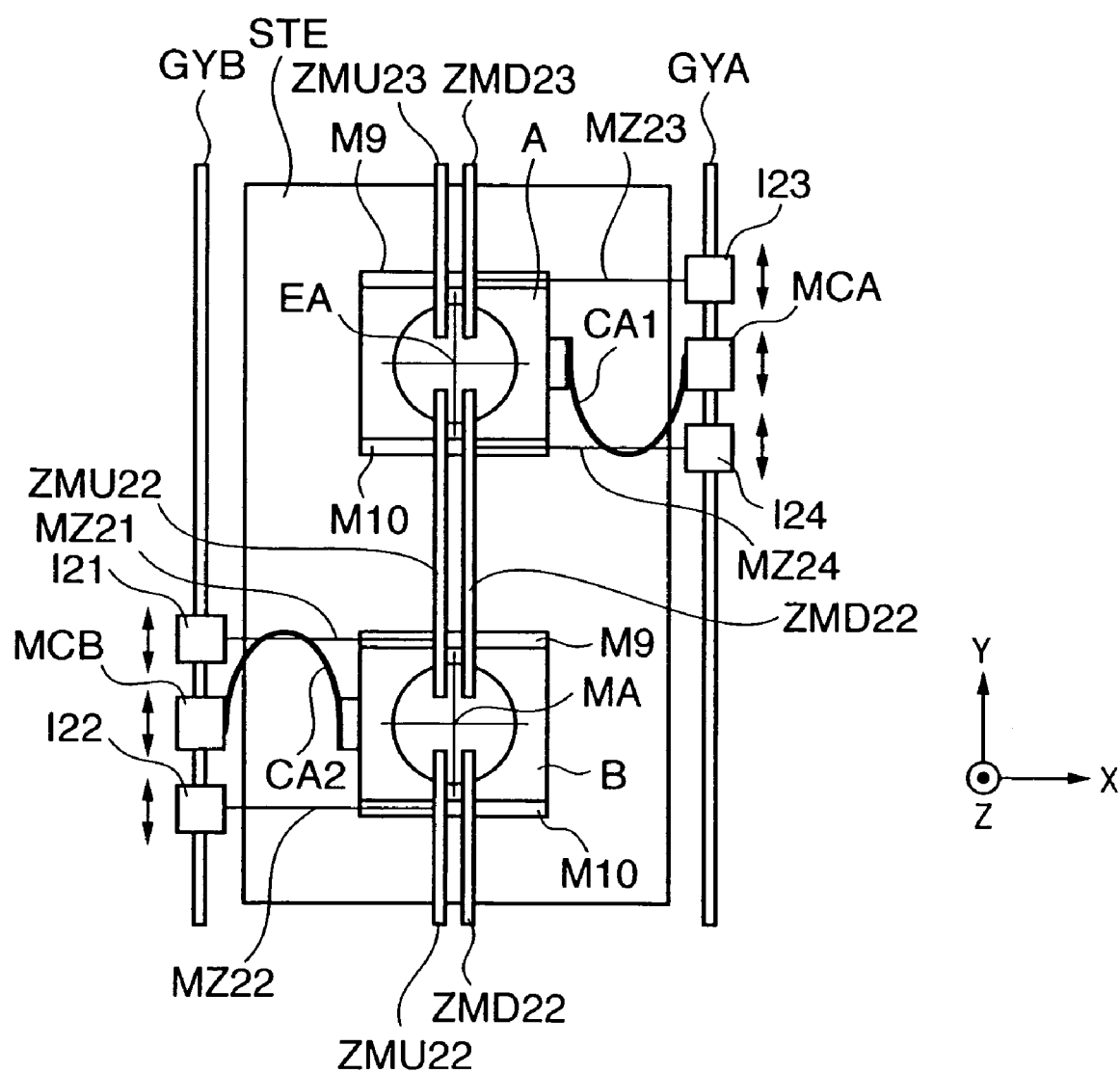

FIGS. 31A and 31B are schematic views showing modification 4 to the third embodiment. FIG. 31A is a plan view, and FIG. 31B is a side view. This modification is different from the third embodiment in the arrangement of the moving member, but the remaining portions are the same, and a detailed description thereof will be omitted.

In the third embodiment, the moving member which supports a moving interferometer holds the cable. In modification 4, a cable moving member which supports the cable and the moving member which supports the moving interferometer only share a guide, and move independently.

In FIGS. 31A and 31B, a package moving member MCA is constituted on the guide GYA in addition to the moving member MY23 which holds the moving interferometer I23 and the moving member MY24 which holds the moving interferometer I24. The moving member MY23, moving member MY24, and package moving member MCA can be independently driven on the guide GYA.

In FIGS. 31A and 31B, a package moving member MCB is constituted on the guide GYB in addition to the moving member MY21 which holds the moving interferometer I21 and the moving member MY22 which holds the moving interferometer I22. The moving member MY21, moving member MY22, and package moving member MCB can be independently driven on the guide GYB.

Modification 5 to Third Embodiment

Figure 32B:
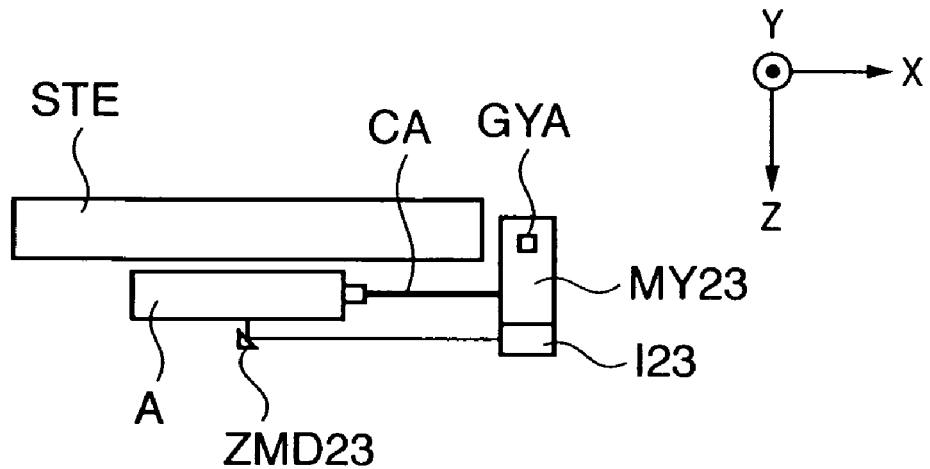
FIGS. 32A and 32B are views showing modification 5 to the third embodiment.
Figure 32A:
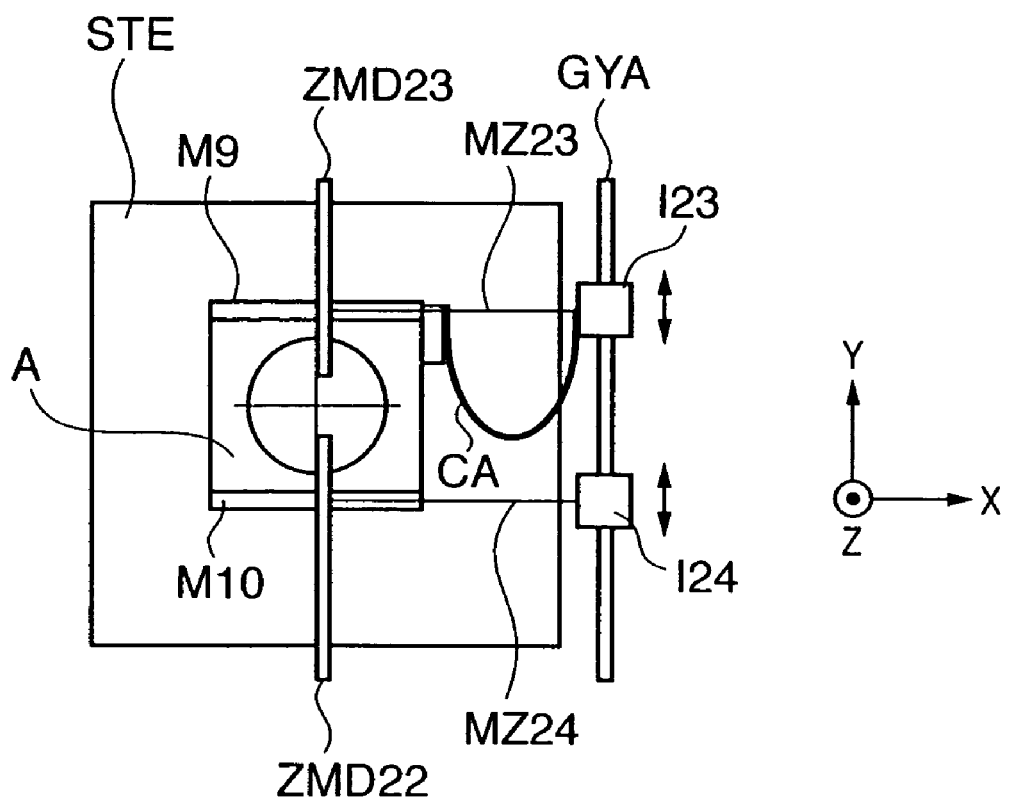

FIGS. 32A and 32B are schematic views showing modification 5 to the third embodiment. FIG. 32A is a plan view, and FIG. 32B is a side view. In modification 5, the arrangement according to the third embodiment is applied to a case in which the number of stages is one.

In FIGS. 32A and 32B, as for the stage A, the parallel moving Z beams MZ23 and MZ24 emitted by the moving interferometers I23 and I24 arranged in the +X direction irradiate the Z position measurement stationary mirrors ZMD23 and ZMD22. The stationary mirrors ZMD21 to ZMD23 are so arranged as to deflect at 90° the moving Z beams MZ23 and MZ24 emitted by the moving interferometers I23 and I24, irradiate the plane mirrors M9 and M10 of the stage A vertically below the mirrors ZMD21 to ZMD23, and measure the Z position of the stage A.

The plane mirrors M9 and M10 of the stage A extend in the X direction, and when the stage A moves in the Y direction, cannot be irradiated with beams. To avoid this, the moving interferometers I23 and I24 which emit the moving beams MZ23 and MZ24 move in the Y direction in synchronism with movement of the stage A in the Y direction. Accordingly, successive Z positions can be measured even if the stage A moves.

In FIGS. 32A and 32B, similar to the third embodiment, the moving member MY23 which supports the moving interferometer I23 holds the cable CA, and the cable CA has a U shape. This arrangement can prevent application of a large stress to the cable CA even upon moving the stage A in the X and Y directions.

Fourth Embodiment

Figure 33A:
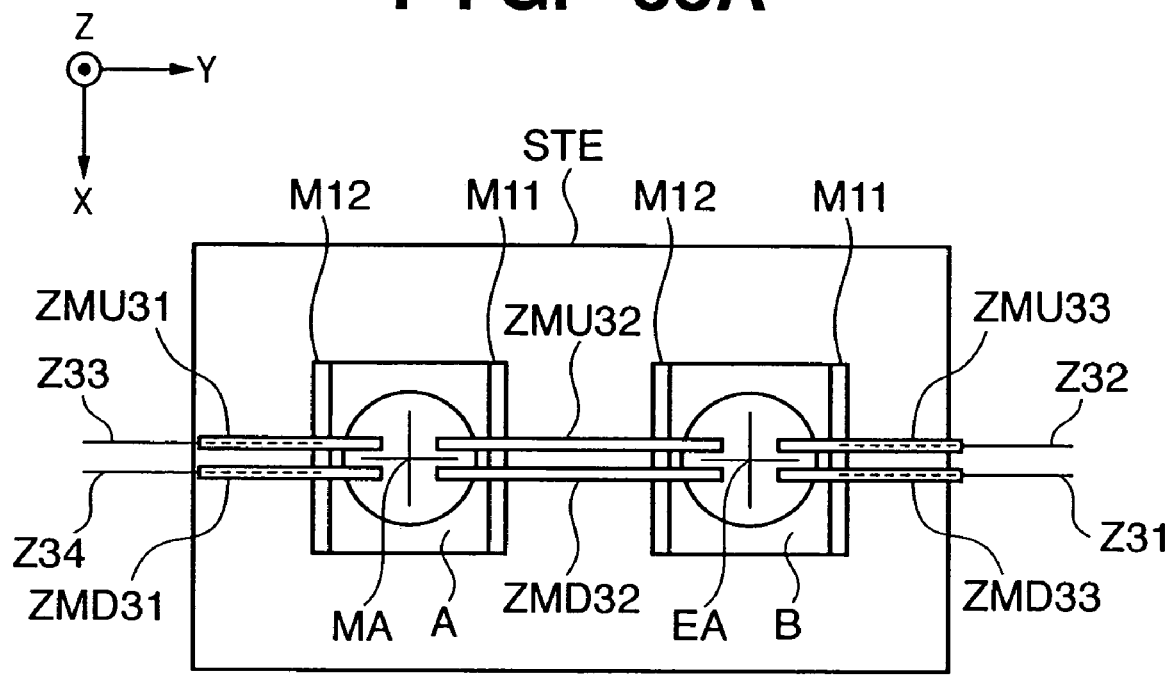
FIGS. 33A and 33B are views showing the arrangement of a measurement system according to the fourth embodiment of the present invention.
Figure 33B:
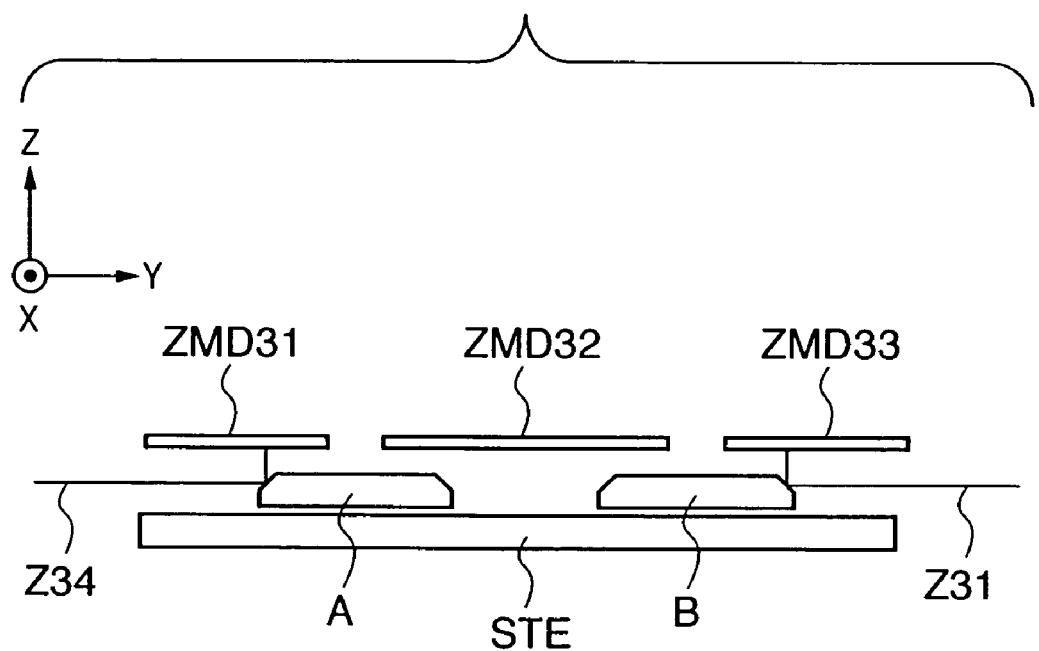

FIGS. 33A and 33B are views schematically showing the arrangement of a measurement system according to the fourth embodiment of the present invention. In the fourth embodiment, Z position measurement stationary mirrors ZMU31 to ZMU33 and ZMD31 to ZMD33 extend in the Y direction, and Z position measurement mirrors M11 and M12 attached to each of stages A and B extend in the X direction. In the fourth embodiment, the Z position measurement stationary mirrors ZMU31 to ZMU33 and ZMD31 to ZMD33 are constituted as plane mirrors parallel to the X-Y plane. The Z position measurement mirrors attached to the stages A and B form 45° with respect to the horizontal plane. With this arrangement, an interferometer which emits a Z position measurement interferometer beam need not be moved, and the position of the interferometer can be fixed.

As for the stage A, Z position measurement interferometer beams Z33 and Z34 are emitted by interferometers arranged in the −Y direction, deflected at 90° by the mirror M12 of the stage A, and irradiate the Z position measurement plane stationary mirrors ZMU31 and ZMD31 vertically above the mirror 12, measuring the Z position of the stage A.

Similarly, as for the stage B, Z position measurement interferometer beams Z31 and Z32 are emitted by interferometers arranged in the +Y direction, deflected at 90° by the mirror M11 of the stage B, and irradiate the Z position measurement plane stationary mirrors ZMU33 and ZMD33 vertically above the mirror 11, measuring the Z position of the stage B.

In this case, the Z position of the stage A is measured by both the Z position measurement interferometer beams Z33 and Z34, and that of the stage B is measured by both the Z position measurement interferometer beams Z31 and Z32.

Figure 34A:
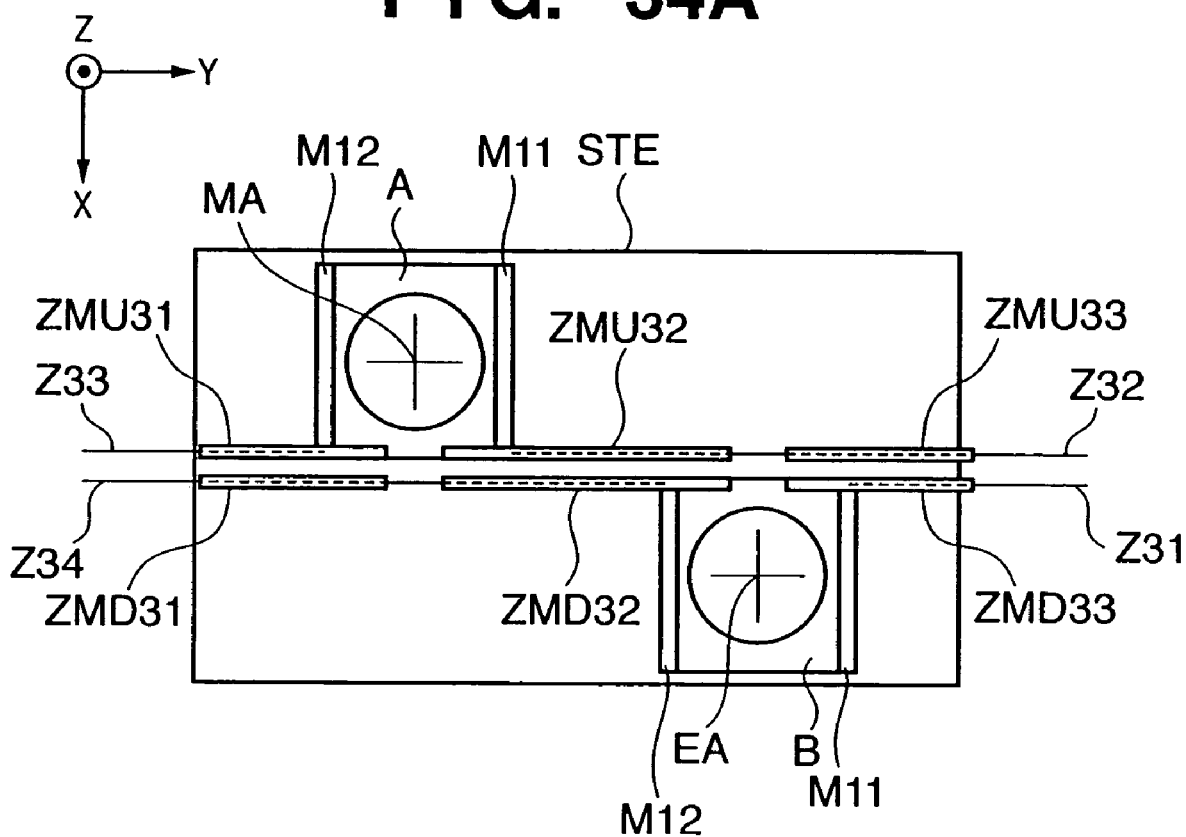
FIGS. 34A and 34B are views for explaining the operation of the measurement system according to the fourth embodiment.
Figure 34B:
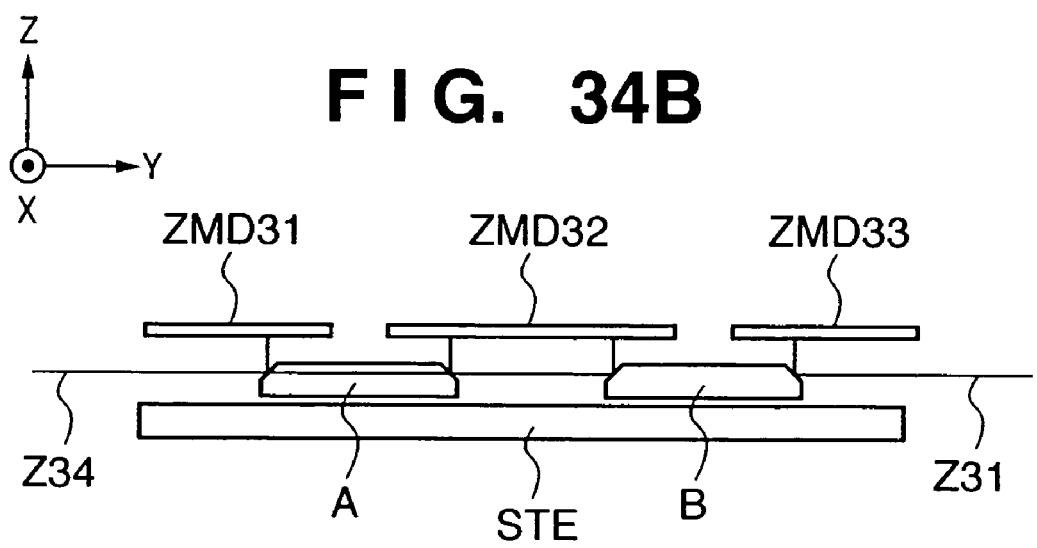

In the above arrangement, as shown in FIGS. 34A and 34B, the stage A is driven in the −X direction, and the stage B is driven in the +X direction. Consequently, the Z position of the stage A is measured by the Z position measurement interferometer beams Z32 and Z33, and that of the stage B is measured by the Z position measurement interferometer beams Z31 and Z34.

In this state, the periphery of the stage A in the +X direction is located in the −X direction with respect to that of the stage B in the −X direction. Subsequently, the stages A and B are moved in the Y direction, and their Y positions can be swapped. Since the stationary mirrors are laid out in two lines, the stages A and B can be swapped while continuously measuring the Z positions of the stages A and B.

Figure 35A:
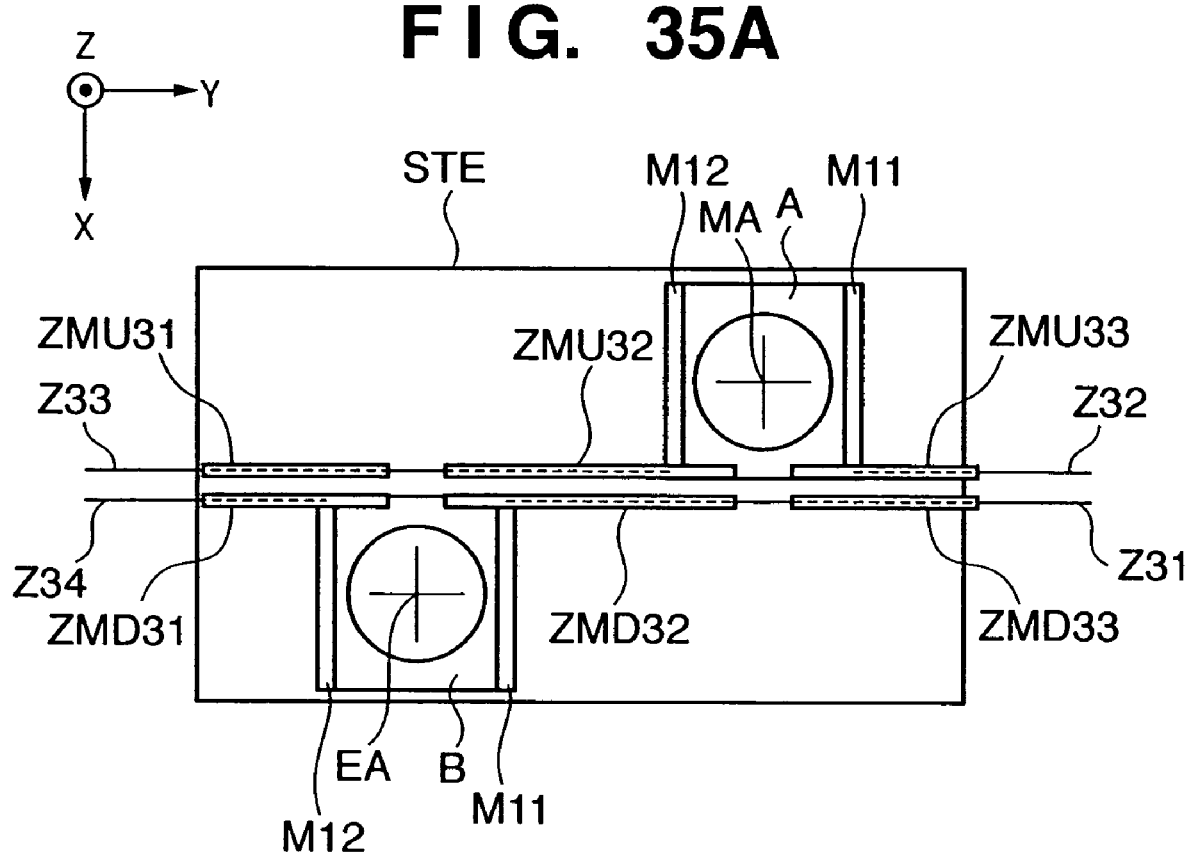
FIGS. 35A and 35B are views for explaining the operation of the measurement system according to the fourth embodiment.
Figure 35B:
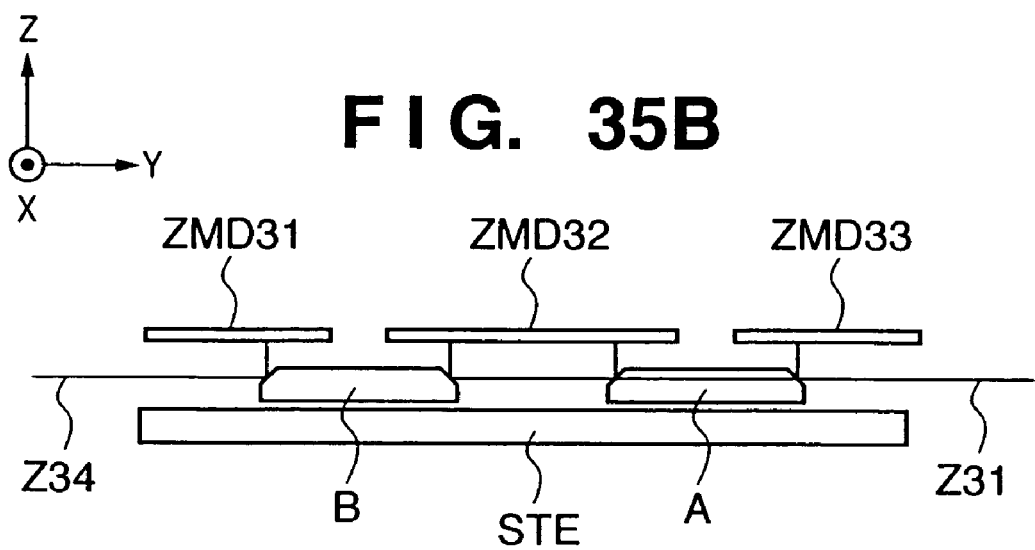

After that, the stage A is driven in the +Y direction, and the stage B is driven in the −Y direction so as to change to the state shown in FIGS. 35A and 35B. The Z stationary mirrors ZMU31 to ZMU33 and ZMD31 to ZMD33 have slits in order to avoid spatial interference with the exposure optical system and measurement optical system around an exposure optical axis EA and measurement optical axis MA. In the state shown in FIGS. 34A and 34B, the stage A is irradiated with the Z position measurement beams Z32 and Z33, and even if the Z position measurement stationary mirrors have slits, the stage A can be moved in the Y direction without interrupting measurement of the Z position. This also applies to the stage B. The stage B is irradiated with the Z position measurement beams Z31 and Z34, and even if the Z position measurement stationary mirrors have slits, the stage B can be moved in the Y direction without interrupting measurement of the Z position.

Figure 36A:
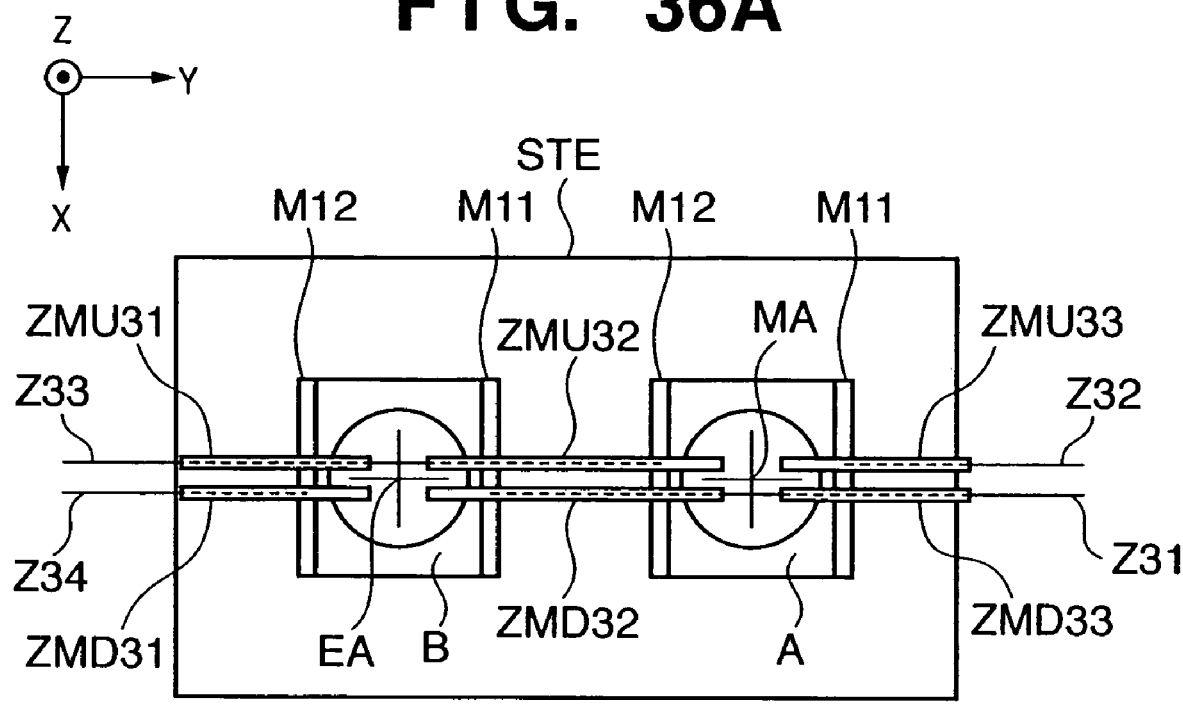
FIGS. 36A and 36B are views for explaining the operation of the measurement system according to the fourth embodiment.
Figure 36B:
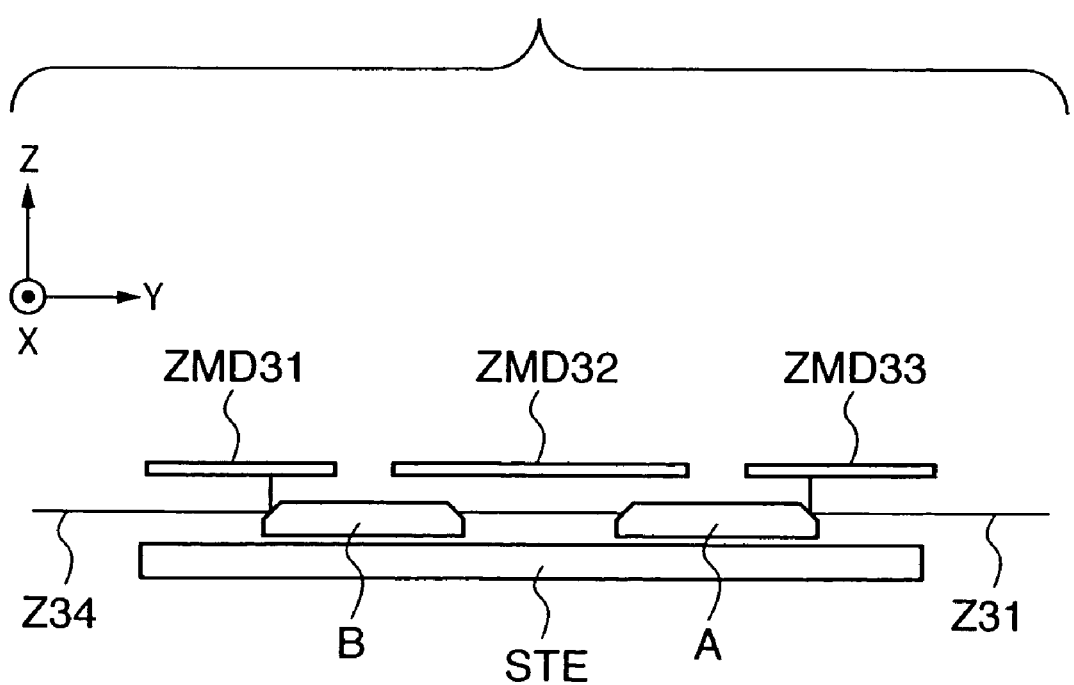
Figure 37A:
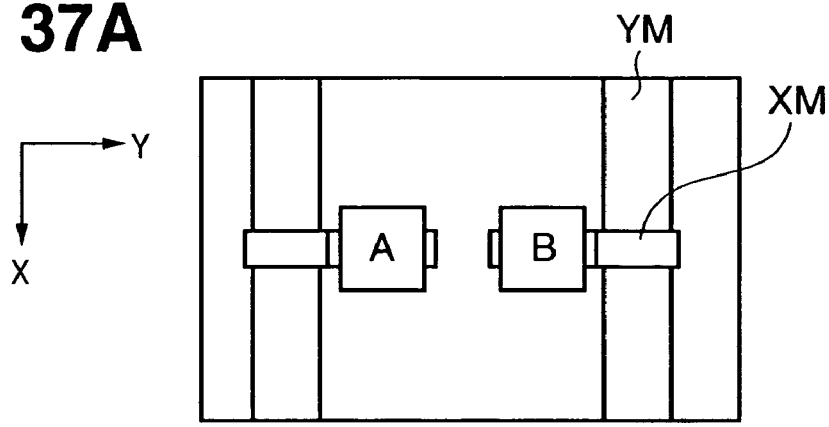
FIGS. 37A to 37D are views showing the arrangement of a measurement system according to the fifth embodiment of the present invention.
Figure 37B:
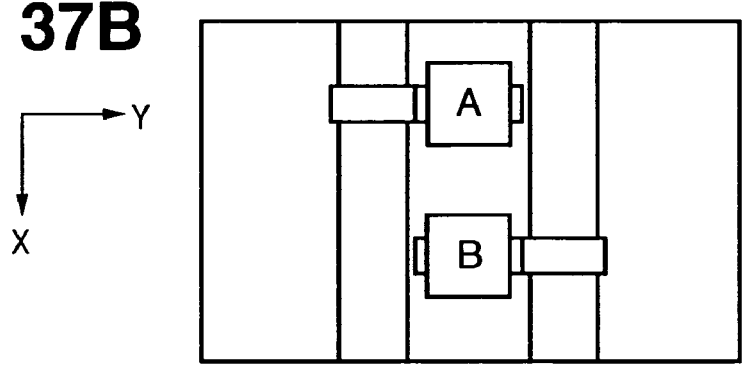
Figure 37C:
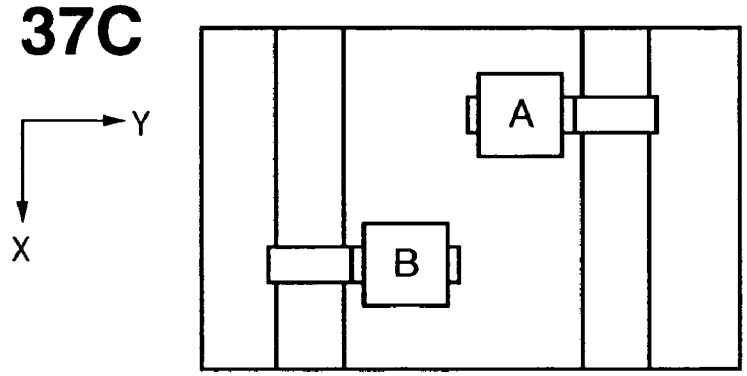
Figure 37D:
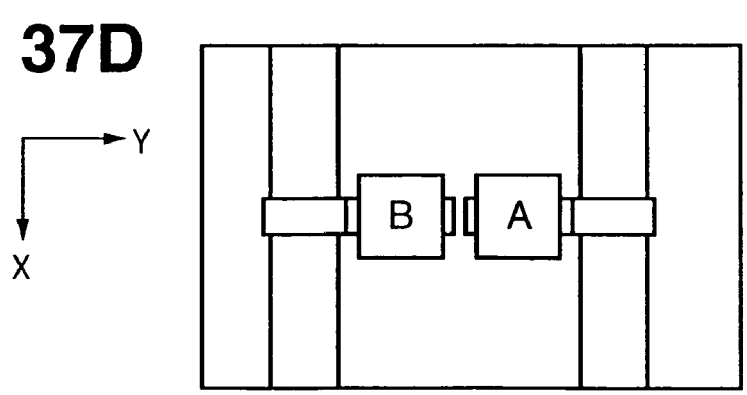

The stages A and B are further driven from the state shown in FIGS. 35A and 35B to that shown in FIGS. 36A and 36B, completing a swap.

Fifth Embodiment

FIGS. 37A to 37D are views showing a stage driving system in the above-described exposure apparatus according to the fifth embodiment. The arrangement for swapping two stages without interrupting measurement by an interferometer has been described. The present invention can be applied not only to a guideless plane motor, but also to an apparatus in which stages A and B are driven by two X-Y moving mechanisms as shown in FIGS. 37A to 37D and swapped between the two X-Y moving mechanisms.

<Switching of Interferometer>

Figure 38:
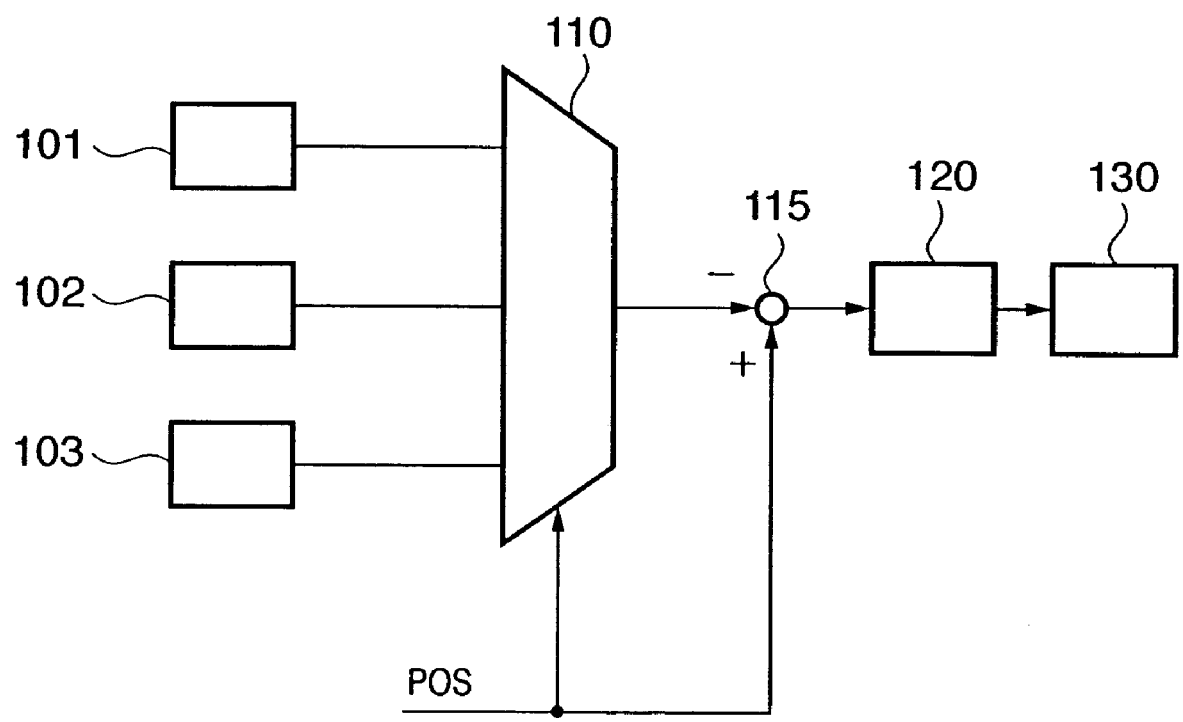
FIG. 38 is a block diagram schematically showing a control system having a function of switching an interferometer.

FIG. 38 is a block diagram schematically showing a control system having a function of switching an interferometer in the first to fifth embodiments. A plurality of interferometers 101 to 103 are so arranged as to measure the position of a stage in a predetermined direction (for example, interferometers which respectively use beam groups UX1 to UX4 to measure the position of a stage). Position measurement results as outputs from the interferometers 101 to 103 are provided to a selector 110. The selector 110 switches the interferometer by, for example, selecting outputs from the interferometers 101 to 103 in accordance with a stage position signal (e.g., target position signal POS). At this time, the selector 110 selects an interferometer output so as not to interrupt an output (position measurement result) from the selector 110 (that is, to successively obtain position measurement results). An output from the selector 110 is input as a stage measurement position to a subtracter 115, and the subtracter 115 subtracts the output from the value of the target position signal POS. A location deviation signal as an output from the subtracter 115 is provided to an actuator (e.g., the above-described stator STE) 130 via a compensator 120. This arrangement is adopted for each axis of each stage, can feedback-control the positions of two stages while continuously measuring their positions, and can swap the positions of the two stages.

<Device Manufacturing Method>

Figure 39:
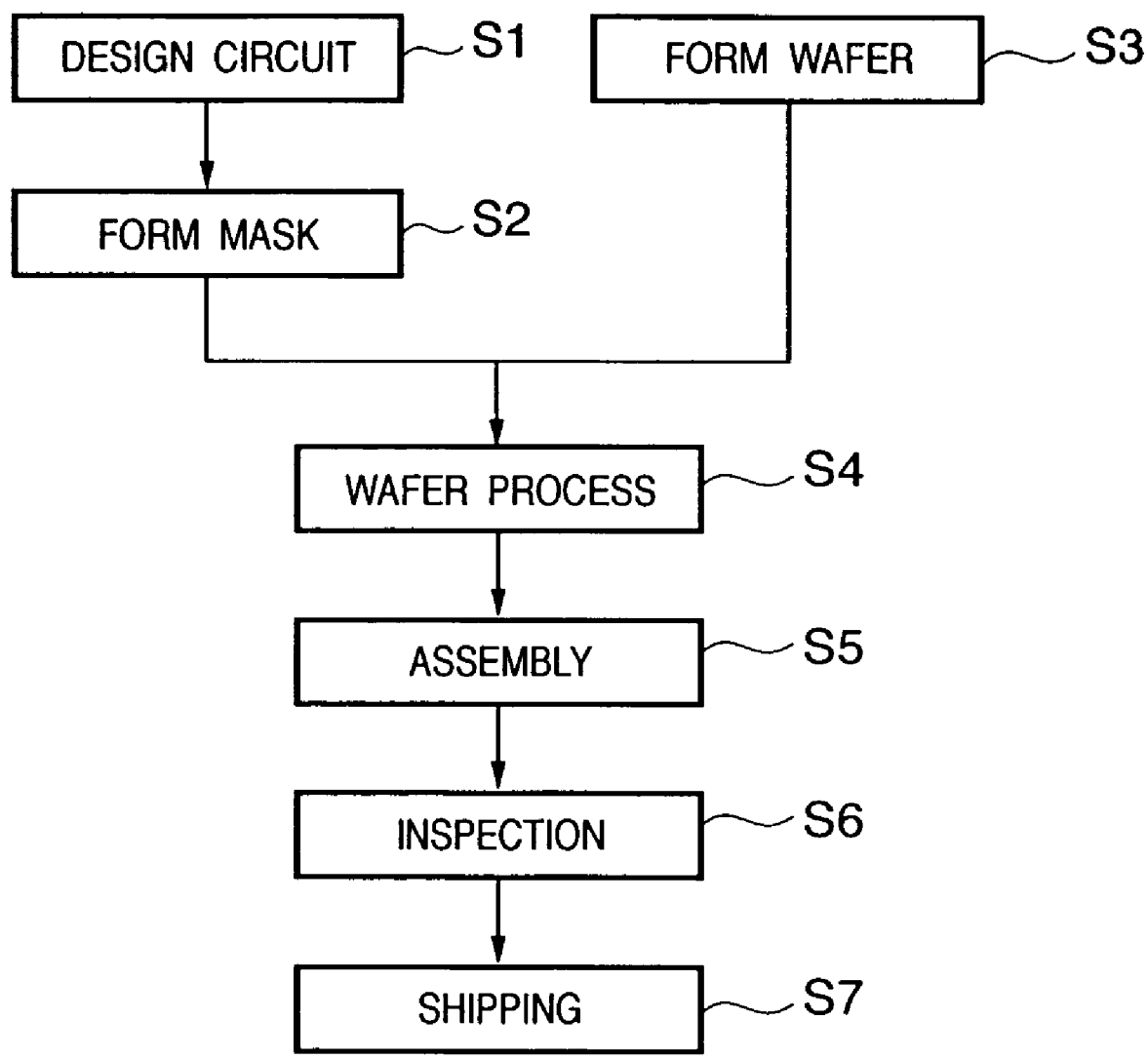
FIG. 39 is a flowchart showing a semiconductor device manufacturing process.

A semiconductor device manufacturing process using the exposure apparatus will be explained. FIG. 39 is a flowchart showing the flow of the whole manufacturing process of a semiconductor device. In step 1 (circuit design), the circuit of a semiconductor device is designed. In step 2 (mask formation), a mask is formed on the basis of the designed circuit pattern.

In step 3 (wafer formation), a wafer is formed using a material such as silicon. In step 4 (wafer process), called a pre-process, the exposure apparatus forms an actual circuit on the wafer by lithography using the mask and wafer. Step 5 (assembly), called a post-process is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections, such as an operation confirmation test and a durability test. After these steps, the semiconductor device is completed and shipped (step 7).

The wafer process in step 4 comprises the steps of an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of transferring or drawing a circuit pattern onto the wafer having undergone the resist processing step by the above-mentioned exposure apparatus, a developing step of developing the wafer exposed in the exposure step, an etching step of etching the resist except for the resist image developed in the developing step, and a resist removal step of removing an unnecessary resist after etching. These steps are repeated to form multiple circuit patterns on the wafer.

While the present invention has been described with respect to what is at present considered to be the preferred embodiments, it is to be understood that the invention is not limited to the disclosed embodiments. The present invention is intended to cover various modifications and equivalent arrangements included within the spirit and scope of the appended claims.

CLAIM OF PRIORITY

This application claims priorites from Japanese Patent Applications No. 2004-1003397filed on Mar. 30, 2004 and No. 2005-019834 filed on Jan. 27, 2005, which are hereby incorporated by reference herein.

What is claimed is:

1. An exposure apparatus comprising:
   an exposure optical system which exposes a substrate to a pattern;
   a substrate processing system which performs a predetermined process for the substrate at a position apart from said exposure optical system;
   a substrate stage which moves along a plane perpendicular to a direction of an optical axis of said exposure optical system, said substrate stage comprising a mirror having a reflecting surface perpendicular to the direction of the optical axis;
   an interferometer system which emits measurement light to measure a position of said substrate stage in the direction of the optical axis; and
   a fixed mirror which guides the measurement light from said interferometer toward said mirror,
   wherein said mirror is arranged along a first direction perpendicular to the direction of the optical axis, and said fixed mirror is arranged along a second direction perpendicular to both the first direction and the direction of the optical axis, and
   said interferometer system is configured to move along the second direction and to continuously measure a position of said substrate stage in the direction of the optical axis in a moving range of said substrate stage while said substrate stage moves from a position below said substrate processing system to a position below said exposure optical system.

2. The apparatus according to claim 1, wherein said interferometer system includes a plurality of interferometers, and the exposure apparatus further comprises a selector which selects an interferometer used for measurement from the plurality of interferometers on the basis of a position of said substrate stage in the direction perpendicular to the optical axis.

3. The apparatus according to claim 1, further comprising a moving unit which moves said interferometer system in the second direction, said moving unit moves said interferometer system in synchronism with movement of said substrate stage in the second direction.

4. The apparatus according to claim 3, wherein said moving unit has an interferometer stage which supports and moves said interferometer system, and a cable connected to said substrate stage is mounted on the moving stage.

5. The apparatus according to claim 1, wherein a plurality of said stages are provided, and at least two of said plurality of substrate stages can be swapped between the position below said exposure optical system and the position below said substrate processing system, and said interferometer system measures positions of two of said plurality of substrate stages in the direction of the optical axis while the two said plurality of substrate stages are swapped between the position below said exposure optical system and the position below said substrate processing system.

6. The apparatus according to claim 1, wherein said substrate processing system includes a measurement optical system which measures a position of the substrate in the direction of the optical axis or a position of the pattern formed on the substrate in a direction perpendicular to the direction of the optical axis.

7. A device manufacturing method comprising steps of:

transferring or drawing a pattern onto a substrate coated with a photosensitive agent by an exposure apparatus defined in claim 1; and developing the substrate.

8. An exposure apparatus comprising:

an exposure optical system which exposes a substrate to a pattern;

a substrate processing system which performs a predetermined process for the substrate at a position apart from said exposure optical system;

a substrate stage which moves along a plane perpendicular to a direction of an optical axis of said exposure optical system, said substrate stage comprising a mirror having a reflecting surface perpendicular to the direction of the optical axis;

an interferometer system which emits measurement light for measuring a position of said substrate stage in the direction of the optical axis; and a fixed mirror which guides the measurement light from said interferometer toward said mirror, wherein said mirror is arranged along a first direction perpendicular to the direction of the optical axis, and said fixed mirror is arranged along a second direction perpendicular to both the first direction and the direction of the optical axis, and said interferometer system is configured to move along the second direction.

* * * * *

UNITED STATES PATENT AND TRADEMARK OFFICE
CERTIFICATE OF CORRECTION

PATENT NO. : 7,307,692 B2
APPLICATION NO. : 11/091590
DATED : December 11, 2007
INVENTOR(S) : Korenaga et al.

It is certified that error appears in the above-identified patent and that said Letters Patent is hereby corrected as shown below:

COLUMN 4:
　　Line 59, "(orinGinal)" should read -- (original) --.

COLUMN 7:
　　Line 48, "interf erometer" should read -- interferometer --.

COLUMN 8:
　　Line 8, "before" should read -- before a --.

COLUMN 13:
　　Line 44, "MZ4" should read -- MZ4, --.

COLUMN 14:
　　Line 42, "as" should read -- as a --.
　　Line 64, "123" should read -- I23 --.
　　Line 65, "124" should read -- I24 --.

COLUMN 15:
　　Line 2, "123 and 124," should read -- I23 and I24, --.
　　Line 29, "123" should read -- I23 --.
　　Line 33, "122" should read -- I22 --.

COLUMN 16:
　　Line 11, "121 and 122" should read -- I22 and I23 --.
　　Line 60, "122" should read -- I22 --.

COLUMN 21:
　　Line 65, "post-process" should read -- post-process, --.

UNITED STATES PATENT AND TRADEMARK OFFICE
CERTIFICATE OF CORRECTION

PATENT NO. : 7,307,692 B2
APPLICATION NO. : 11/091590
DATED : December 11, 2007
INVENTOR(S) : Korenaga et al.

It is certified that error appears in the above-identified patent and that said Letters Patent is hereby corrected as shown below:

COLUMN 22:
Line 32, "2004-1003397" should read -- 2004-100397 --.

Signed and Sealed this

Eighth Day of July, 2008

JON W. DUDAS
*Director of the United States Patent and Trademark Office*